(12) United States Patent
Okubo et al.

(10) Patent No.: US 9,935,269 B2
(45) Date of Patent: Apr. 3, 2018

(54) ELECTROLUMINESCENCE ELEMENT

(71) Applicant: Konica Minolta, Inc., Chiyoda-ku, Tokyo (JP)

(72) Inventors: Yasushi Okubo, Hino (JP); Dai Ikemizu, Hachioji (JP); Hideo Taka, Inagi (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 283 days.

(21) Appl. No.: 14/434,930

(22) PCT Filed: Oct. 9, 2013

(86) PCT No.: PCT/JP2013/077454
§ 371 (c)(1),
(2) Date: Apr. 10, 2015

(87) PCT Pub. No.: WO2014/057968
PCT Pub. Date: Apr. 17, 2014

(65) Prior Publication Data
US 2015/0287927 A1  Oct. 8, 2015

(30) Foreign Application Priority Data
Oct. 10, 2012 (JP) .................. 2012-225382

(51) Int. Cl.
*H01L 51/50* (2006.01)
*H01L 51/00* (2006.01)
*B82Y 20/00* (2011.01)
*C09K 11/06* (2006.01)
*H05B 33/14* (2006.01)
*H01L 51/52* (2006.01)

(52) U.S. Cl.
CPC .......... *H01L 51/0036* (2013.01); *B82Y 20/00* (2013.01); *C09K 11/06* (2013.01);
(Continued)

(58) Field of Classification Search
CPC ............... H01L 51/502; H01L 51/0072; H01L 51/0085
See application file for complete search history.

(56) References Cited

U.S. PATENT DOCUMENTS

2007/0077594 A1* 4/2007 Hikmet .................. B82Y 10/00
435/7.1
2010/0108984 A1* 5/2010 Cho ...................... C09K 11/025
257/13

FOREIGN PATENT DOCUMENTS

JP  2002313565 A  10/2002
JP  2005521783 A   7/2005
(Continued)

OTHER PUBLICATIONS

Hong-Wei Liu et al., "Enhanced Phosphorescence and Electroluminescence in Triplet Emitters by Doping Gold into Cadmium Selenide/Zinc Sulfide Nanoparticles," Thin Solid Films; Oct. 2005, pp. 296-302, vol. 489, Issues 1-2, pp. 296-302.
(Continued)

*Primary Examiner* — Rip A Lee
(74) *Attorney, Agent, or Firm* — Cantor Colburn LLP

(57) ABSTRACT

Disclosed is an electroluminescence element, wherein at least a first electrode, a light-emitting layer, and a second electrode may be laminated on a substrate in said order. In said element, the light-emitting layer may contain quantum dots, and an intermediate layer formed from a polymer containing nitrogen atoms may be formed between the first electrode and the light-emitting layer.

17 Claims, 2 Drawing Sheets

(52) U.S. Cl.
CPC ........ *H01L 51/004* (2013.01); *H01L 51/0039* (2013.01); *H01L 51/0043* (2013.01); *H01L 51/0073* (2013.01); *H01L 51/0085* (2013.01); *H01L 51/502* (2013.01); *H05B 33/14* (2013.01); *H01L 51/5016* (2013.01); *H01L 51/5044* (2013.01); *H01L 51/5056* (2013.01); *H01L 51/5088* (2013.01); *H01L 51/5096* (2013.01); *H01L 51/5206* (2013.01); *H01L 51/5221* (2013.01); *H01L 51/5278* (2013.01); *H01L 2251/301* (2013.01); *H01L 2251/308* (2013.01)

(56) References Cited

FOREIGN PATENT DOCUMENTS

| JP | 2010114079 | A |   | 5/2010 | |
|----|---|---|---|---|---|
| JP | 2012-169460 | A | * | 9/2012 | ............. H01L 51/50 |
| JP | 2012169460 | A |   | 9/2012 | |
| WO | 03086026 | A2 |   | 10/2003 | |
| WO | 2007095173 | A3 |   | 8/2007 | |
| WO | 2009123763 | A2 |   | 10/2009 | |
| WO | WO 2013/157494 | A1 | * | 10/2013 | ............. H01L 51/50 |

OTHER PUBLICATIONS

Written Opinion of the International Searching Authority corresponding to Application No. PCT/JP2013/077454; dated Dec. 17, 2013, with English translation.

Y. Q. Zhang et al., "Electroluminescence of Green CdSe/ZnS Quantum Dots Enhanced by Harvesting Excitons from Phosphorescent Molecules," Applied Physics Letters; Dec. 2010, vol. 97, Issue 25, pp. 253115-1-253115-3.

International Search Report corresponding to Application No. PCT/JP2013/077454; dated Dec. 17, 2013, with English translation.

JP Notification of Reasons for Rejection corresponding to Application No. JP2014-540863; dated of Jun. 6, 2017.

* cited by examiner

ELECTROLUMINESCENCE ELEMENT

This is the U.S. national stage of application No. PCT/JP2013/077454, filed on Oct. 9, 2013. Priority under 35 U.S.C. § 119(a) and 35 U.S.C. § 365(b) is claimed from Japanese Application No. 2012-225382, filed Oct. 10, 2012, the disclosure of which is also incorporated herein by reference.

TECHNICAL FIELD

The present invention relates to an electroluminescence element (EL element), and in more detail, an electroluminescence element having excellent light emission efficiency and emission lifetime.

BACKGROUND ART

In recent years, an organic electroluminescence element using an organic substance (hereinafter, appropriately abbreviated as "organic EL element" or "OLED; Organic Light-Emitting Diode".) is promised as a use as a solid light emitting large-area full color display element that is light-weight, thin, high-efficient and inexpensive and a light source array, and the research and development is actively advanced.

Particularly in a mobile body (cell phone, automobile, aircraft), a lighting that is thinner and lighter than conventional ones and hard to crack (lighting composed of a flexible substrate) is expected. Also, while these new values are expected, performance to an existing fluorescent light and white LED is currently low, and technology for further higher efficiency and prolonged lifetime are required.

An organic EL element is a thin-film all solid element constituting an organic function layer (single layer part or multilayer part) containing an organic light emitting material having a thickness of about 0.1 µm, between a pair of anode and cathode formed on the film. When a relatively low voltage of about 2 to 20 V is applied to such organic EL element, electrons are injected into an organic compound layer from a cathode, and holes are injected from an anode. It is known that these electrons and holes are recombined in a light emitting layer, and when an energy level returns to a valence band from a conduction band, energy is released as a light, thereby obtaining light emission, and it is a technology expected as a next-generation flat display or lighting.

Furthermore, in the organic EL element utilizing phosphorescence emission recently found, about four times light emission efficiency, as compared to former one utilizing fluorescence emission, can be realized in principle. Thus, including the development of the materials, research and development of the layer constitution of the organic function layer and the electrodes are advanced throughout the world. Particularly, as one of the measures to prevent global warming, an application to a lighting apparatus which predominates in human energy consumption has been started to study, and toward a practical use of a white light emitting panel that can replace conventional lighting apparatus, performance improvement and an attempt to reduce costs are actively carried out.

However, a phosphorescent organic EL element (OLED; Organic Light-Emitting Diode) is sensitive to oxygen and moisture, thus when being used as the flexible lighting as described above, an expensive barrier film having high barrier properties and treatment of step with low productivity (vacuum deposition, application process in an inert atmosphere, and the like) are required, thus it cannot be necessarily said as inexpensive and highly producible.

On the other hand, as an all solid electric field electroluminescence element in which high efficiency as same as the phosphorescence organic EL element (OLED) is recently expected, a quantum dot LED (QLED) is suggested (Patent Document 1). In QLED, the excited singlet level (S1) and the excited triplet level (T1) are close each other and thus an intersystem crossing between S1 and T1 is thermally possible. Therefore, while it is substantially fluorescence (emission from S1), a quantum yield at lower than 100% can be expected.

Here, it is an emission from fluorescence, thus is hard to be deactivated by an oxygen molecule that is a molecule of a base triplet, and as disclosed in Patent Document 2, it tends to be strong also against moisture, thus it is supposed that the emission can be produced in a highly producible environment such as under the atmosphere. Furthermore, the QLED has a reverse layer constitution as in Patent Document 3, whereby an alkali metal halide such as lithium fluoride that is likely to be deteriorated by oxygen or moisture is not contained in the layer, thus it is expected that more stable element is obtained.

In addition, in the reverse layer constitution, a hole block layer and an electron transport layer such as a metal oxide having a level close to HOMO/LUMO of quantum dot having a very deep level and an electron transport layer can be used, thus a high efficiency can be expected.

However, in Patent Document 3, a zinc oxide layer is formed by calcining at about 300° C. for 5 minutes on the first electrode (transparent electrode, ITO) on the substrate. In such application process, an electroluminescence element on the plastic substrate cannot be produced by the simple application under atmospheric pressure as described above, and it has been a barrier to obtain an ideal electroluminescence element. In addition, a metal oxide thin film generally has high surface roughness, and a dark spot caused by a leak is likely to occur, and has a problem also in the lifetime.

In addition, in Patent Documents 1 to 3 described above, a light emitting layer composed of a single quantum dot layer is used. However, when quantum dots aggregate, the light emission efficiency is degraded, thus it is effective to properly disperse the quantum dots in the host for the improvement in light emission efficiency. Yet, an electric field electroluminescence element using quantum dots, particularly, a host compound appropriate as a blue electroluminescence element has not been found so far, and still has a problem with regard to the lifetime.

PRIOR ART DOCUMENTS

Patent Documents

Patent Document 1: WO 2007/095173
Patent Document 2: WO 2011/060181
Patent Document 3: WO 2009/123763

SUMMARY OF THE INVENTION

Problems to be Solved by the Invention

The present invention has been made in view of the above problems and circumstances, and an object of the present invention is to provide an electroluminescence element having a high light emission efficiency and long lifetime, and further, to provide an electroluminescence element having excellent productivity (calcination temperature, calcination time, and the like.) on a plastic film.

Means for Solving the Problem

In order to solve the above problems, the present inventors have searched whether there is an electron transport layer that can form a film at a temperature at which a plastic can withstand.

Here, the work function of a transparent electrode such as ITO is generally about −4.8 eV, and LUMO level of quantum dot is generally about −4.0 to −3.0 eV, thus an electron transport layer that is a compound having a LUMO level between them and can form a film at lower than about 150° C. is necessary.

However, there is almost no organic matter having such a deep level, and if any, it cannot be used due to low coatability and film-forming properties.

On the other hand, it is known that, when the surface of metal, metal oxide or the like is covered with a very thin organic matter layer (self-organized monomolecular film, and the like), the electric potential of the surface of metal and metal oxide varies by electronic characteristics of the organic matter layer.

The present inventors have found that such effects can be suitably exhibited by using a specific compound, and the electric bonding between the first electrode and the LUMO level of the quantum dot is improved, thus high efficiency and high durability can be obtained.

More specifically, the problems of the present invention is solved by the following means.

1. An electroluminescence element, including at least a first electrode, a light emitting layer and a second electrode which are laminated on a substrate in said order, wherein the light emitting layer contains quantum dots, and an intermediate layer which includes a nitrogen atom-containing polymer is formed either between the first electrode and the light emitting layer or between the light emitting layer and the second electrode.

2. Preferably, the nitrogen atom-containing polymer contains an amino group.

3. Preferably, the nitrogen atom-containing polymer is a conjugated polymer compound which has a structural unit containing an aromatic ring as a main chain, and two or more amino groups are bound to the aromatic ring of the main chain.

4. Preferably, the polymer containing an amino group has a structural unit represented by a general formula (A) (including a salt form) as a main chain.

[Chemical Formula 1]

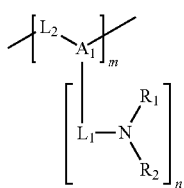

general formula(A)

wherein n represents 1 or 2, m represents 2 to 1000,

A1 represents a nitrogen atom, a carbon atom or a silicon atom,

L1 and L2 represent a bivalent linking group selected from alkylene groups having 1 to 20 carbon atoms, cycloalkylene groups having 3 to 20 carbon atoms, arylene groups having 6 to 30 carbon atoms, heteroarylene groups having 1 to 30 carbon atoms, alkyleneoxy groups having 1 to 20 carbon atoms, and combinations thereof, and R1 and R2 each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

5. More preferably, the compound having a structural unit represented by the general formula (A) as a main chain is a neutral compound.

6. More preferably, the general formula (A) is represented by a general formula (B).

[Chemical Formula 2]

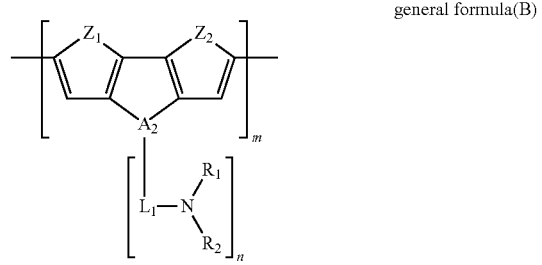

general formula(B)

wherein n represents 1 or 2, m represents 2 to 1000,

A2 represents a nitrogen atom, a carbon atom or a silicon atom,

Z1 and Z2 each independently represent —C(R3)=C(R4)-, —C(R5)=N—, —O—, or —S—,

L1 represents a bivalent linking group selected from alkylene groups having 1 to 20 carbon atoms, cycloalkylene groups having 3 to 20 carbon atoms, arylene groups having 6 to 30 carbon atoms, heteroarylene groups having 1 to 30 carbon atoms, alkyleneoxy groups having 1 to 20 carbon atoms, and combinations thereof, and R1 to R5 each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

7. Further preferably, in the general formula (B), Z1 and Z2 each independently represent —CH=CH—.

8. Further preferably, in the general formula (B), A2 represents a carbon atom.

9. Further preferably, in the general formula (A) or the general formula (B), R1 and R2 both represent an alkyl group.

10. Preferably, the intermediate layer has a layer thickness in a range of 2 to 10 nm.

11. Preferably, the intermediate layer is formed between the first electrode and the light emitting layer.

12. Preferably, the light emitting layer contains at least one type of host material and at least one type of quantum dot, and a light emitting maximum wavelength assigned to 0-0 transition band in a phosphorescence spectrum of the host material is in a wavelength region of 414 to 459 nm.

13. More preferably, the quantum dot has an average particle size in a range of 1 to 20 nm.

14. More preferably, the quantum dot includes Si, Ge, GaN, GaP, CdS, CdSe, CdTe, InP, InN, ZnS, $In_2S_3$, ZnO, CdO, CuInS, CuInSe, CuInGaSe or mixtures thereof.

15. More preferably, the host compound has a molecular weight of 500 to 1000.

16. More preferably, the host compound is represented by a general formula (1).

[Chemical Formula 3]

general formula(1)

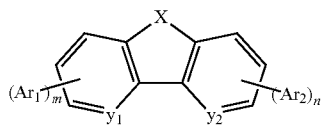

wherein X represents NR', O, S, CR'R'', or SiR'R'', y1 and y2 represent CR' or N, R' and R'' each represent a hydrogen atom or a substituent, Ar1 and Ar2 represent an aromatic ring, and may be same or different from each other, and m and n represent an integer of 0 to 4.

17. Further preferably, in the general formula (1), X is O or NR'.

18. Further preferably, in the general formula (1), at least one of Ar1 and Ar2 is represented by a general formula (2).

[Chemical Formula 4]

general formula(2)

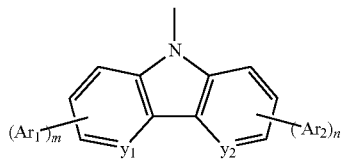

wherein $y_1$ and $y_2$ each represent CR' or a nitrogen atom,

R's each represent a hydrogen atom or a substituent, $Ar_1$ and $Ar_2$ each represent an aromatic ring, and may be same or different from each other, and m and n represent an integer of 0 to 4.

19. Preferably, the light emitting layer contains a phosphorescent light emitting dopant compound in which the light emitting maximum wavelength assigned to the 0-0 transition band in a phosphorescence spectrum is in the wavelength region of 460 to 827 nm.

20. Preferably, the light emitting layer contains a phosphorescent light emitting dopant represented by a general formula (3).

[Chemical Formula 5]

general formula(3)

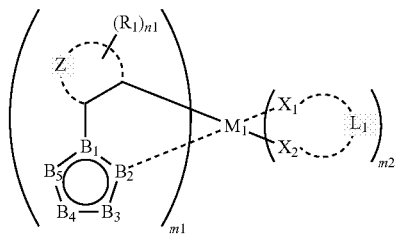

wherein R1 represents a substituent,

Z represents a non-metal atomic group necessary to form a 5 to 7-membered ring, n1 represents an integer of 0 to 5, B1 to B5 represent a carbon atom, a nitrogen atom, an oxygen atom or a sulfur atom, and at least one represents a nitrogen atom, M1 represents a group 8 to 10 metal in the element periodic table, X1 and X2 represent a carbon atom, a nitrogen atom or an oxygen atom, L1 represents an atomic group forming a bidentate ligand together with X1 and X2, and m1 represents an integer of 1, 2 or 3, m2 represents an integer of 0, 1 or 2, and m1+m2 represents 2 or 3.

Effects of the Invention

According to the present invention, an electroluminescence element having a high light emission efficiency and long lifetime, and further, an electroluminescence element having excellent productivity (calcination temperature, calcination time, and the like) on a plastic film can be provided.

EMBODIMENTS FOR CARRYING OUT THE INVENTION

Hereinafter, the present invention, schematic constitution thereof, and forms and embodiments for carrying out the present invention will be described in detail. Here, "to" shown in the present invention is used in the sense that the numerical values described before and after are included as a lower limit and an upper limit.

<<Constitution of EL Element>>

Figure 1:
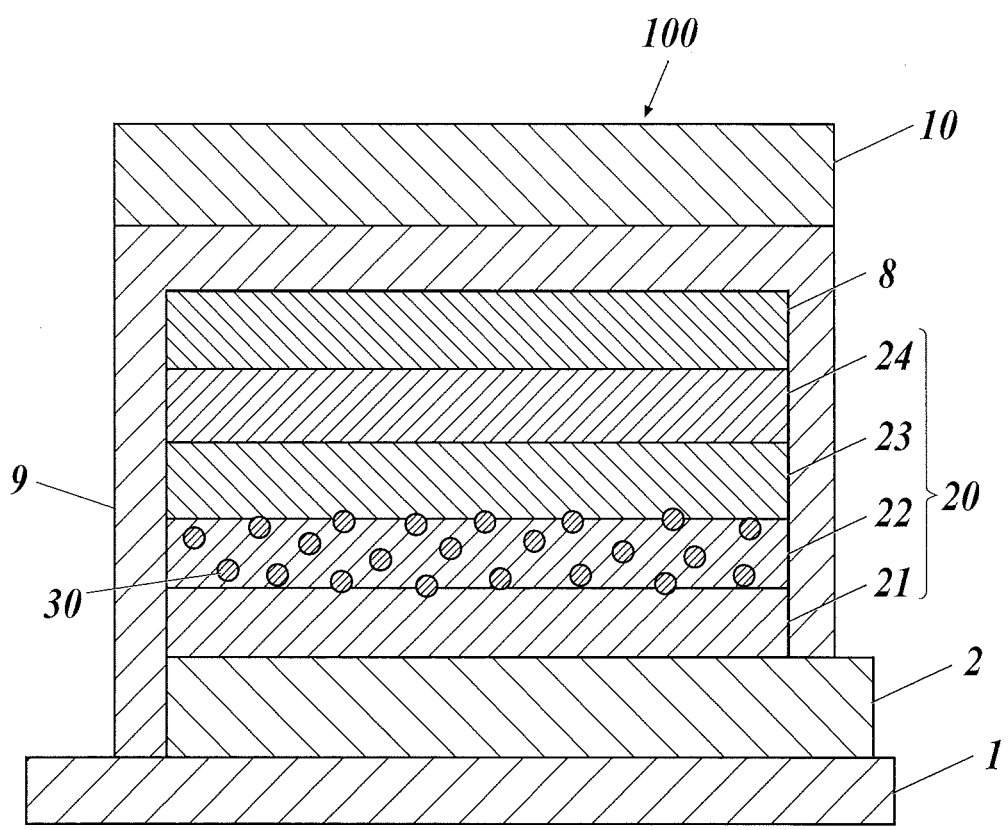
FIG. 1 is a cross-sectional view showing a schematic constitution of an EL element.

As shown in FIG. 1, EL element 100 of the preferred embodiment of the present invention has a supporting substrate 1. A first electrode 2 (cathode) is formed on the supporting substrate 1, an organic function layer 20 is formed on the first electrode 2, and a second electrode 8 (anode) is formed on the organic function layer 20.

The organic function layer 20 refers to each layer constituting the EL element 100 provided between the first electrode 2 and the second electrode 8.

In the organic function layer 20, for example, a hole blocking layer 21 (intermediate layer), a light emitting layer 22, a hole transport layer 23 and a hole injection layer 24 are included, and other organic layer such as an electron injection layer or the like may be also included.

The first electrode 2, the organic function layer 20 and the second electrode 8 on the supporting substrate 1 are sealed by a flexible sealing member 10 via a sealing adhesive 9.

Here, the reverse layer structure (refer to FIG. 1) of the EL element 100 simply shows a preferred specific example, and the present invention is not limited to the constitution exemplified in FIG. 1.

Examples of the representative constitution of the EL element 100 include the layer structures exemplified in the following (i) to (xviii).

(i) supporting substrate/first electrode/hole blocking layer/light emitting layer/second electrode/sealing adhesive/sealing member (ii) supporting substrate/first electrode/hole blocking layer/light emitting layer/hole transport layer/second electrode/sealing adhesive/sealing member (iii) supporting substrate/first electrode/hole blocking layer/light emitting layer/hole injection layer/second electrode/sealing adhesive/sealing member (iv) supporting substrate/first electrode/hole blocking layer/light emitting layer/hole transport layer/hole injection layer/second electrode/sealing adhesive/sealing member (v) supporting substrate/first electrode/electron injection layer/hole blocking layer/light emitting layer/second electrode/sealing adhesive/sealing member (vi) supporting substrate/first electrode/electron injection layer/hole blocking layer/light emitting layer/hole transport layer/second electrode/sealing adhesive/sealing member (vii) supporting substrate/first electrode/electron injection layer/hole blocking layer/light emitting layer/hole injection layer/second electrode/sealing adhesive/sealing member (viii) supporting substrate/first electrode/electron injection layer/hole blocking layer/light emitting layer/hole transport layer/hole injection layer/second electrode/sealing adhesive/sealing member (ix) supporting substrate/first electrode/electron transport layer/first light emitting layer/charge generating layer/second light emitting layer/hole transport layer/second electrode/sealing adhesive/sealing member (x) supporting substrate/first electrode/electron injection layer/electron transport layer/first light emitting layer/second light emitting layer/hole transport layer/second electrode/sealing adhesive/sealing member (xi) supporting substrate/first electrode/electron injection layer/electron transport layer/first light emitting layer/intermediate layer/second light emitting layer/hole transport layer/second electrode/sealing adhesive/sealing member (xii) supporting substrate/first electrode/electron injection layer/electron transport layer/first light emitting layer/charge generating layer/second light emitting layer/hole transport layer/second electrode/sealing adhesive/sealing member (xiii) supporting substrate/first electrode/electron transport layer/first light emitting layer/second light emitting layer/hole transport layer/hole injection layer/second electrode/sealing adhesive/sealing member (xiv) supporting substrate/first electrode/electron transport layer/first light emitting layer/intermediate layer/second light emitting layer/hole transport layer/hole injection layer/second electrode/sealing adhesive/sealing member (xv) supporting substrate/first electrode/electron transport layer/first light emitting layer/charge generating layer/second light emitting layer/hole transport layer/hole injection layer/second electrode/sealing adhesive/sealing member (xvi) supporting substrate/first electrode/electron injection layer/electron transport layer/first light emitting layer/second light emitting layer/hole transport layer/hole injection layer/second electrode/sealing adhesive/sealing member (xvii) supporting substrate/first electrode/electron injection layer/electron transport layer/first light emitting layer/intermediate layer/second light emitting layer/hole transport layer/hole injection layer/second electrode/sealing adhesive/sealing member (xviii) supporting substrate/first electrode/electron injection layer/electron transport layer/first light emitting layer/charge generating layer/second light emitting layer/hole transport layer/hole injection layer/second electrode/sealing adhesive/sealing member Also, in the EL element 100, a forward layer structure, in which a first electrode 2 is used as an anode, a second electrode 8 is used as a cathode, and an organic function layer 20 is constituted by a hole injection layer 24, a hole transport layer 23, a light emitting layer 22, and a hole blocking layer 21 (intermediate layer) from the first electrode 2 to the second electrode 8, can be also taken.

Certainly, also in the layer structure exemplified in the above (i) to (viii), a forward layer structure, in which the first electrode is used as an anode, the second electrode is used as a cathode, and the layer constitution of the first electrode and the second electrode and the organic function layer is converted, can be also taken.

<<Organic Function Layer of EL Element>>

Subsequently, the detail of the organic function layer constituting the EL element will be described.

[1] Injection Layer: Hole Injection Layer, Electron Injection Layer

In the EL element, an injection layer can be provided as necessary.

There are an electron injection layer and a hole injection layer as the injection layer, and the injection layer may be made present between a first electrode and a light emitting layer or a hole blocking layer, and between a second electrode and a light emitting layer or an electron transport layer, as described above.

The injection layer referred in the present invention is a layer provided between the electrode and the organic function layer for lowering driving voltage and improving light emitting luminance, and is described in detail in "Organic EL Element and Industrial Forefront Thereof (published by NTS INC., Nov. 30, 1998)", second edition, chapter 2, "Electrode Material" (pages 123 to 166), and there are a hole injection layer and an electron injection layer.

The details of the hole injection layer is also described, for example, in Japanese Patent Application Laid Open Publication No. H9-45479, Japanese Patent Application Laid Open Publication No. H9-260062, Japanese Patent Application Laid Open Publication No. H8-288069, and the like. A hole injection material applicable to the hole injection layer includes triazole derivatives, oxadiazole derivatives, imidazole derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, polyarylalkane derivatives and conductive polymers, and is preferably a polythiophene derivative, a polyaniline derivative or a polypyrrole derivative, and further preferably a polythiophene derivative. In addition, as described in Chem. Rev. 107, 1233 (2007), Phys. Rev. B 79, 245308 (2009), WO 2011/131185, WO 2011/134458, and the like, the hole injection layer may be constituted by a composition in which conductivity is enhanced by combining a p-type dopant and the derivative preferred as the hole injection material or the hole transport material set forth below.

The detail of the electron injection layer is also described, for example, in Japanese Patent Application Laid Open Publication No. H6-325871, Japanese Patent Application Laid Open Publication No. H9-17574, Japanese Patent Application Laid Open Publication No. H10-74586, and the like, and specifically, the electron injection layer includes metal buffer layers represented by strontium, aluminum and the like, alkali metal compound buffer layers represented by lithium fluoride, alkali earth metal compound buffer layers represented by magnesium fluoride, oxide buffer layers represented by aluminum oxide, and the like. In addition, a composition in which conductivity is enhanced by doping the electron transport material set forth below or the like with the alkali metal compound, the alkali metal, the n-type dopant as described in WO 2005/86251, WO 2007/107306, and the like or the like can be also preferably used (for example, an electron injection layer obtained by combining an alkali metal and an electron transport layer can be formed with reference to Appl. Phys. Lett. 94, 083303 (2009), and the like).

However, as described above, these materials are often unstable with oxygen and water, and become a cause of efficiency lowering of the element, thus it is preferable not to use these materials, particularly the alkali metal and the alkali metal compound. However, when it is necessary to use, the buffer layer (injection layer) is desirably a very thin film, and potassium fluoride and sodium fluoride are preferable. The film thickness is about 0.1 nm to 5 μm, preferably 0.1 to 100 nm, further preferably 0.5 to 10 nm, and most preferably 0.5 to 4 nm.

[2] Hole Transport Layer

The hole transport layer in the present invention comprises a material having a function of transporting a hole, and should have a function of transmitting a hole injected from the anode to the light emitting layer.

The total film thickness of the hole transport layer of the present invention is not particularly limited, and is usually in the range of about 5 nm to 5 μm, more preferably 2 nm to 500 nm, and further preferably 5 nm to 200 nm.

As the material used in the hole transport layer (hereinafter referred to as the hole transport material), a material should have either hole injection properties or hole transport properties or electron barrier properties, and any material selected from conventionally known compounds can be used.

Examples include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene derivatives such as anthracene and naphthalene, fluorene derivatives, fluorenone derivatives, and polyvinyl carbazole, polymeric materials or oligomers in which an aromatic amine is introduced to the main chain or side chain, polysilanes, conductive polymers or oligomers (for example, PEDOT:PSS, aniline copolymers, polyaniline, polythiophene), and the like.

The triarylamine derivatives include benzidine type derivatives represented by αNPD, star burst type derivatives represented by MTDATA, compounds having fluorene or anthracene at the connecting core part of triarylamine such as Spiro-TPD, and the like.

Also, the hexaazatriphenylene derivatives as described in Japanese Unexamined Patent Application Publication No. 2003-519432, Japanese Patent Application Laid Open Publication No. 2006-135145, and the like can be used as the hole transport material as well.

Further, the hole transport layer having high p properties by doping impurities can be also used. Examples thereof include those described in Japanese Patent Application Laid Open Publication No. H4-297076, Japanese Patent Application Laid Open Publication No. 2000-196140, Japanese Patent Application Laid Open Publication No. 2001-102175, J. Appl. Phys., 95, 5773 (2004), and the like.

In addition, for example, inorganic compounds such as so-called p-type hole transport materials, p-type-Si and p-type-SiC, as described in Japanese Patent Application Laid Open Publication No. H11-251067 or a literature by J. Huang et. al. (Applied Physics Letters 80 (2002), p. 139), can be also used. Furthermore, ortho-metallized organic metal complexes having Ir or Pt as a central metal represented by Ir(ppy) 3 are also preferably used.

The above-described materials can be used as the hole transport material, and triarylamine derivatives, carbazole derivatives, indolocarbazole derivatives, azatriphenylene derivatives, organic metal complexes, polymeric materials or oligomers in which an aromatic amine is introduced to the main chain or side chain and the like are preferably used.

Specific examples of known preferable hole transport materials used in the organic EL element of the present invention include the compounds described in the following literatures and the like, in addition to the literatures cited above, but the present invention is not limited thereto.

Examples include Appl. Phys. Lett. 69, 2160 (1996), J. Lumin. 72-74, 985 (1997), Appl. Phys. Lett. 78, 673 (2001), Appl. Phys. Lett. 90, 183503 (2007), Appl. Phys. Lett. 90, 183503 (2007), Appl. Phys. Lett. 51, 913 (1987), Synth. Met. 87, 171 (1997), Synth. Met. 91, 209 (1997), Synth. Met. 111,421 (2000), SID Symposium Digest, 37, 923 (2006), J. Mater. Chern. 3, 319 (1993), Adv. Mater. 6, 677 (1994), Chern. Mater. 15, 3148 (2003), U.S. Patent Application Publication No. 2003/0,162,053, U.S. Patent Application Publication No. 2002/0,158,242, U.S. Patent Application Publication No. 2006/0,240,279, U.S. Patent Application Publication No. 2008/0,220,265, U.S. Pat. No. 5,061,569, International Publication No. 2007/002,683, International Publication No. 2009/018,009, EP 650 955, U.S. Patent Application Publication No. 2008/0,124,572, U.S. Patent Application Publication No. 2007/0,278,938, U.S. Patent Application Publication No. 2008/0,106,190, U.S. Patent Application Publication No. 2008/0,018,221, International Publication No. 2012/115034, Japanese Unexamined Patent Application Publication No. 2003-519432, Japanese Patent Application Laid Open Publication No. 2006-135145, U.S. patent application Ser. No. 13/585,981, and the like.

The hole transport materials may be used alone, or plural kinds may be used together.

[3] Hole Blocking Layer

The hole blocking layer constituting the organic function layer of the EL element comprises a material having a function of transporting an electron, and the electron injection layer and the electron transport layer are also included in the hole blocking layer in a broad sense. The hole blocking layer can be provided in a single layer or in a plurality of layers.

(3.1) Hole Blocking Material

A polymer containing an amino group is used as the hole blocking material.

The polymer containing an amino group has a structural unit represented by a general formula (A) (including a salt form) as a main chain.

[Chemical Formula 6]

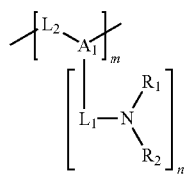

general formula(A)

wherein n represents 1 or 2, m represents 2 to 1000,

A1 represents a nitrogen atom, a carbon atom or a silicon atom,

L1 and L2 represent a bivalent linking group selected from alkylene groups having 1 to 20 carbon atoms, cycloalkylene groups having 3 to 20 carbon atoms, arylene groups having 6 to 30 carbon atoms, heteroarylene groups having 1 to 30 carbon atoms, alkyleneoxy groups having 1 to 20 carbon atoms, and combinations thereof, and R1 and R2 each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

The compound having a structural unit represented by the general formula (A) as a main chain is a neutral compound.

The compound represented by the general formula (A) is preferably represented by a general formula (B).

[Chemical Formula 7]

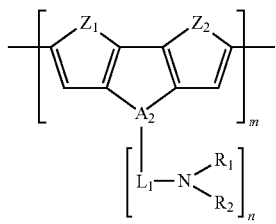

general formula(B)

wherein n represents 1 or 2, m represents 2 to 1000,

A2 represents a nitrogen atom, a carbon atom or a silicon atom,

Z1 and Z2 each independently represent —C(R3)=C(R4)-, —C(R5)=N, —O—, or —S—,

L1 represents a bivalent linking group selected from alkylene groups having 1 to 20 carbon atoms, cycloalkylene groups having 3 to 20 carbon atoms, arylene groups having 6 to 30 carbon atoms, heteroarylene groups having 1 to 30 carbon atoms, alkyleneoxy groups having 1 to 20 carbon atoms, and combinations thereof, and R1 to R5 each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

In the general formula (B), Z1 and Z2 preferably each independently represent —CH=CH—.

In the general formula (B), A2 preferably represents a carbon atom.

In the general formula (A) or the general formula (B), R1 and R2 both preferably represent an alkyl group.

Specific compounds represented by the general formula (A) or the general formula (B) will be exemplified below.

[Chemical Formula 8]

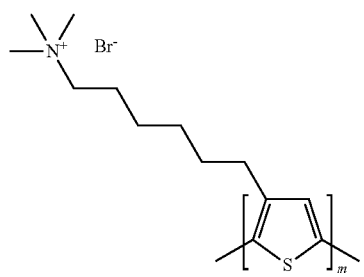

1

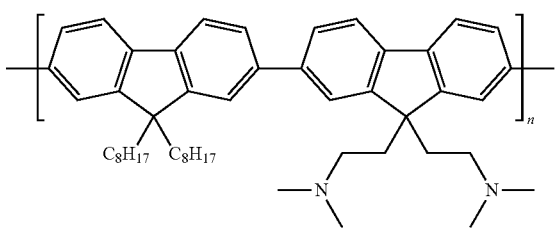

2

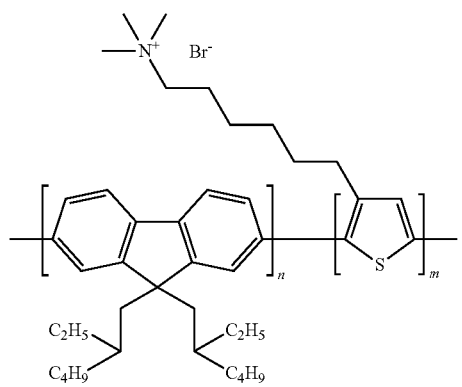

3

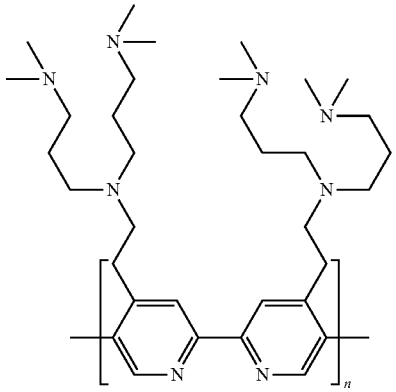

4

-continued
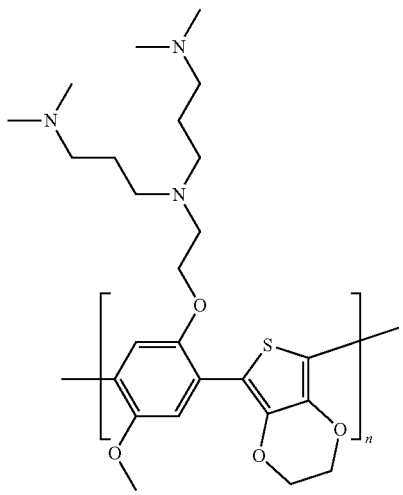
5
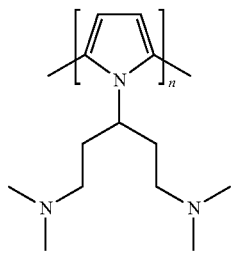
6
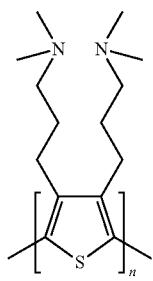
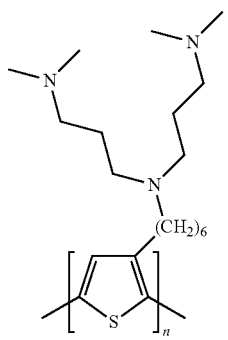
7
8
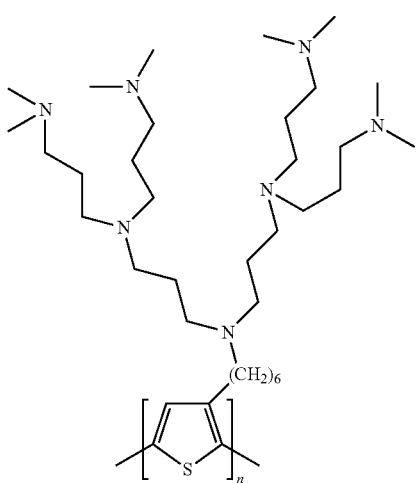
9

[Chemical Formula 9]
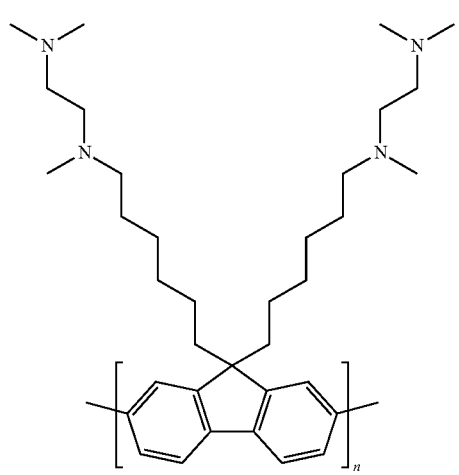
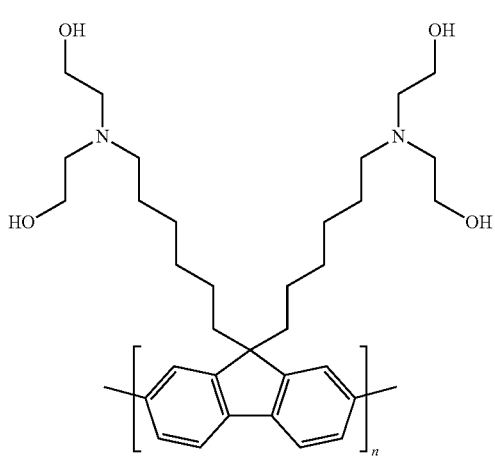
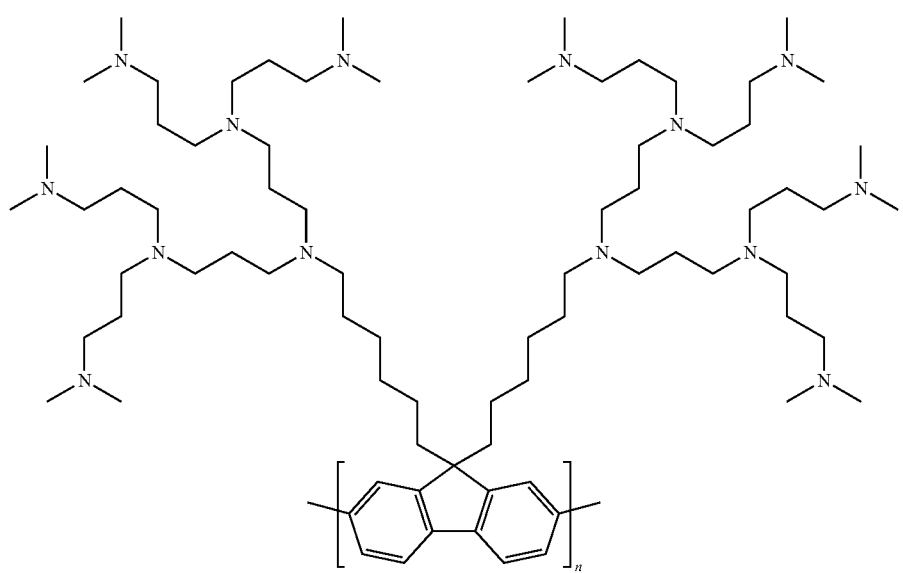
[Chemical Formula 10]
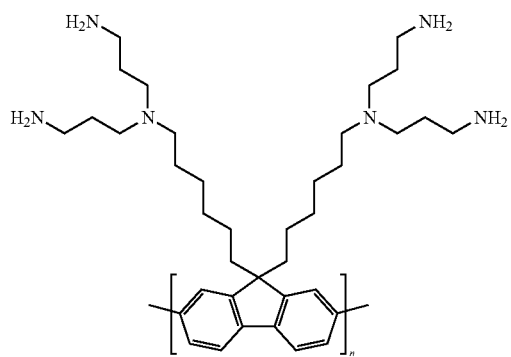
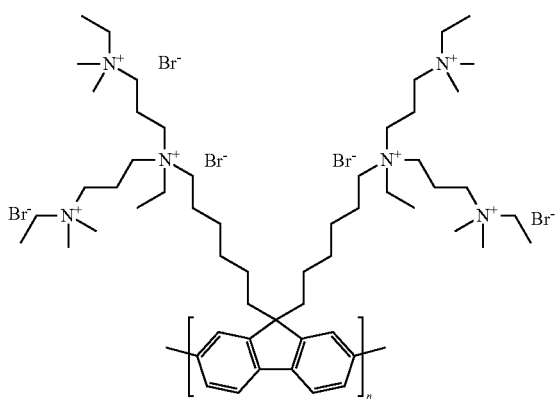

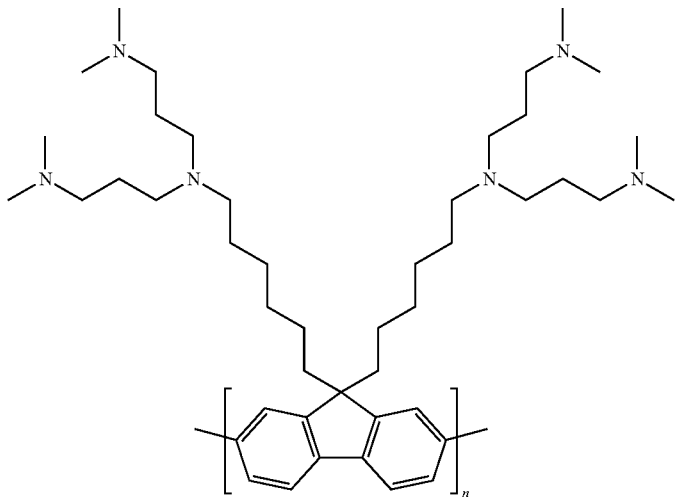
15
[Chemical Formua 11]
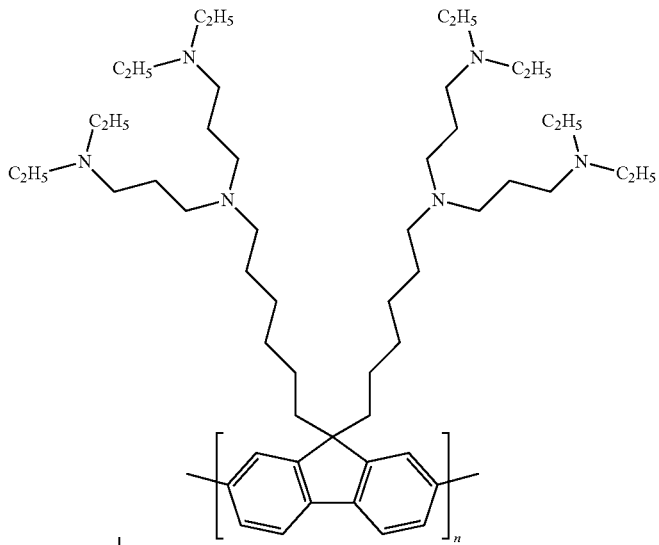
16
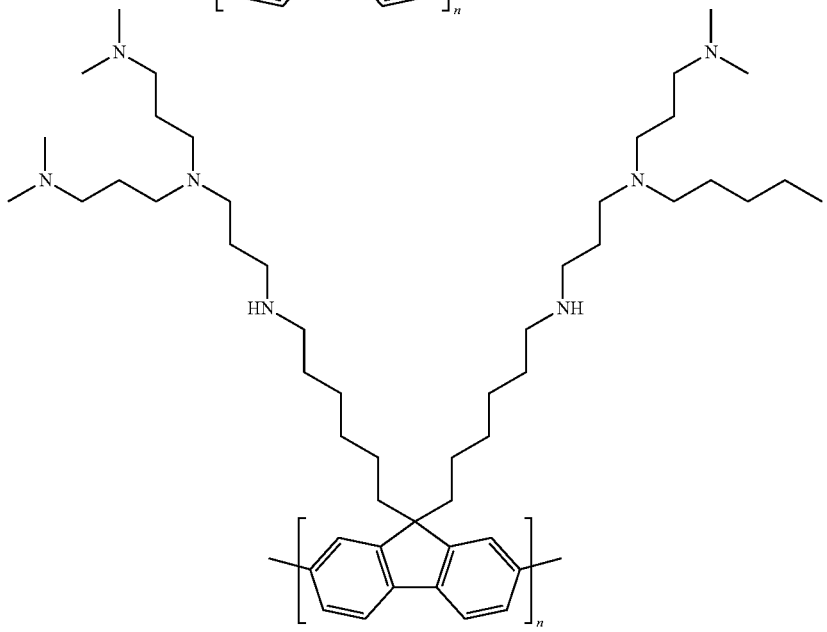
17

-continued
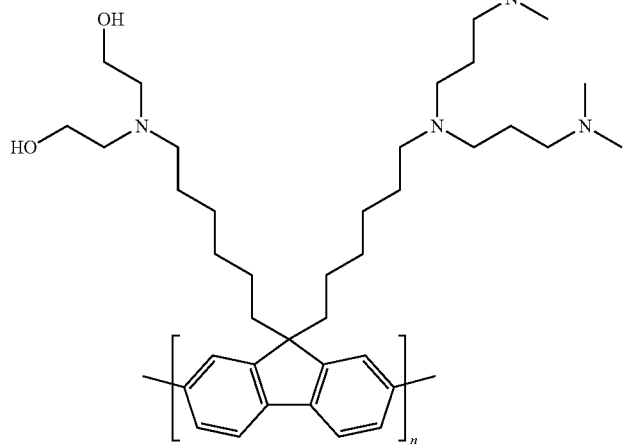
18
[Chemical Formula 12]
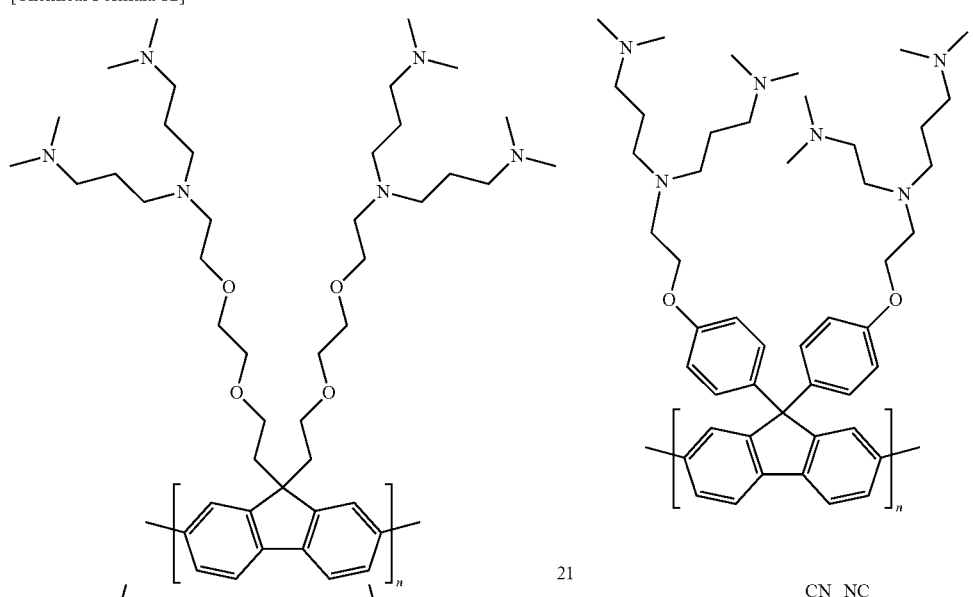
19
20
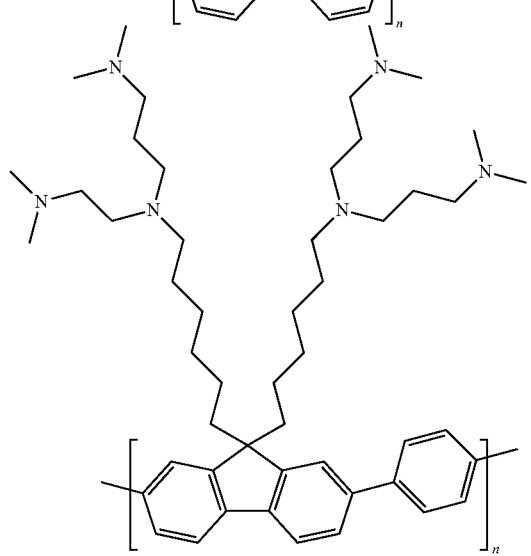
21
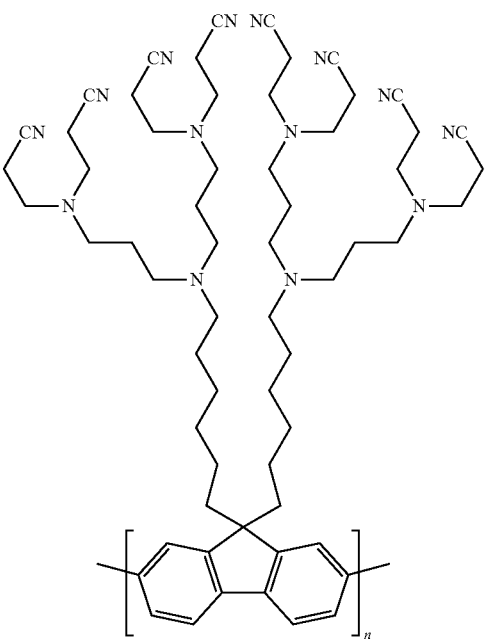
22

-continued
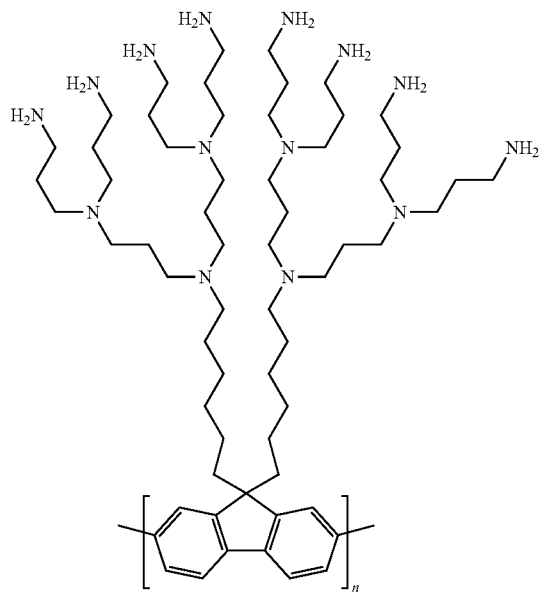
23
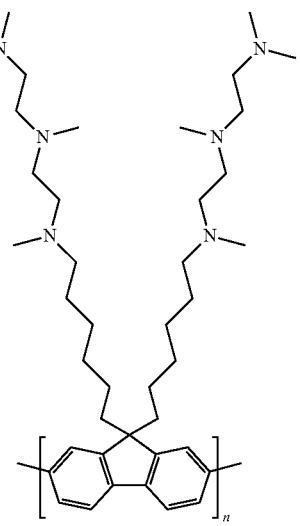
24
[Chemical Formula 13]
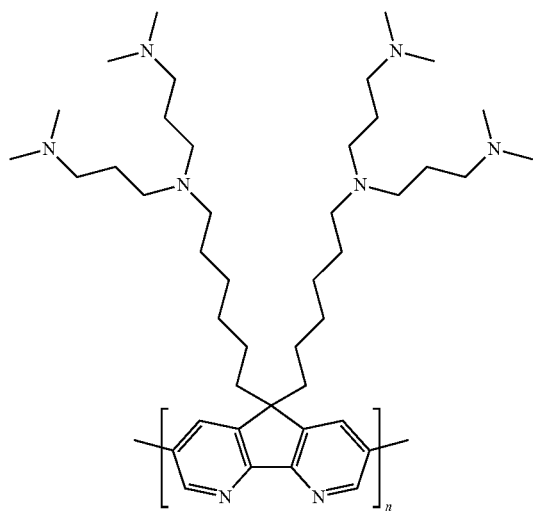
25
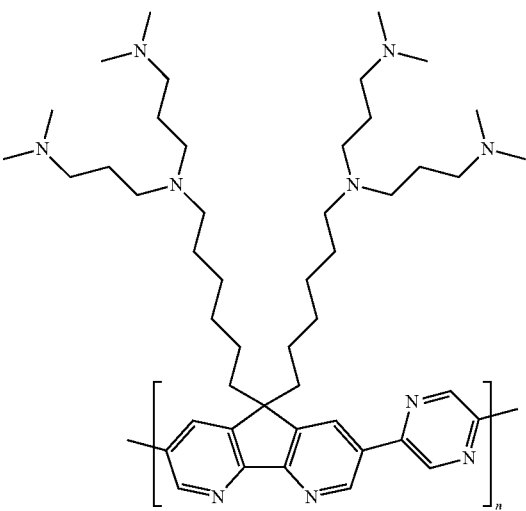
26

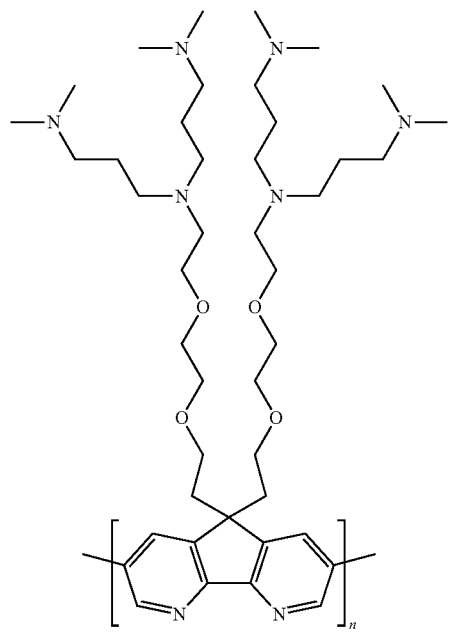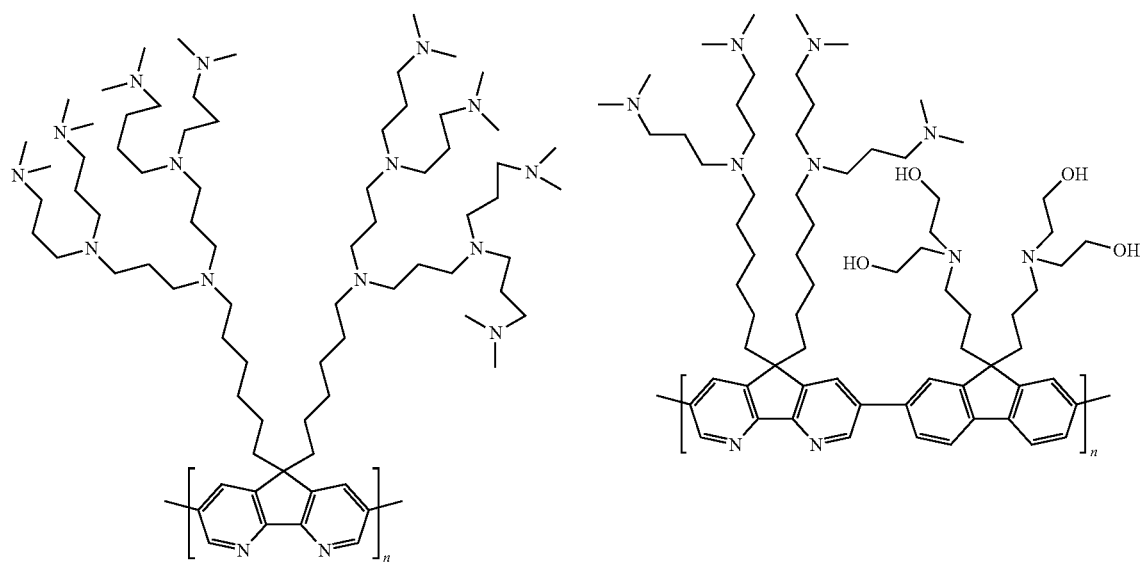

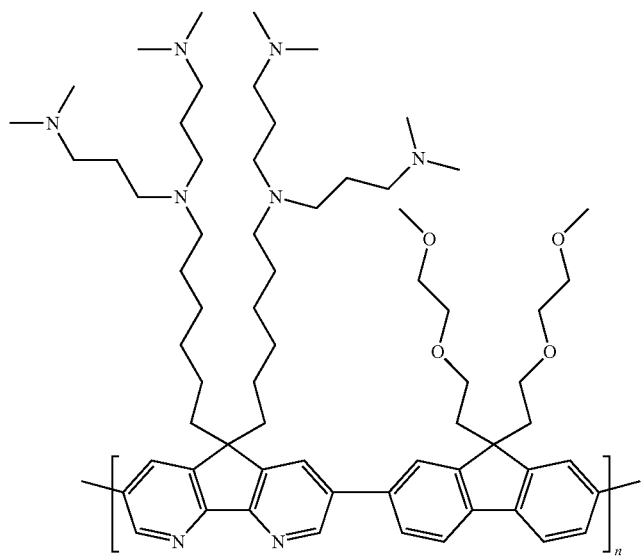
[Chemical Formula 14]
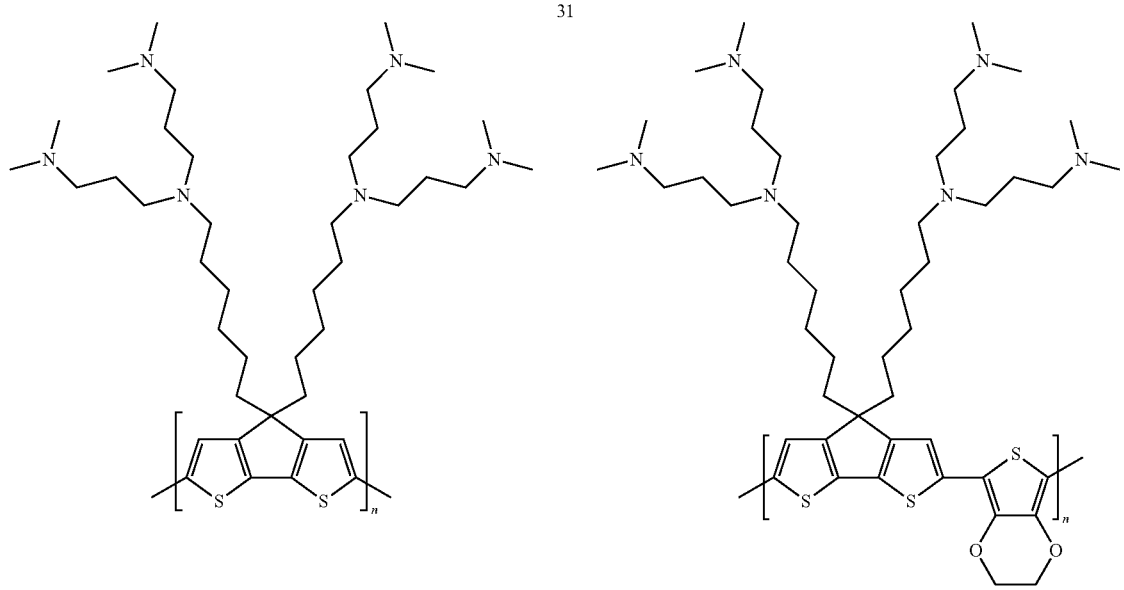

-continued
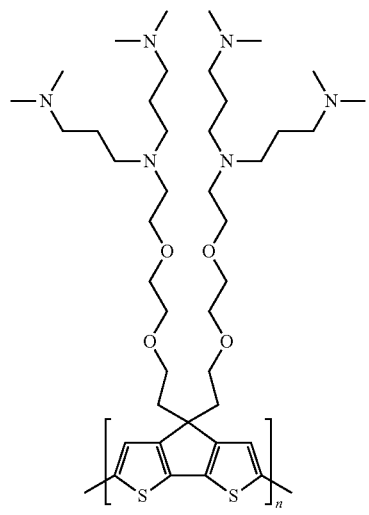
33
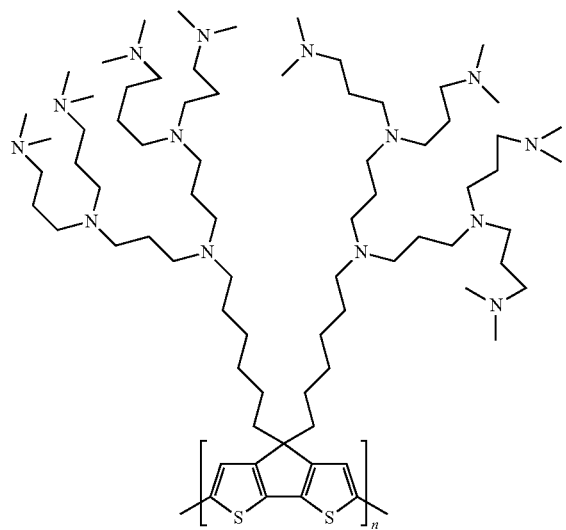
34
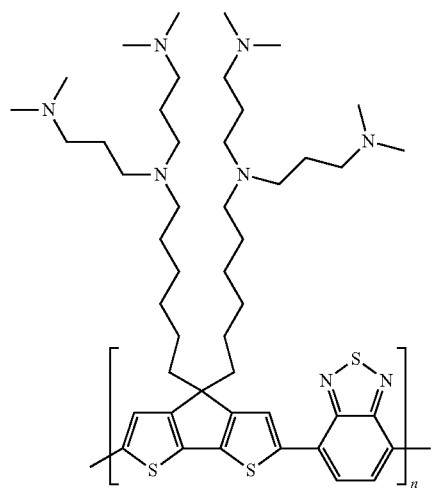
35
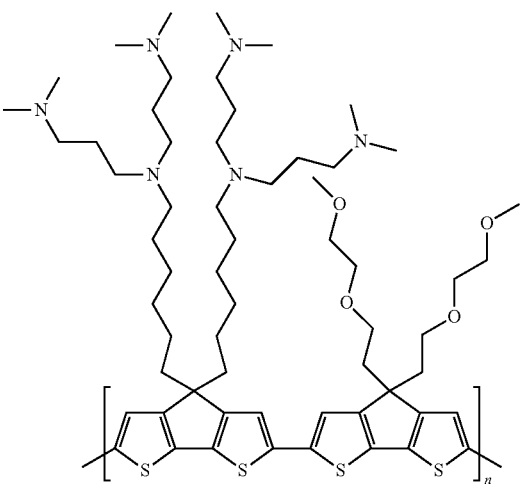
36
[Chemical Formula 15]
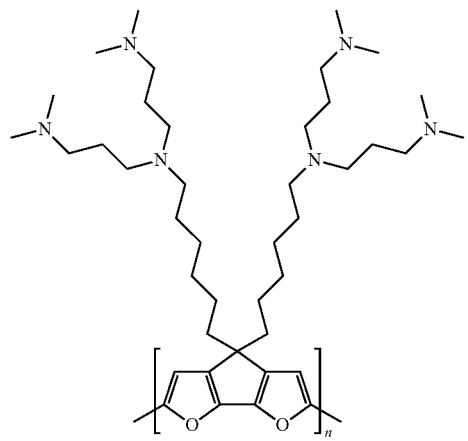
37
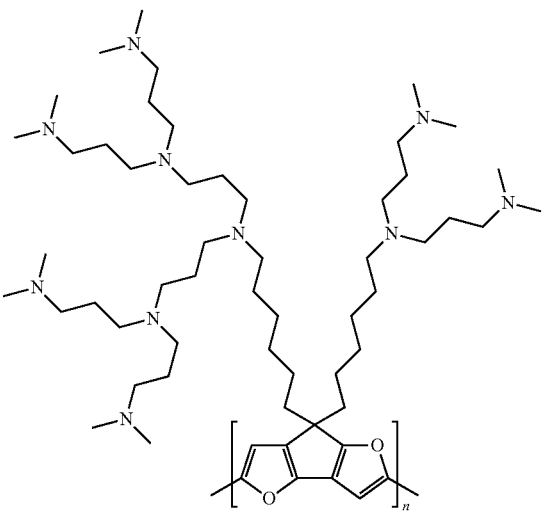
38

-continued
39
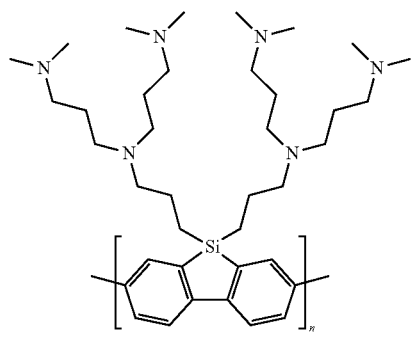
40
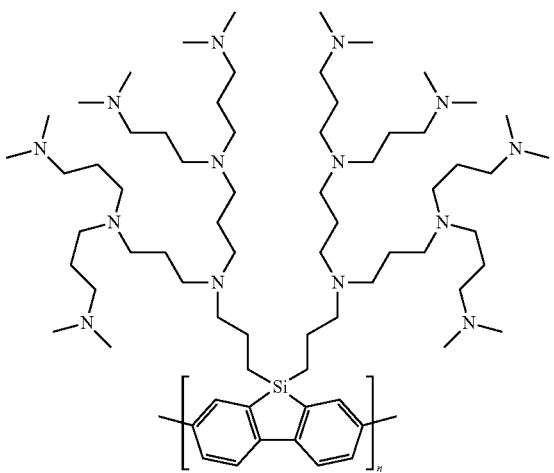
41
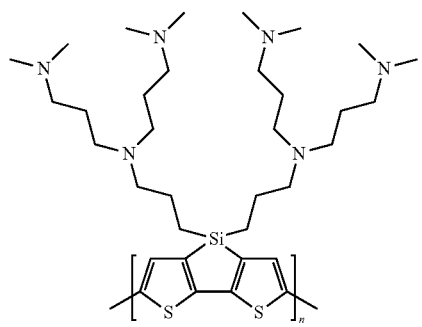
42
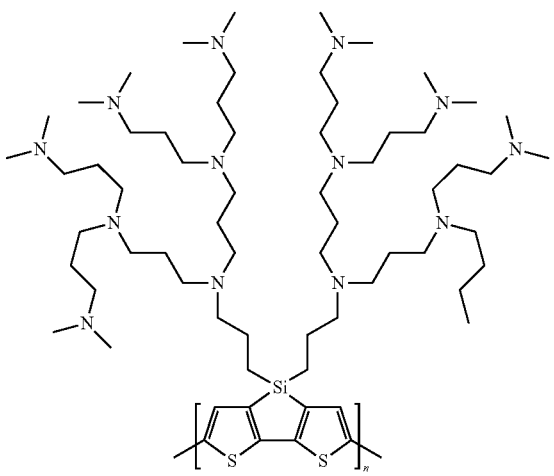
[Chemical Formula 16]
43
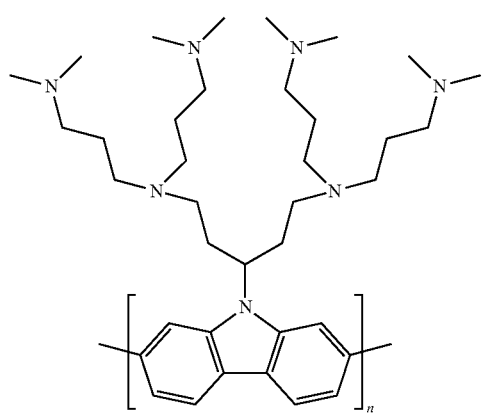
44
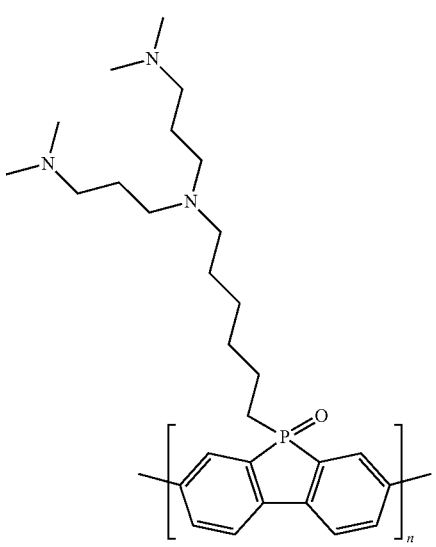

-continued
45
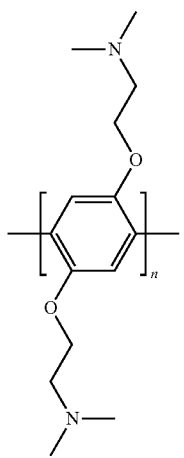
46
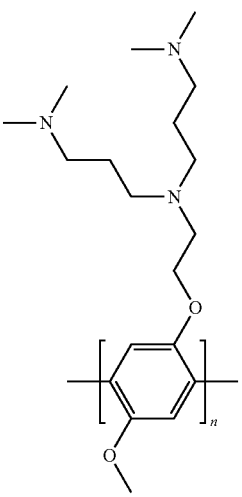
47
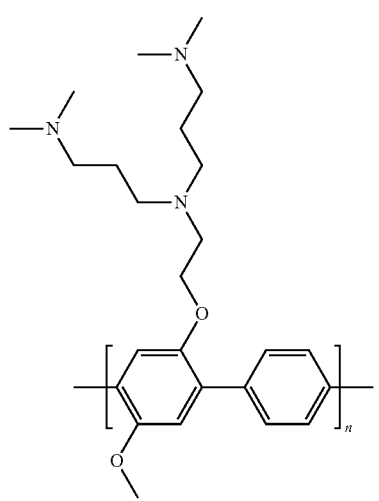
48
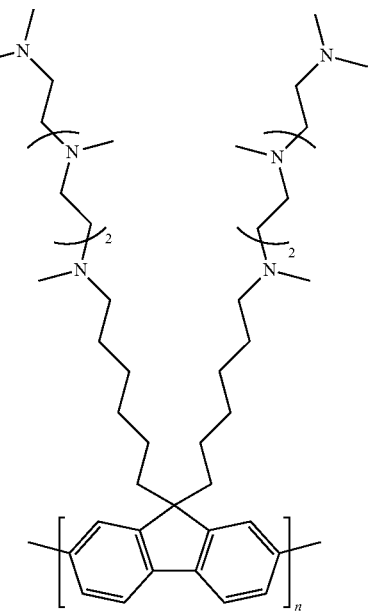
49
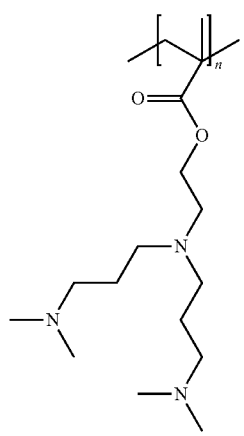
50
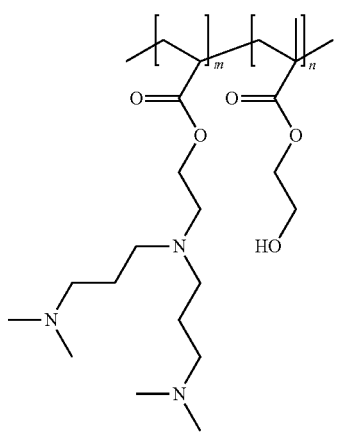

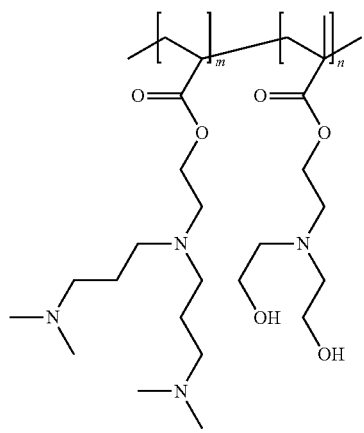
51
[Chemical Formula 17]
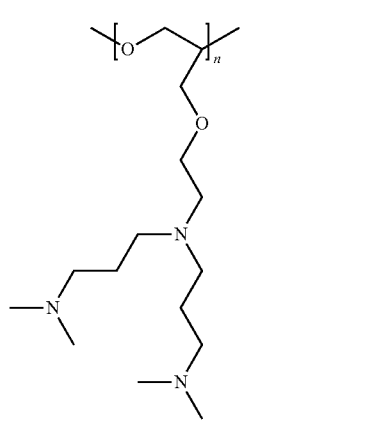
52
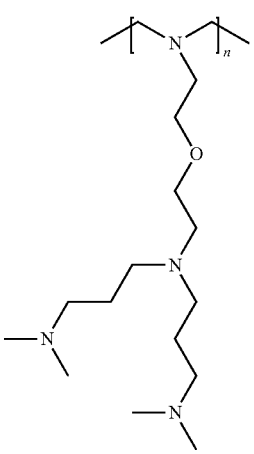
53
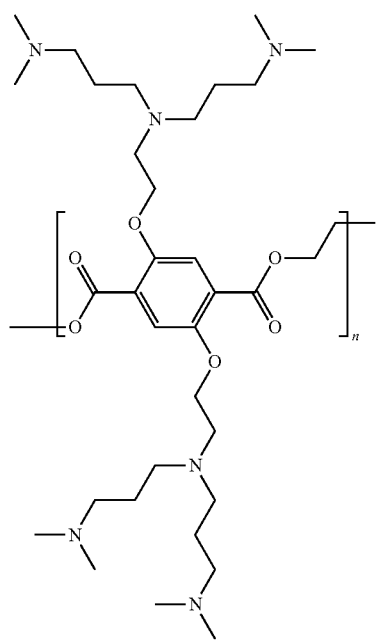
54
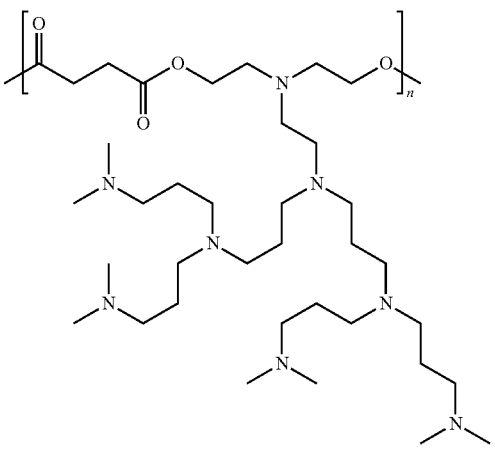
55

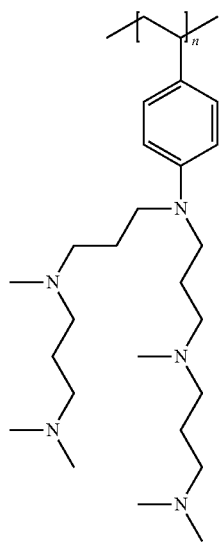

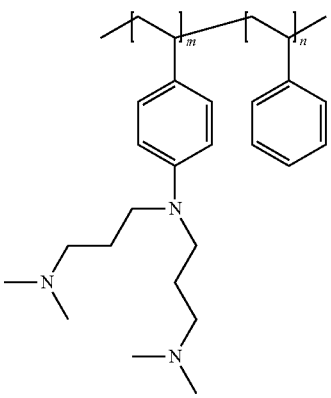

[Chemical Formula 18]

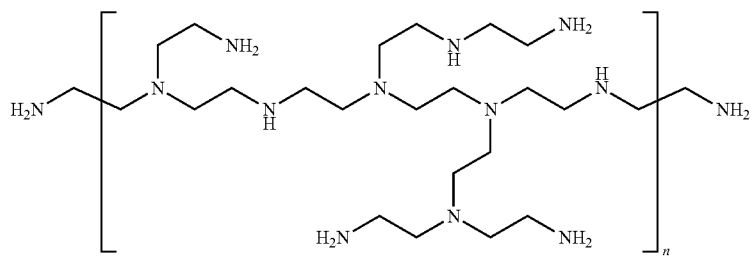

(3.2) Production Method and Characteristics

The hole blocking layer can be formed, for example, by thinning the hole blocking material, according to a known method such as a spin coating method, a casting method, printing methods including an ink-jet method or an LB method, and preferably can be formed by a wet process using a coating liquid containing the hole blocking material and a fluoroalcohol solvent.

The film thickness of the hole blocking layer is not particularly limited, and is about 2 to 10 nm and preferably 5 to 10 nm. The hole blocking layer may be a single layer structure composed of one or two or more of the above materials.

[4] Light Emitting Layer

The light emitting layer constituting the EL element contains a quantum dot.

The constitution of the light emitting layer is not particularly limited, as long as the contained light emitting material satisfies the above requirement.

There may be a plurality of layers that has the same light emitting spectrum and light emitting maximum wavelength.

The film thickness of the light emitting layer is preferably in the range of 1 to 100 nm, and further preferably 50 nm or less since lower driving voltage can be obtained.

The film thickness of the individual light emitting layer is preferably adjusted to the range of 1 to 50 nm.

The individual light emitting layer may show light emission of each color, blue, green or red, and the relationship of the film thickness of each light emitting layer is not particularly limited.

The light emitting layer can be formed by forming a film of the light emitting material or host compound set forth below, for example, using a known method to form a thin film such as a vacuum deposition method, a spin coating method, a casting method, an LB method (Langmuir-Blodgett method) or an ink-jet method.

As the specific constitution of the light emitting layer, the light emitting layer contains a host compound and a quantum dot, and may further contain a light emitting material (phosphorescent light emitting dopant).

Here, when containing a quantum dot and a phosphorescent light emitting dopant together, the quantum dot and the phosphorescent light emitting dopant may be contained together in one layer of the light emitting layer, and layers separately containing each may be laminated. When divided in plural layers and laminated, the layer containing the quantum dot and the layer containing the phosphorescent light emitting dopant may be directly adjacently laminated, and may be laminated in a state that a layer of the host compound alone without containing a light emitting material or a charge-generating layer interposed between them.

(4.1) Host Compound

The host compound is a compound having a short light emitting wavelength such as a light emitting wavelength assigned to the 0-0 transition band in the range of 414 to 459 nm (2.7 to 3.0 eV) in a phosphorescence spectrum, and more specifically, a compound having a high triplet energy.

As described above, also in the triplet energy level, a host compound with a band gap broader than that of the quantum dot compound is used, whereby an injection of a carrier into the quantum dot compound and confinement of excitons become efficient, and highly efficient light emission, and improvement in the lifetime due to reduction of thermal inactivation process can be obtained.

The host compound according to the present invention is not particularly limited, as long as the compound satisfies the above conditions.

The light emitting wavelength assigned to the 0-0 transition band in a phosphorescence spectrum of the host compound according to the present invention can be obtained by the following method.

First, a host compound that is a measuring object is dissolved in a well-deoxidized mixed solvent of ethanol/methanol=4/1 (vol/vol), and put in a cell for phosphorescence measurement, then an excitation light is irradiated at a liquid nitrogen temperature of 77 K. After the excitation light is irradiated, a light emitting spectrum is measured at 100 ms. Since phosphorescence has a longer light-emission lifetime as compared to fluorescence, a light remained after 100 ms can be thought as almost phosphorescence. Here, measurement may be performed with a shorter delay time as to a compound having a phosphorescence lifetime shorter than 100 ms. However, it is a problem since phosphorescence and fluorescence cannot be separated, when the delay time is short so as not to be distinguished from fluorescence. Thus, it is necessary to select a delay time that the separation is possible.

In addition, as to a host compound that cannot be dissolved in the above solvent system, any solvent that can dissolve the host compound may be used. Substantially, it is considered as no problem since a solvent effect of phosphorescence wavelength is very small by the above measurement method.

Next, as to a method for obtaining the 0-0 transition band, in the present invention, the light emitting maximum wavelength appeared in the shortest wavelength side in the phosphorescence spectrum chart obtained in the measurement method is defined as the 0-0 transition band.

Since the phosphorescence spectrum is usually often low strength, there is a case where discrimination of noise and peak is difficult when enlarged. In such a case, a light emitting spectrum in the excitation light irradiation (referred to as stationary light spectrum, for convenience) is enlarged, and excitation light is irradiated, then superimposed with alight emitting spectrum after 100 ms (referred to as phosphorescence spectrum, for convenience), and a peak wavelength of the phosphorescence spectrum can be read from the stationary light spectrum part derived from the phosphorescence spectrum.

In addition, the phosphorescence spectrum is subjected to smoothing processing, whereby the noise and the peak are separated so that the peak wavelength can be read. Here, a smoothing method of Savitzky & Golay or the like can be applied as the smoothing processing.

The measuring apparatus that can be used in the above measurement includes fluorophotometer F4500 manufactured by Hitachi High-Technologies Corporation and the like.

As the host compound, a compound with a phosphorescence quantum yield of phosphorescence emission at room temperature (25° C.) of less than 0.1 is preferable. Further preferably, the phosphorescence quantum yield is less than 0.01. In addition, among the compounds contained in the light emitting layer, the volume ratio in the layer is preferably 50% or more.

The host compound is not particularly limited, as long as the compound satisfies the above conditions defined in the present invention, and a known host compound may be used alone or plural kinds may be used together. The plural kinds of host compounds are used, it is possible to adjust the movement of charges and increase the efficiency of the EL element. Also, it is possible to mix different light emissions by using plural kinds of the light emitting materials set forth below, so that an arbitrary emission color can be obtained.

Also, the host compound used in the present invention is not particularly limited, as long as the compound satisfies the above conditions defined in the present invention, and may be a conventionally known low molecular compound or a high molecular compound having a repeating unit, and may be a low molecular compound having a polymeric group such as a vinyl group or epoxy group (polymerizable light emitting host). When a polymer material is used, a compound is likely to take a solvent into it to cause phenomena thought to be hard to remove the solvent, such as swelling and gelation. Thus, in order to prevent the above phenomena, it is preferred that the molecular weight is not high, specifically it is preferred to use a material with a molecular weight at coating of 2000 or less, and further preferred to use a material with a molecular weight at coating of 1000 or less, and particularly, a host compound with a molecular weight in the range of 500 to 1000 is preferable.

As the known host compound, a compound which prevents increase in wavelength of the light emission and has high Tg (glass transition temperature) while having hole transporting ability and electron transporting ability is preferable. Here, the glass transition temperature (Tg) is a value obtained by the method in accordance with JIS-K-7121, using DSC (Differential Scanning Colorimetry).

Specific examples of known host compound include the compounds described in the following literatures. Examples of the literatures include Japanese Patent Application Laid Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837, and the like. The compound that satisfies the above conditions defined in the present invention can be selected and used.

Furthermore, the host compound according to the present invention is preferably a compound represented by the following general formula (1). This is because the compound represented by the following formula (1) has high carrier transport property due to its condensed ring structure and also has the broad triplet energy (0-0 band of phosphorescence) described above.

[Chemical Formula 19]

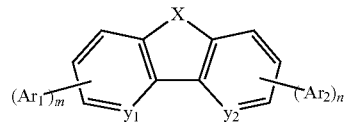

general formula(1)

wherein "X" represents NR', an oxygen atom, a sulfur atom, CR'R", or SiR'R",

"$y_1$ and $y_2$" each represent CR' or a nitrogen atom,

"R' and R''"" each represent a hydrogen atom or a substituent,

"Ar$_1$ and Ar$_2$" each represent an aromatic ring, and may be the same or different from each other, and "m and n" represent an integer of 0 to 4.

Examples of the substituents each represented by R' and R'' in X, y$_1$ and y$_2$ in the general formula (1) include alkyl groups (for example, a methyl group, an ethyl group, a propyl group, an isopropyl group, a t-butyl group, a pentyl group, a hexyl group, an octyl group, a dodecyl group, a tridecyl group, a tetradecyl group, a pentadecyl group, and the like), cycloalkyl groups (a cyclopentyl group, a cyclohexyl group, and the like), alkenyl groups (for example, a vinyl group, an allyl group, and the like), alkynyl groups (for example, an ethynyl group, a propargyl group, and the like), aromatic hydrocarbon cyclic groups (for example, also referred to as aromatic carbocyclic groups, an aryl group, and the like, for example, a phenyl group, a p-chlorophenyl group, a mesityl group, a tolyl group, a xylyl group, a naphthyl group, an anthoryl group, an azulenyl group, an acenaphthenyl group, a fluorenyl group, a phenanthryl group, an indenyl group, a pyrenyl group, a biphenylyl group, and the like), aromatic heterocyclic groups (for example, a pyridyl group, a pyrimidyl group, a furyl group, a pyrrolyl group, an imidazolyl group, a benzimidazolyl group, a pyrazolyl group, a pyrazinyl group, triazolyl groups (for example, a 1,2,4-triazol-1-yl group, a 1,2,3-triazol-1-yl group, and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofulyl group, a benzothienyl group, a dibenzothienyl group, an indolyl group, a carbazolyl group, a carbolinyl group, a diazacarbazolyl group (a group in which one of the carbon atoms constituting a carboline ring of the carbolinyl group is replaced with a nitrogen atom), a quinoxalinyl group, a pyridazinyl group, a triazynyl group, a quinazolinyl group, a phthalazinyl group, and the like.), heterocyclic groups (for example, a pyrrolidyl group, an imidazolidyl group, a morpholyl group, an oxazolidyl group, and the like.), alkoxy groups (for example, a methoxy group, an ethoxy group, a propyloxy group, a pentyloxy group, a hexyloxy group, an octyloxy group, a dodecyloxy group, and the like.) cycloalkoxy groups (for example, a cyclopentyloxy group, a cyclohexyloxy group, and the like.), aryloxy groups (for example, a phenoxy group, a naphthyloxy group, and the like.), alkylthio groups (for example, a methylthio group, an ethylthio group, a propylthio group, a pentylthio group, a hexylthio group, an octylthio group, a dodecylthio group, and the like.), cycloalkylthio groups (for example, a cyclopentylthio group, a cyclohexylthio group, and the like.), arylthio groups (for example, a phenylthio group, a naphthylthio group, and the like.), alkoxycarbonyl groups (for example, a methyloxycarbonyl group, an ethyloxycarbonyl group, a butyloxycarbonyl group, an octyloxycarbonyl group, a dodecyloxycarbonyl group, and the like.), aryloxycarbonyl groups (for example, a phenyloxycarbonyl group, a naphthyloxycarbonyl group, and the like.), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, and the like.), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, etc.), acyloxy groups (for example, an acetyloxy group, an ethylcarbonyloxy group, a butylcarbonyloxy groups, an octylcarbonyloxy group, a dodecylcarbonyloxy group, a phenylcarbonyloxy group, and the like), amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamdno group, a naphthylcarbonylamino group, and the like), carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, and the like), ureido groups (for example, a methylureido group, an ethylureido group, a pentylureido group, a cyclohexylureido group, an octylureido group, a dodecylureido group, a phenylureido group, a naphthylureido group, a 2-pyridylaminoureido group, and the like), sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, and the like), alkylsulfonyl groups (for example, a methylsulfonyl group, an ethylsulfonyl group, a butylsulfonyl group, a cyclohexylsulfonyl group, a 2-ethylhexylsulfonyl group, a dodecylsulfonyl group, and the like), arylsulfonyl groups or heteroarylsulfonyl groups (for example, a phenylsulfonyl group, a naphthylsulfonyl group, a 2-pyridylsulfonyl group, and the like), amino groups (for example, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, and the like), halogen atoms (for example, a fluorine atom, a chlorine atom, a bromine atom, and the like), fluorinated hydrocarbon groups (for example, a fluoromethyl group, a trifluoromethyl group, a pentafluoroethyl group, a pentafluorophenyl group, and the like), cyano groups, nitro groups, hydroxy groups, mercapto groups, silyl groups (for example, a trimethylsilyl group, a triisopropylsilyl group, a triphenylsilyl group, a phenyldiethylsilyl group, and the like) and the like. These substituents may be further substituted by the above substituent. A plurality of these substituents may combine each other to form a ring.

Among them, as a structure excellent in electron transporting properties, the compounds, in the general formula (1), X is NR' or an oxygen atom, are preferable. More specifically, compounds having a (n) (aza) carbazole ring or a (n) (aza)dibenzofuran ring are preferable. Here, as the R', an aromatic hydrocarbon group (also referred to as an aromatic carbocyclic group, an aryl group, and the like, for example, a phenyl group, a p-chlorophenyl group, a mesityl group, a tolyl group, a xylyl group, a naphthyl group, an anthoryl group, an azulenyl group, an acenaphthenyl group, a fluorenyl group, a phenatolyl group, an indenyl group, a pyrenyl group or a biphenylyl group) or an aromatic heterocyclic group (for example, a furyl group, a thienyl group, a pyridyl group, a pyridazinyl group, a pyrimidyl group, a pyrazinyl group, a triazolyl group, an imidazolyl group, a pyrazolyl group, a triazolyl group, a quinazolinyl group, a phthalazinyl group, and the like) is particularly preferred.

The aromatic hydrocarbon groups and the aromatic heterocyclic groups each may have, the substituent each represented by R' and R" in X in the general formula (1).

In the general formula (1), the atoms represented by $y_1$ and $y_2$ include CR' or a nitrogen atom, and is more preferably CR'. Such a compound is excellent also in hole transporting properties, and can efficiently recombine and emit the electron and hole injected from the first electrode and the second electrode in the light emitting layer.

In the general formula (1), the aromatic ring represented by $Ar_1$ and $Ar_2$ includes aromatic hydrocarbon rings or aromatic heterocyclic rings. Also, the aromatic ring may be a monocycle or a condensed ring, and further, even unsubstituted, may have the substituent each represented by R' and R" in X in the general formula (1).

In the general formula (1), examples of the aromatic hydrocarbon ring represented by $Ar_1$ and $Ar_2$ include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthraanthrene ring, and the like.

In the partial structure represented by the general formula (1), examples of the aromatic heterocyclic ring represented by $Ar_1$ and $Ar_2$ include a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, a diazacarbazole ring (shows one of the carbon atoms of a hydrocarbon ring constituting a carboline ring is further substituted with a nitrogen atom) and the like.

In the general formula (1), these rings may further have the substituent each represented by R' and R".

Among them, in the general formula (1), ones preferably used as the aromatic rings represented by $Ar_1$ and $Ar_2$ are a carbazole ring, a carboline ring, a dibenzofuran ring, and a benzene group, further preferably used are a carbazole ring, a carboline ring, and a benzene group, and more preferably a benzene group having a substituent, and particularly preferably a benzene group having a carbazolyl group.

Also, in the general formula (1), as the aromatic rings represented by $Ar_1$ and $Ar_2$, a condensed ring each having three rings or more is one preferred embodiment, and the aromatic hydrocarbon condensed ring in which three or more rings are condensed specifically includes a naphthacene ring, an anthracene ring, a tetracene ring, a pentacene ring, a hexacene ring, a phenanthrene ring, a pyrene ring, a benzopyrene ring, a benzazulene ring, a chrysene ring, a benzochrysene ring, an acenaphthene ring, an acenaphthylene ring, a triphenylene ring, a coronene ring, a benzocoronene ring, a hexabenzocoronene ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, an anthraanthrene ring, and the like. These rings may further have the substituent described above.

Also, the aromatic heterocyclic ring in which three or more rings are condensed specifically include an acridine ring, a benzoquinoline ring, a carbazole ring, a carboline ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perymidine ring, a diazacarbazole ring (a group in which any one of the carbon atoms constituting a carboline ring is replaced with a nitrogen atom), a phenanthroline ring, a dibenzofuran ring, a dibenzothiophene ring, a naphthofuran ring, a naphthothiophene ring, a benzodifuran ring, a benzothiophene ring, a naphthodifuran ring, a naphthodithiophene ring, an anthrafuran ring, an anthradifuran ring, an anthrathiophene ring, an anthradithiophene ring, a thianthorene ring, a phenoxathiin ring, a thiophanthorene ring (a naphthothiophene ring), and the like. These rings may further have a substituent.

Also, in the general formula (1), n represents an integer of 0 to 4, and is preferably 0 to 2, and particularly, when X is an oxygen atom or a sulfur atom, n is preferably 1 to 2.

m and n may be the same or different from each other.

In the present invention, host compounds having both a dibenzofuran ring and a carbazole ring are preferable.

In the general formula (1), at least one of $Ar_1$ and $Ar_2$ is preferably represented by a general formula (2).

[Chemical Formula 20]

general formula(2)

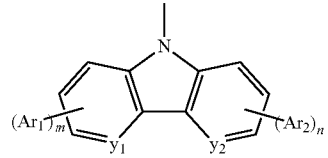

wherein "$y_1$ and $y_2$" each represent CR' or a nitrogen atom,

"R's" each represent a hydrogen atom or a substituent,

"$Ar_1$ and $Ar_2$" each represent an aromatic ring, and may be the same or different from each other, and "m and n" represent an integer of 0 to 4, and may be the same or different from each other.

The substituents of $y_1$ and $y_2$ and R's include the same substituents described in the general formula (1).

The aromatic rings represented by $Ar_1$ and $Ar_2$ include the same as the aromatic rings represented by $Ar_1$ and $Ar_2$ in the general formula (1).

Hereinbelow, as the host compound according to the present invention having a light emitting wavelength assigned to the 0-0 transition band in the range of 414 to 459 nm (2.7 to 3.0 eV) in a phosphorescence spectrum, examples of the compound represented by the general formula (1), the compound represented by the general formula (2) and the compound composed of other structure are shown but are not limited thereto.

[Chemical Formula 21]
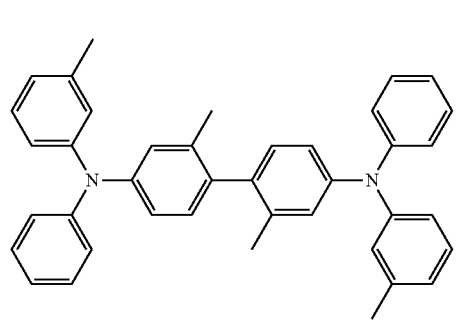
442 nm
H-1
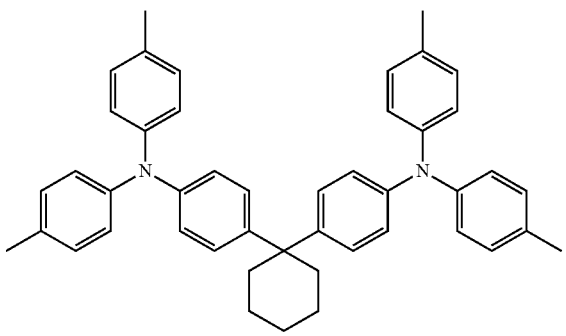
421 nm
H-2
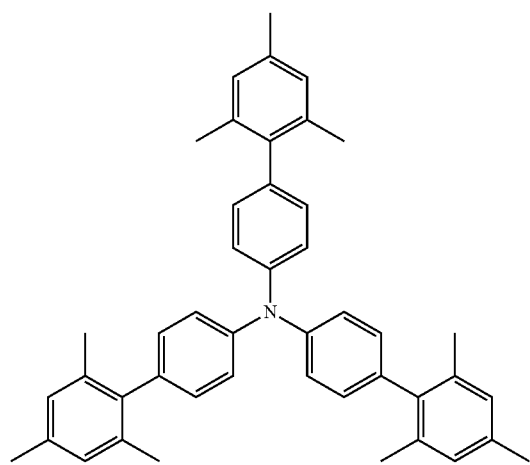
438 nm
H-3
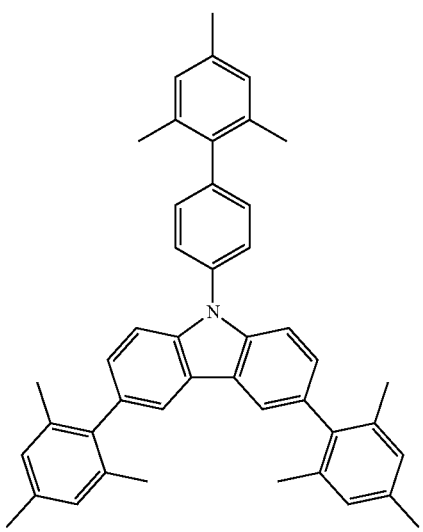
415 nm
H-4
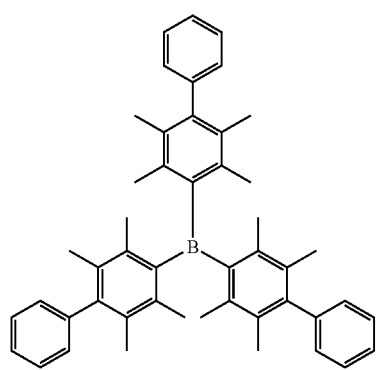
437 nm
H-5
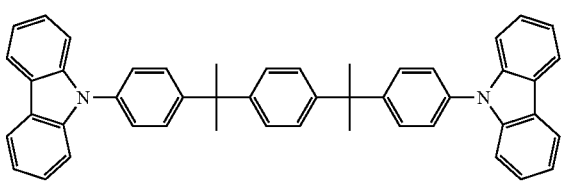
411 nm
H-6

[Chemical Formula 22]
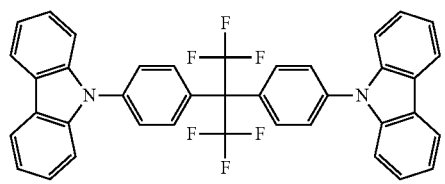
H-7
412 nm
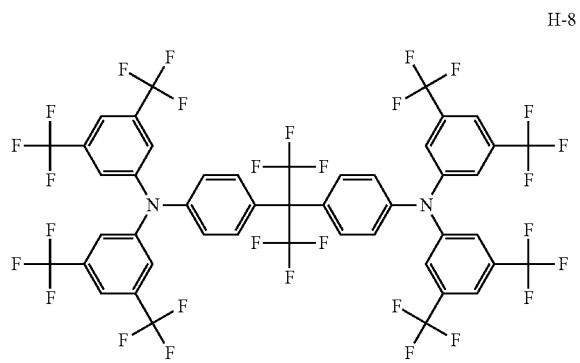
H-8
430 nm
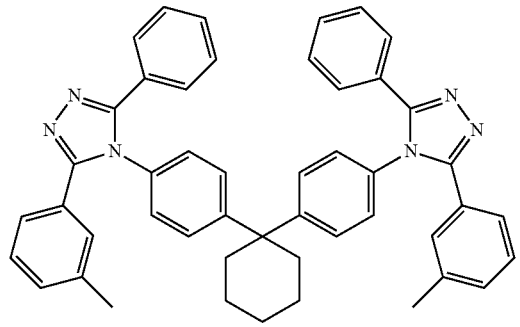
H-9
451 nm
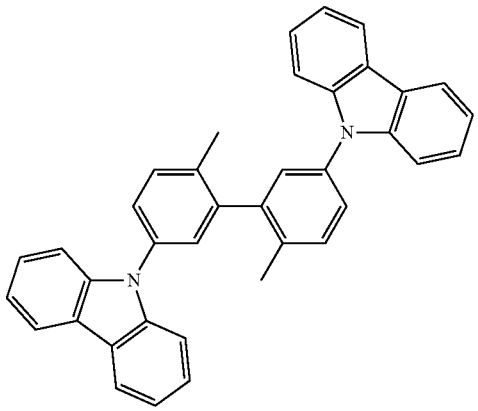
H-10
411 nm
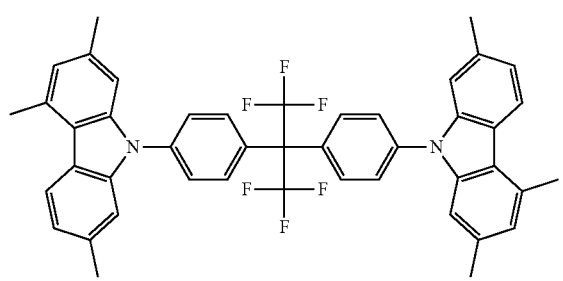
H-11
420 nm
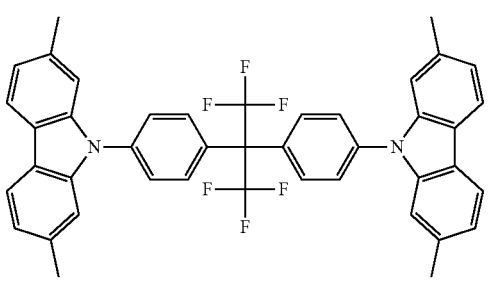
H-12
424 nm
[Chemical Formula 23]
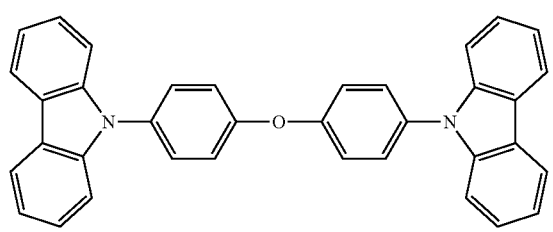
H-13
410 nm -continued
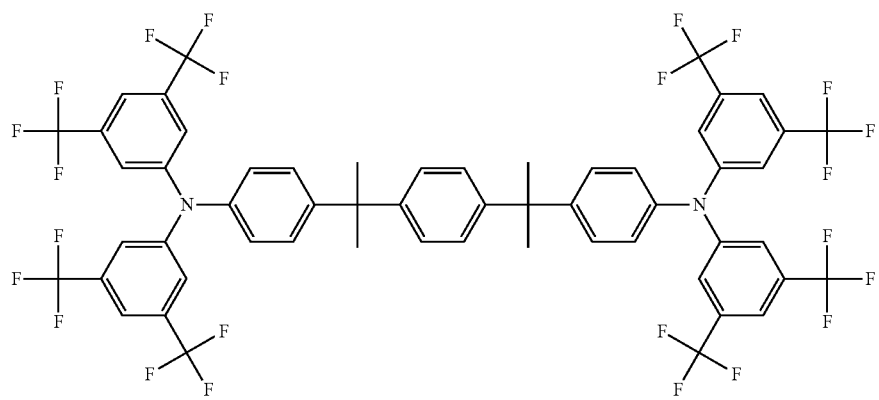
442 nm
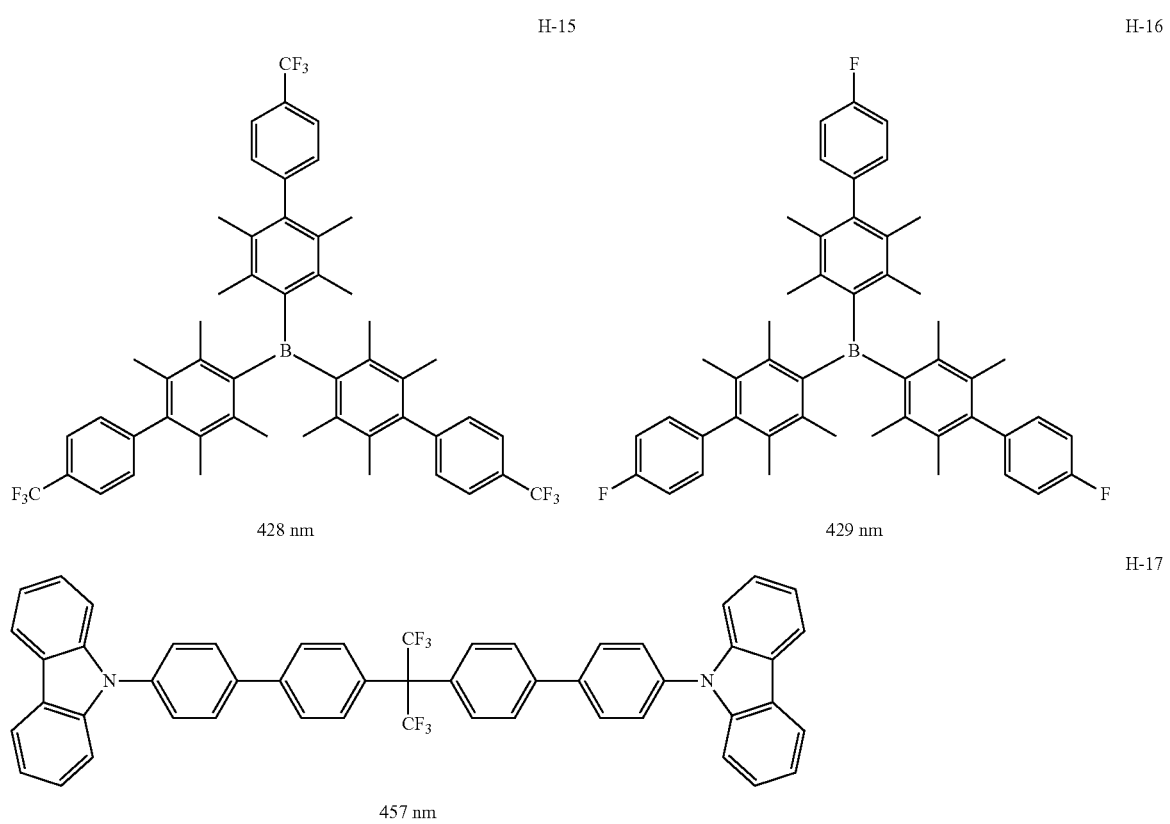
[Chemical Formula 24]
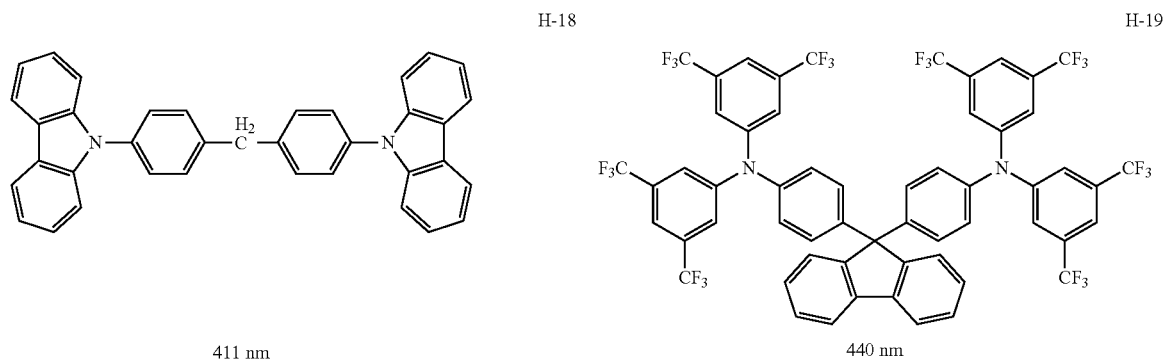

-continued
H-20
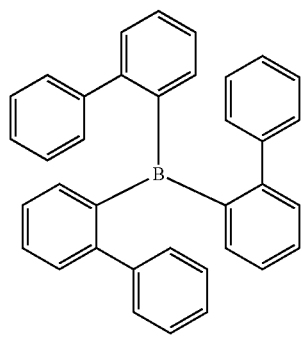
410 nm
H-21
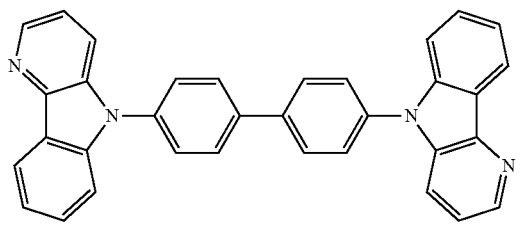
459 nm
H-22
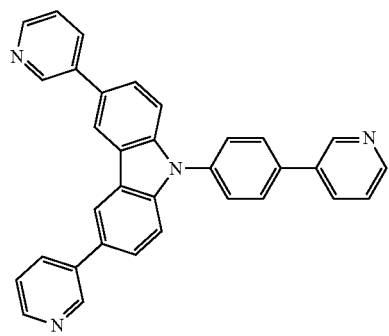
452 nm
H-23
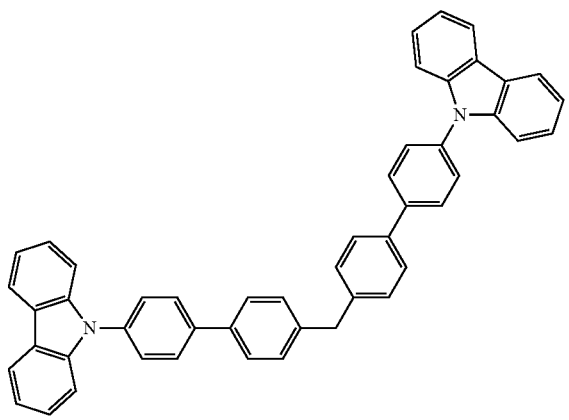
457 nm
[Chemical Formula 25]
H-24
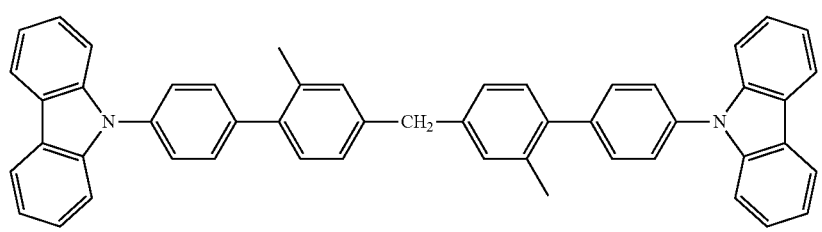
440 nm
H-25
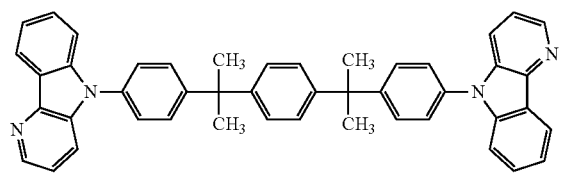
425 nm
H-26
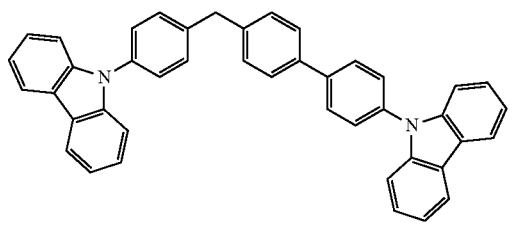
456 nm -continued
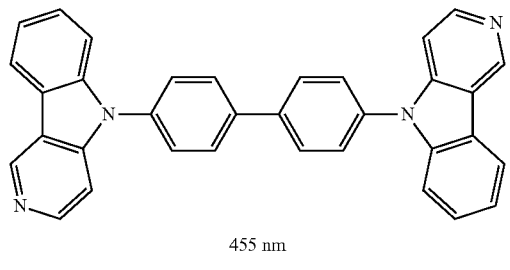
H-27
455 nm
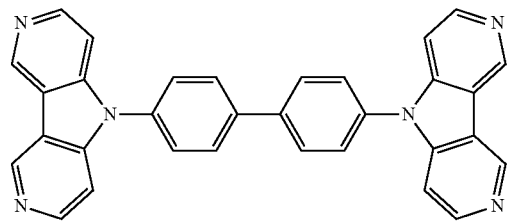
H-28
449 nm
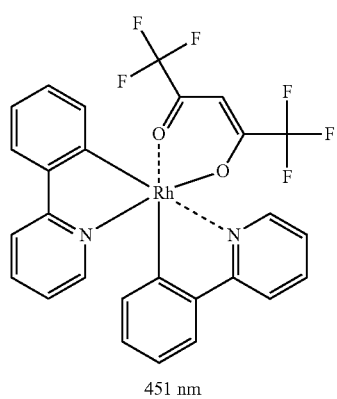
451 nm
[Chemical Formula 26]
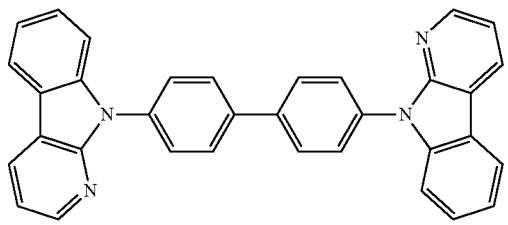
H-29
H-30
458 nm
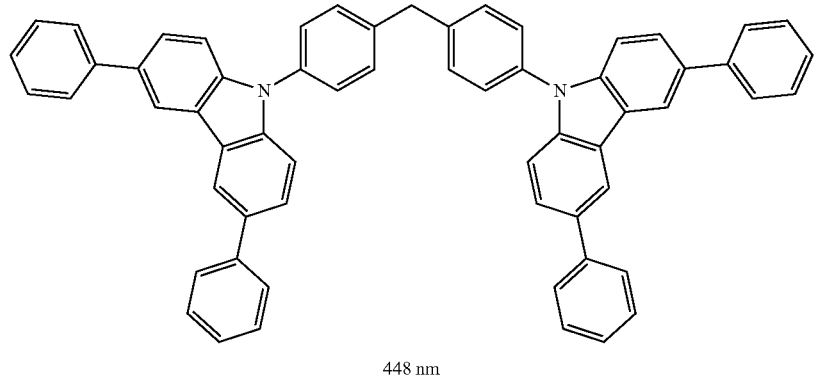
H-31
448 nm
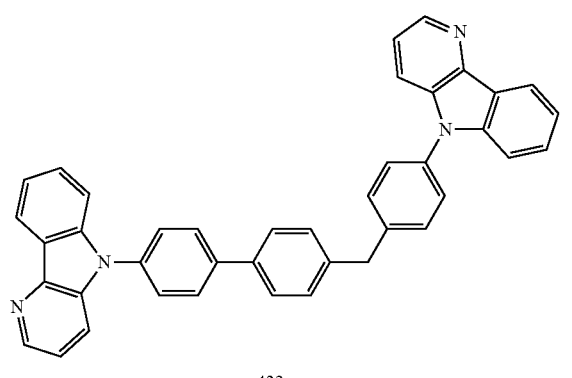
H-32
432 nm
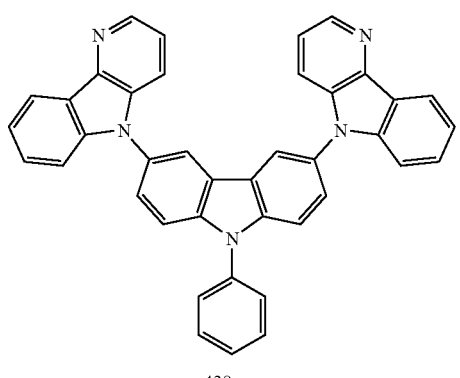
H-33
428 nm -continued
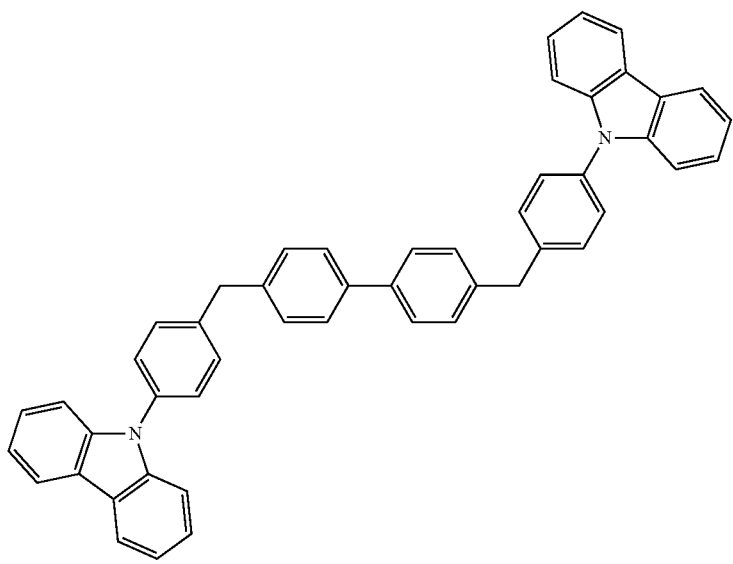
H-34
444 nm
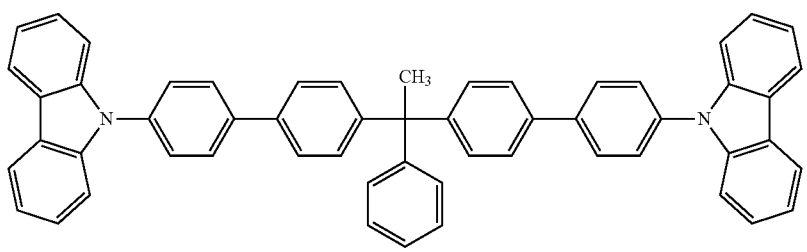
H-35
456 nm
[Chemical Formula 27]
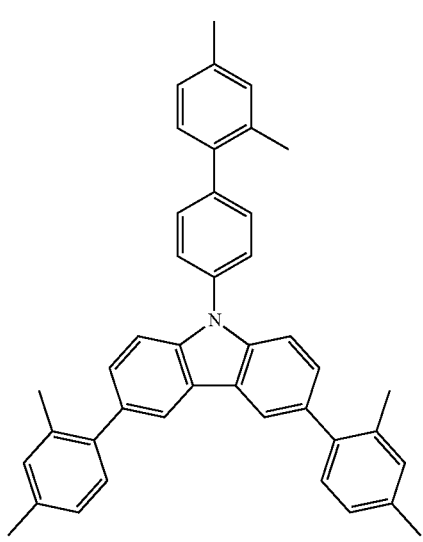
H-36
413 nm
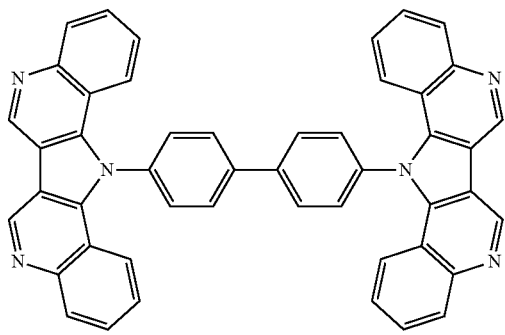
H-37
440 nm -continued
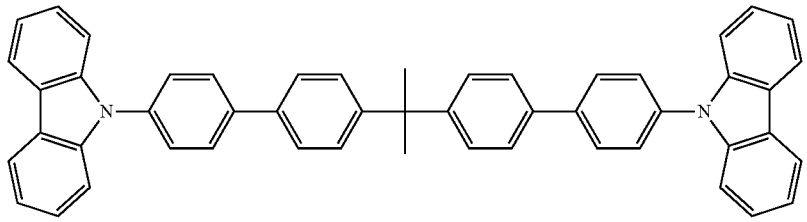
H-38
434 nm
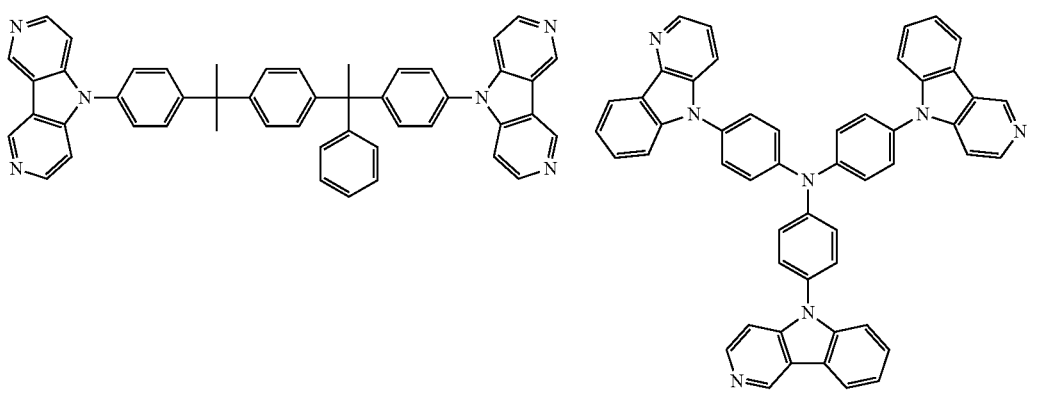
H-39
395 nm
H-40
432 nm
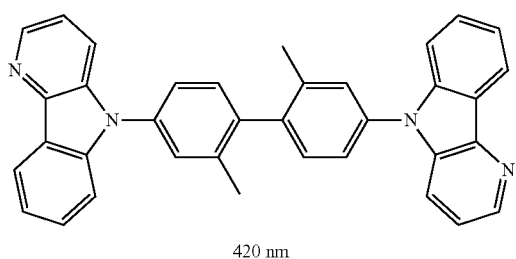
H-41
420 nm
[Chemical Formula 28]
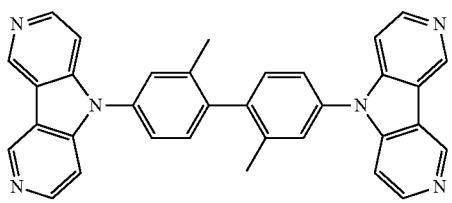
H-42
398 nm
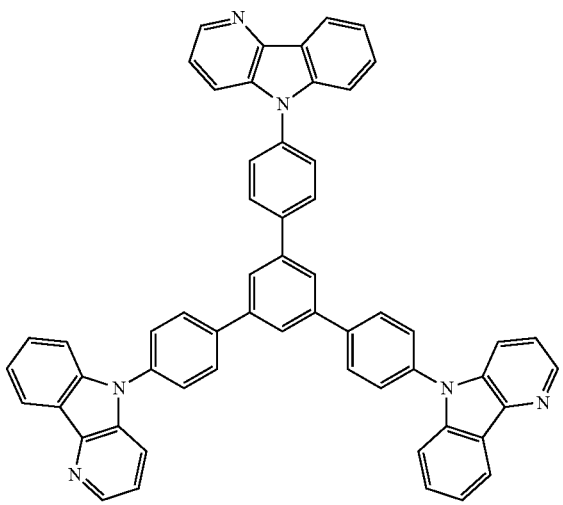
H-43
453 nm -continued
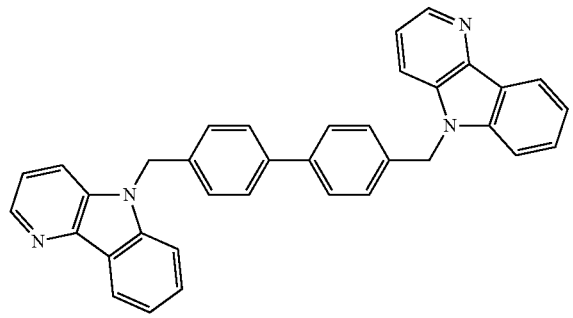
425 nm
H-44
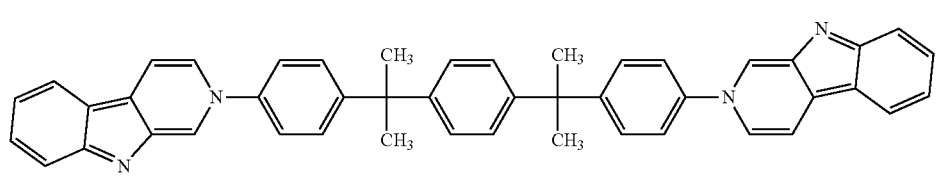
418 nm
H-45
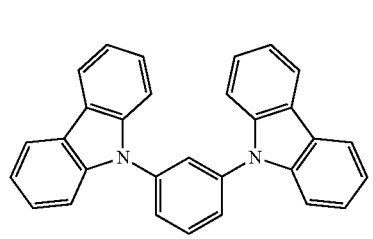
411 nm
H-46
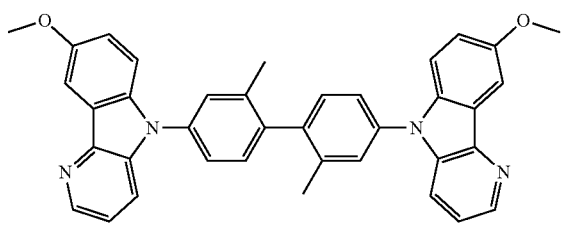
442 nm
H-47
[Chemical Formula 29]
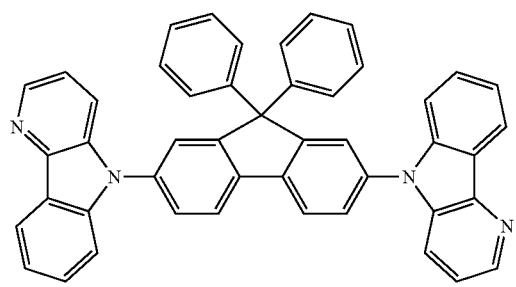
449 nm
H-48
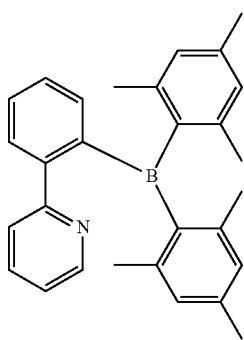
438 nm
H-49

-continued
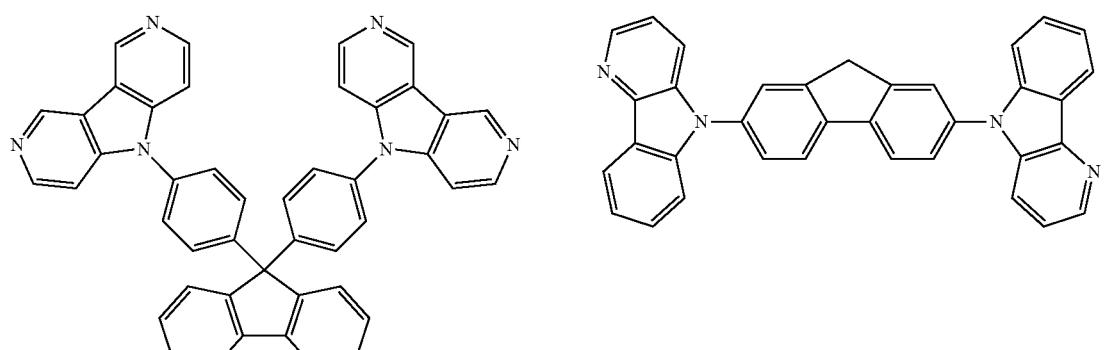
H-50
432 nm
H-51
453 nm
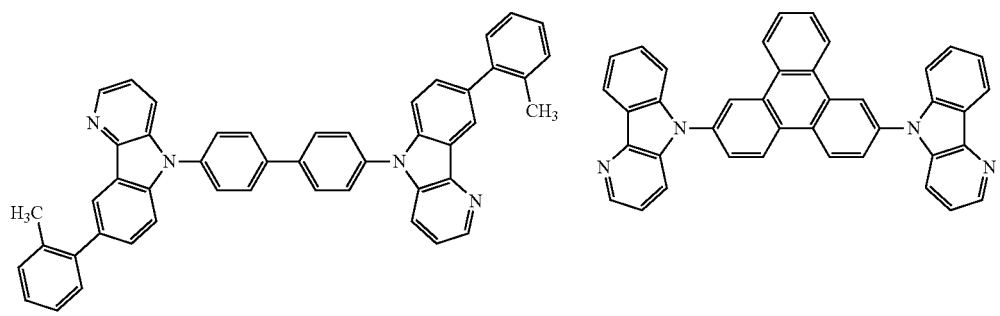
H-52
459 nm
H-53
444 nm
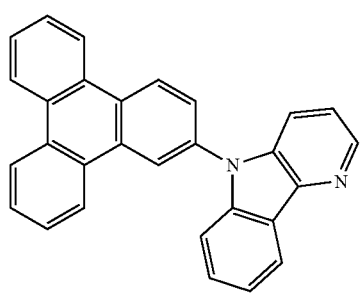
439 nm
[Chemical Formula 30]
H-54
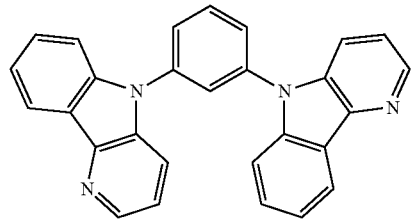 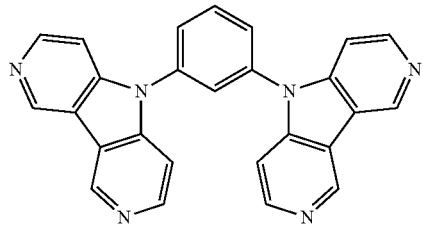
H-55
420 nm
H-56
397 nm H-57
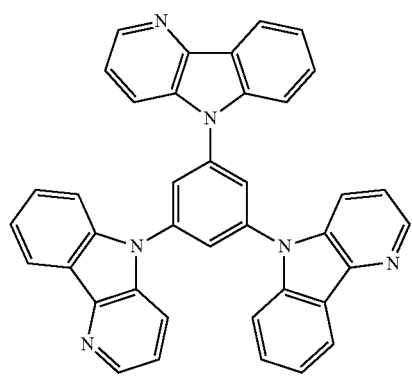
417 nm
H-58
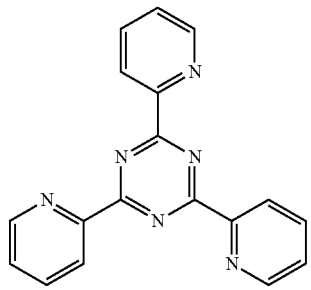
413 nm
H-59
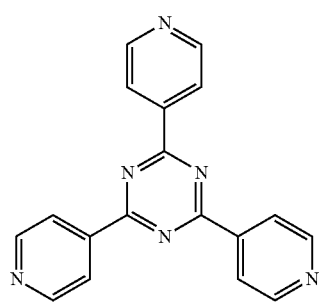
397 nm
H-60
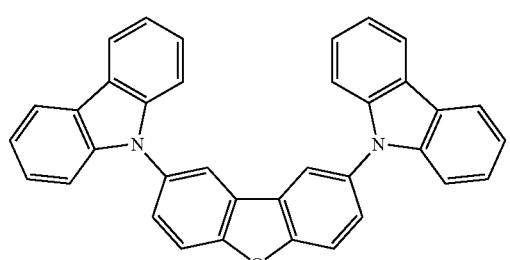
414 nm
H-61
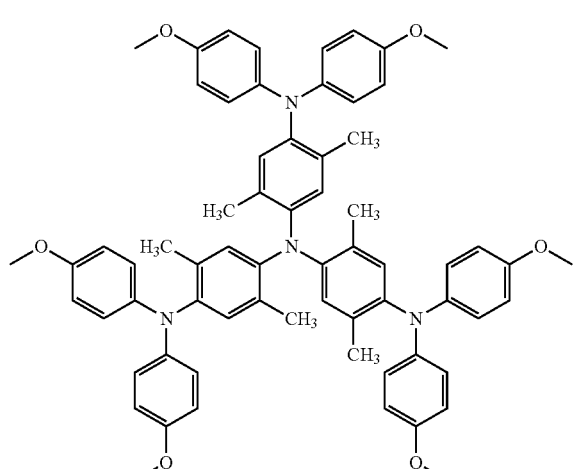
449 nm

[Chemical Formula 31]
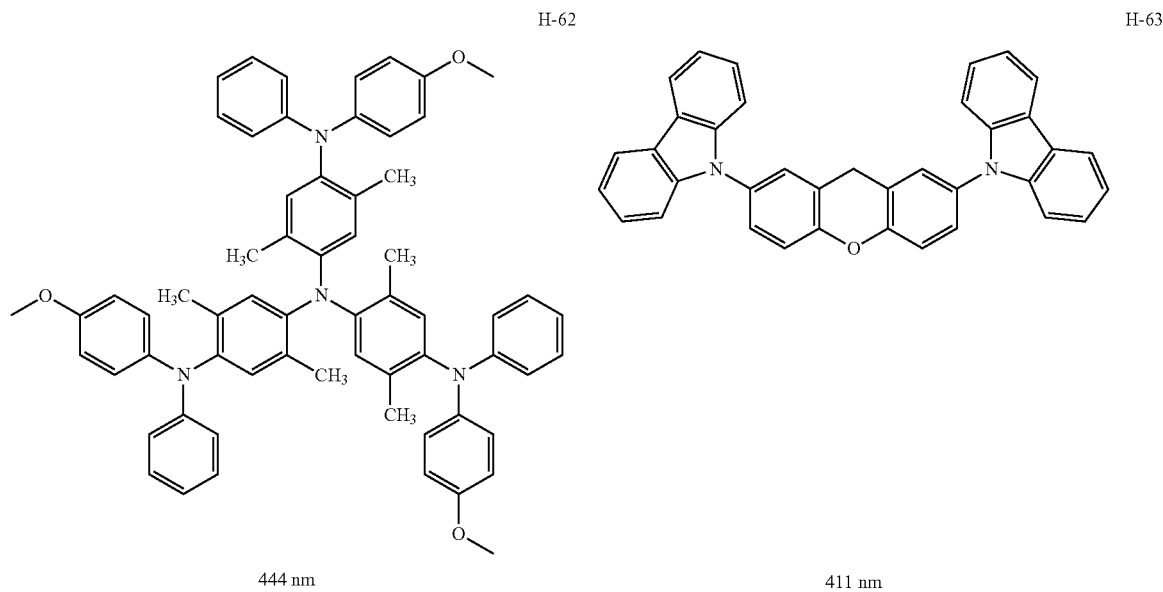
H-62
444 nm
H-63
411 nm
H-64
448 nm
H-65
452 nm
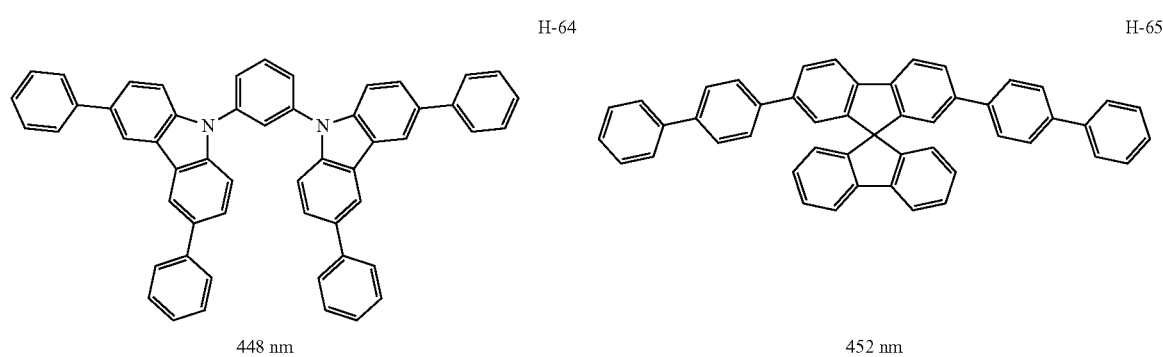
H-66
449 nm
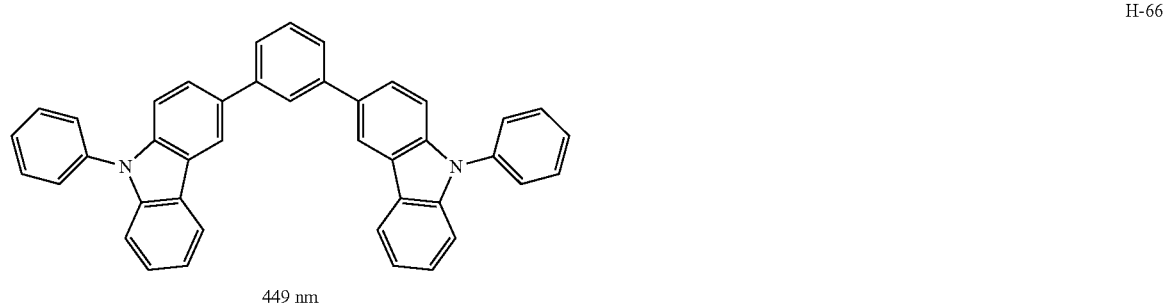
[Chemical Formula 32]
H-67
442 nm
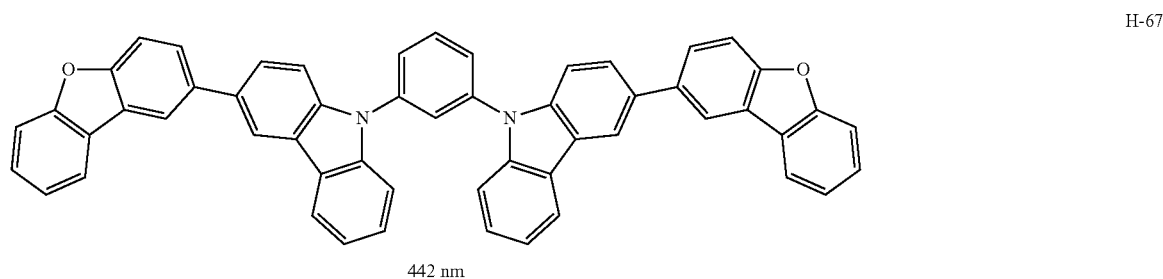

-continued
H-68
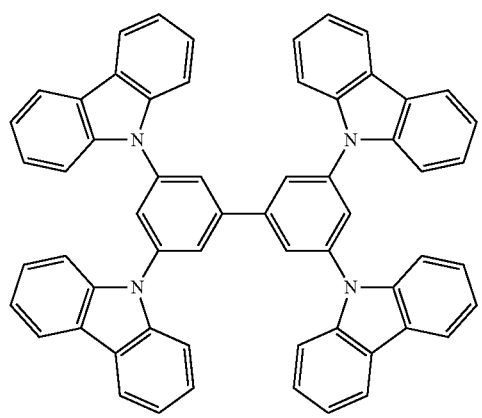
446 nm
H-69
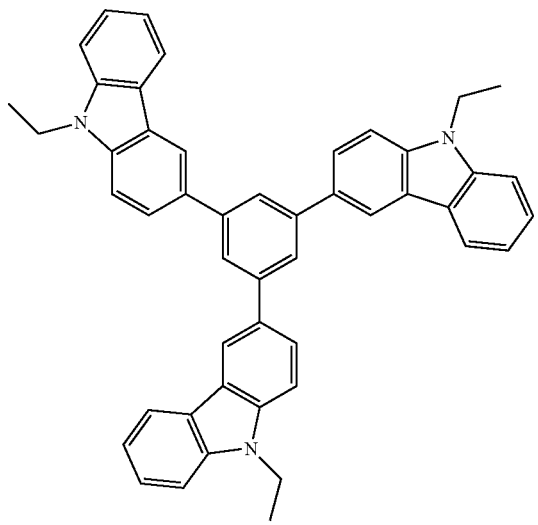
450 nm
H-70
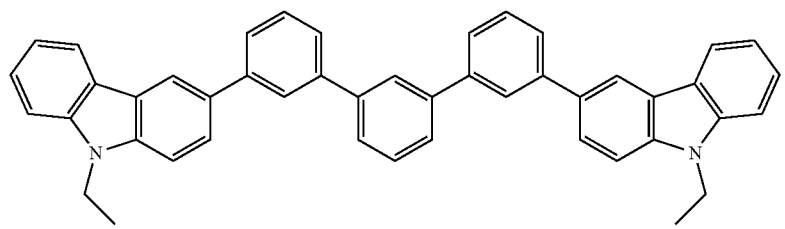
451 nm
H-71
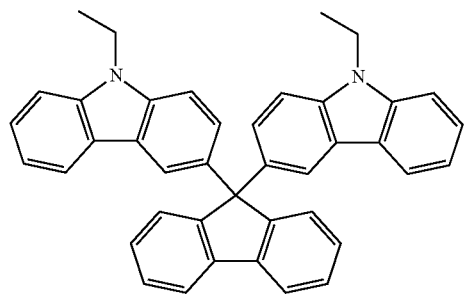
432 nm
H-72
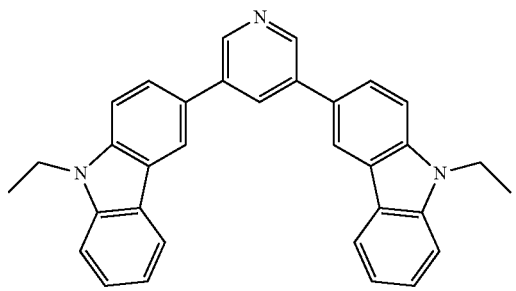
454 nm
[Chemical Formula 33]
H-73
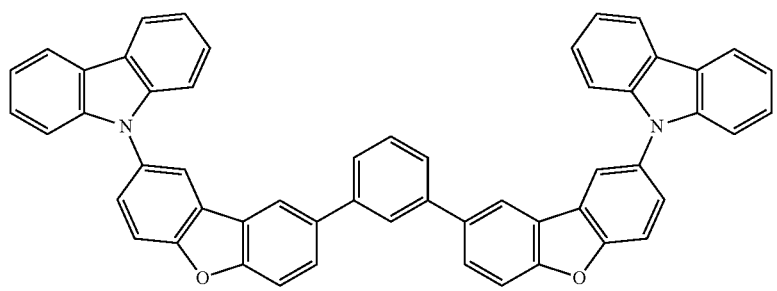
437 nm -continued
H-74
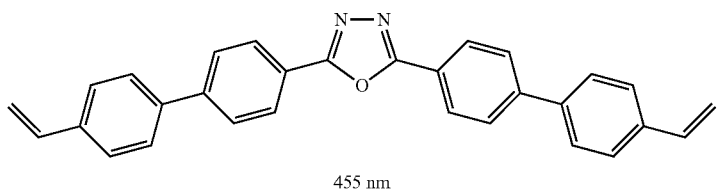
455 nm
H-75
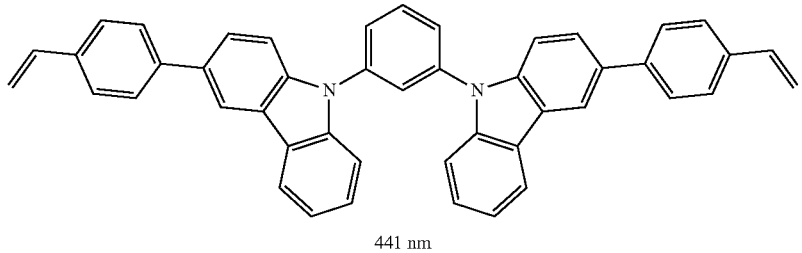
441 nm
H-76
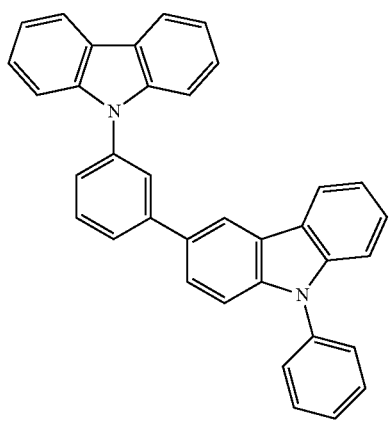
446 nm
H-77
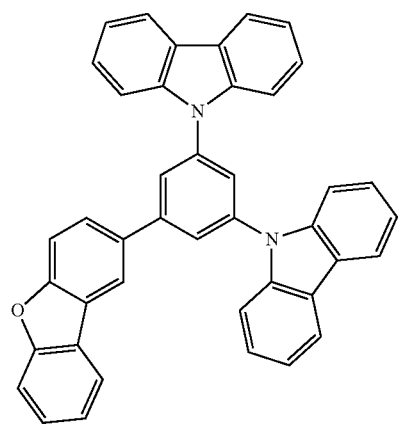
436 nm
H-78
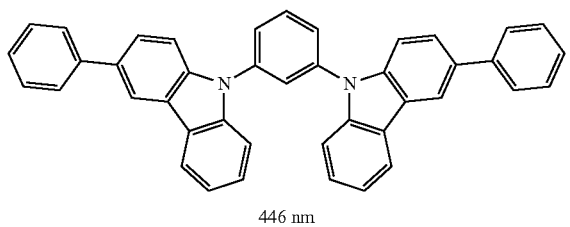
446 nm
[Chemical Formula 34]
H-79
H-80
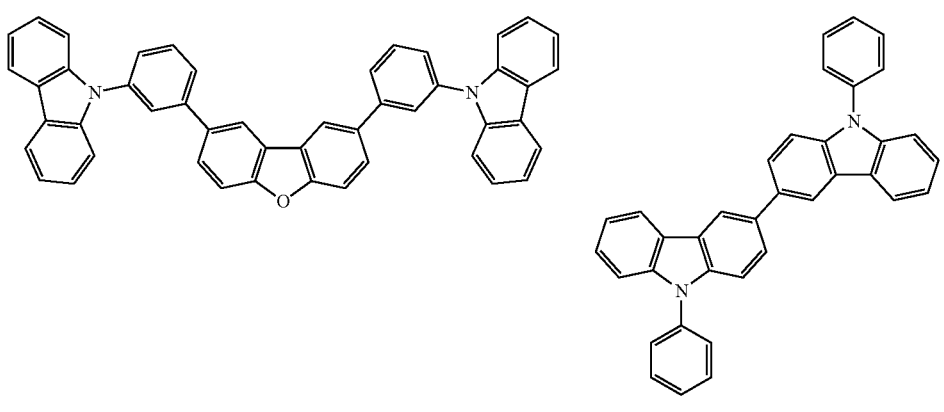
436 nm
452 nm H-81
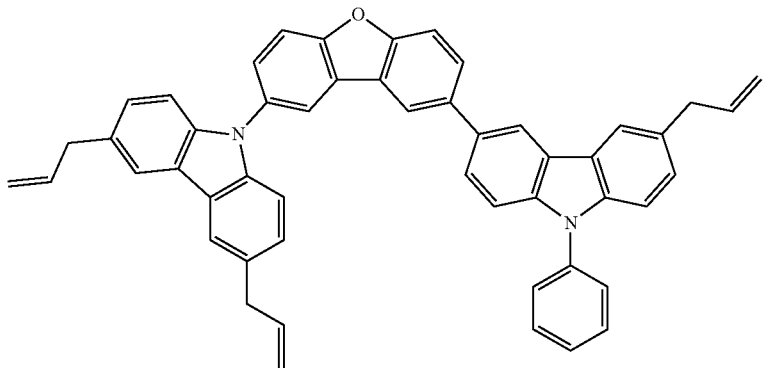
441 nm
H-82
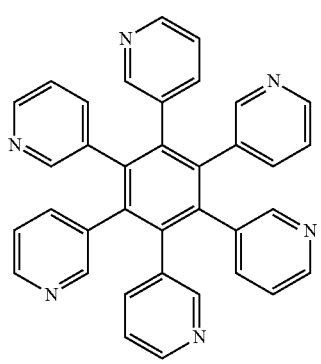
419 nm
H-83
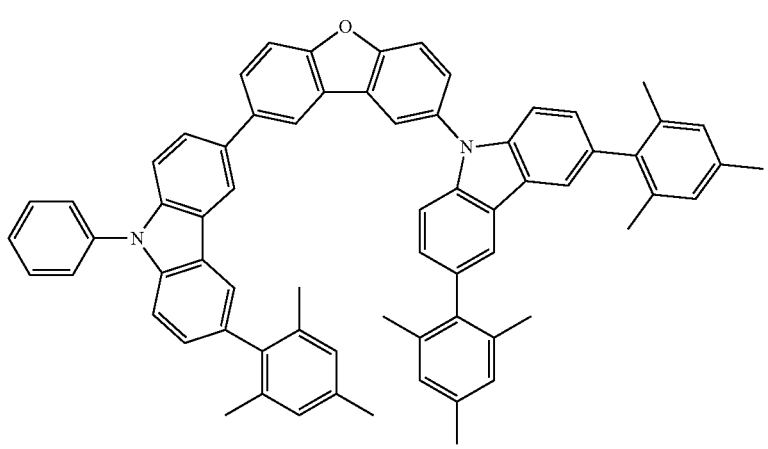
444 nm H-84
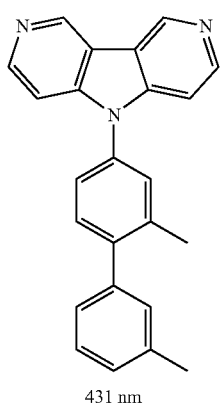
431 nm
H-85
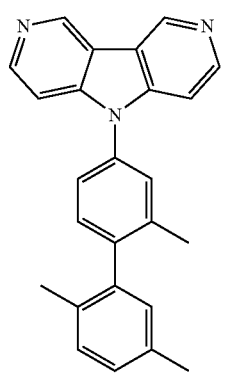
397 nm
H-86
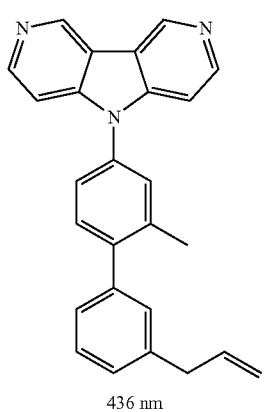
436 nm
[Chemical Formula 35]
H-87
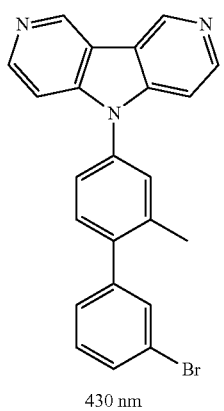
430 nm
H-88
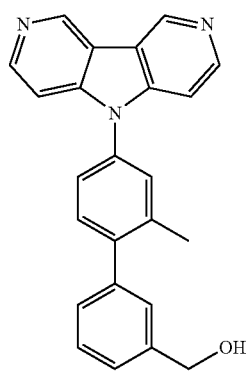
431 nm -continued
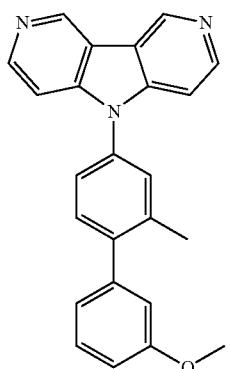
H-89
426 nm
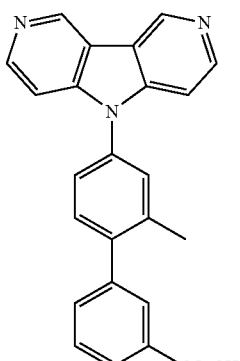
H-90
430 nm
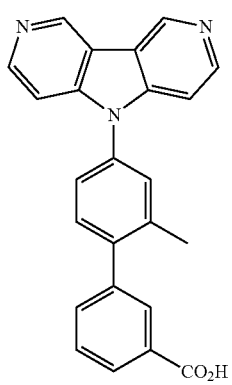
H-91
430 nm
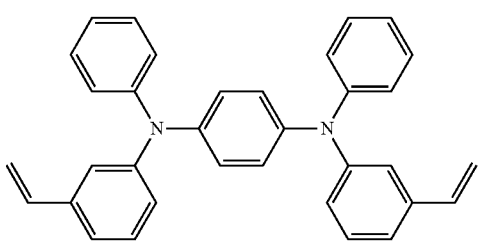
H-92
447 nm
H-93
398 nm
H-94
448 nm

[Chemical Formula 36]
H-95
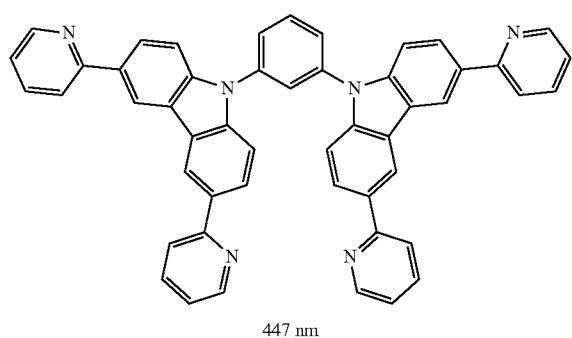
447 nm
H-96
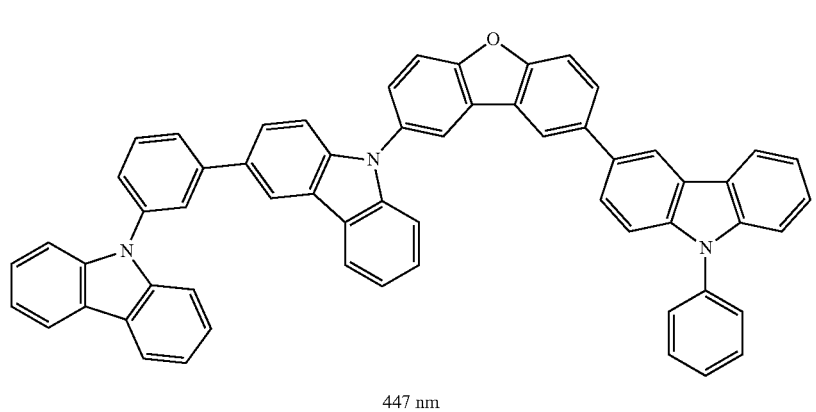
447 nm
H-97
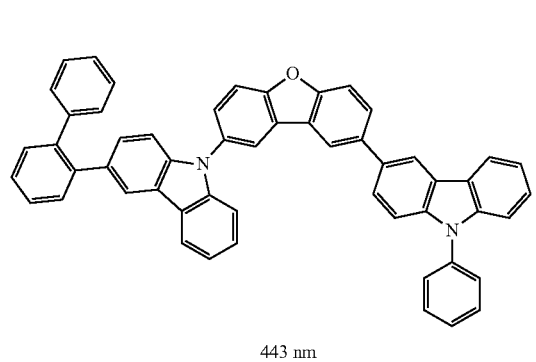
443 nm
H-98
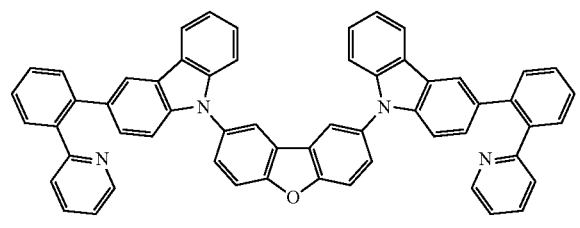
415 nm
[Chemical Formula 37]
H-99
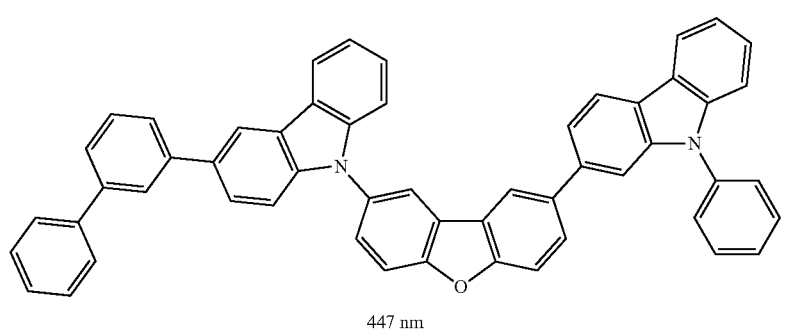
447 nm -continued
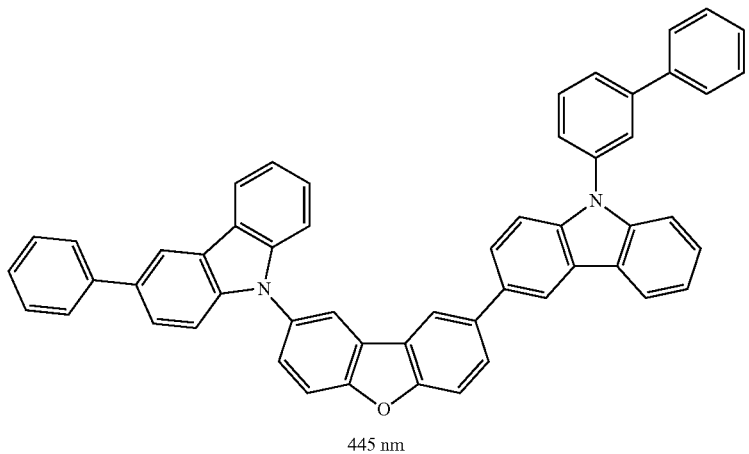
445 nm
H-100
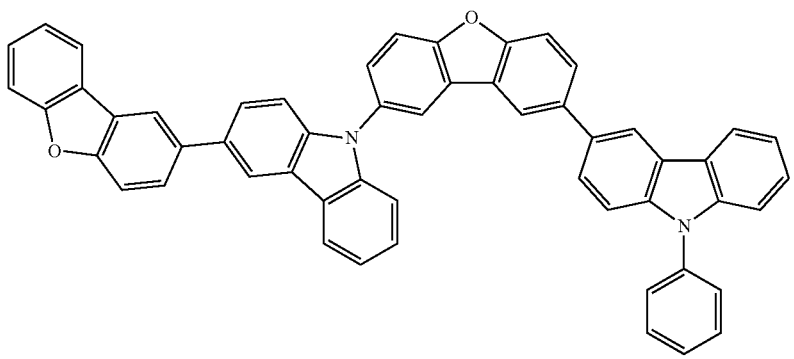
442 nm
H-101
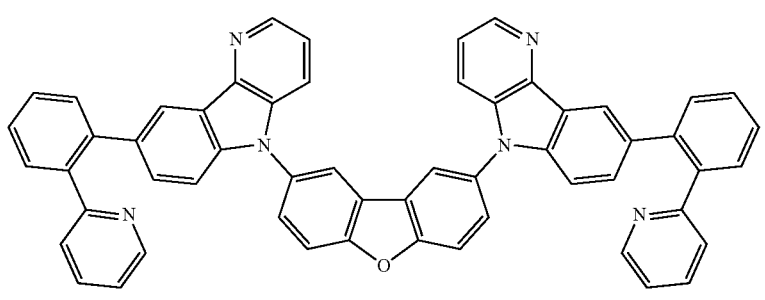
427 nm
H-102
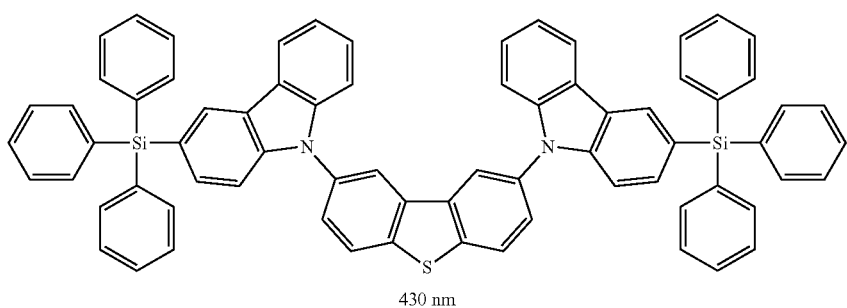
430 nm
H-103

[Chemical Formula 38]
H-104
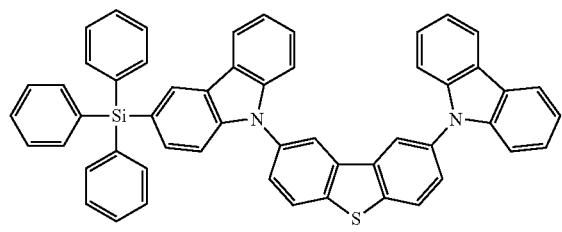
430 nm
H-105
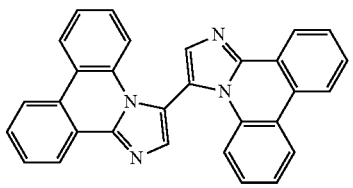
430 nm
H-106
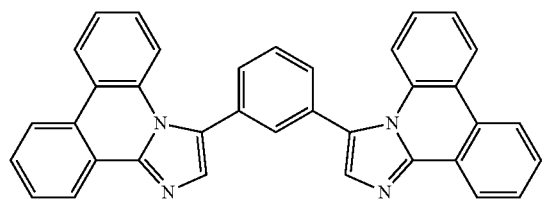
430 nm
H-107
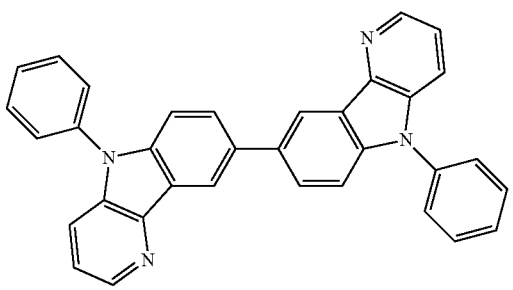
448 nm
H-108
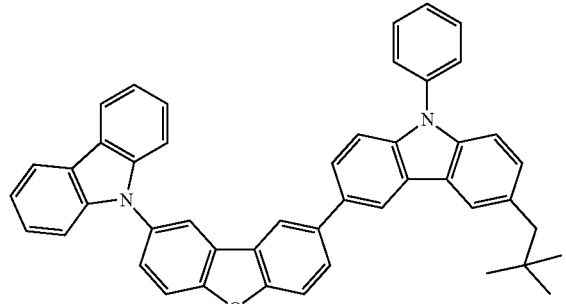
441 nm
H-109
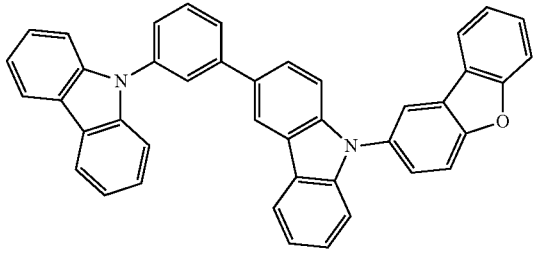
446 nm
H-110
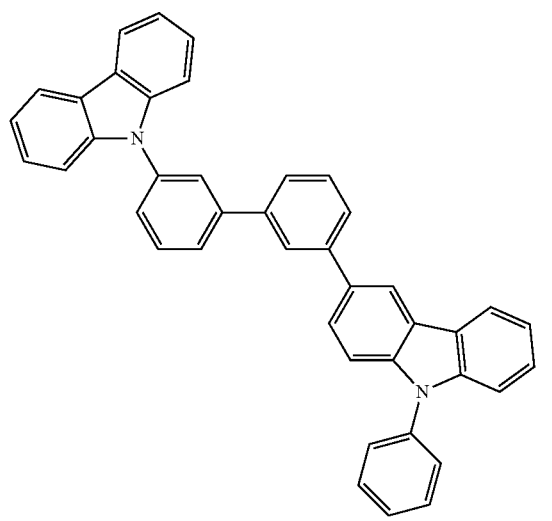
449 nm -continued
[Chemical Formula 39]
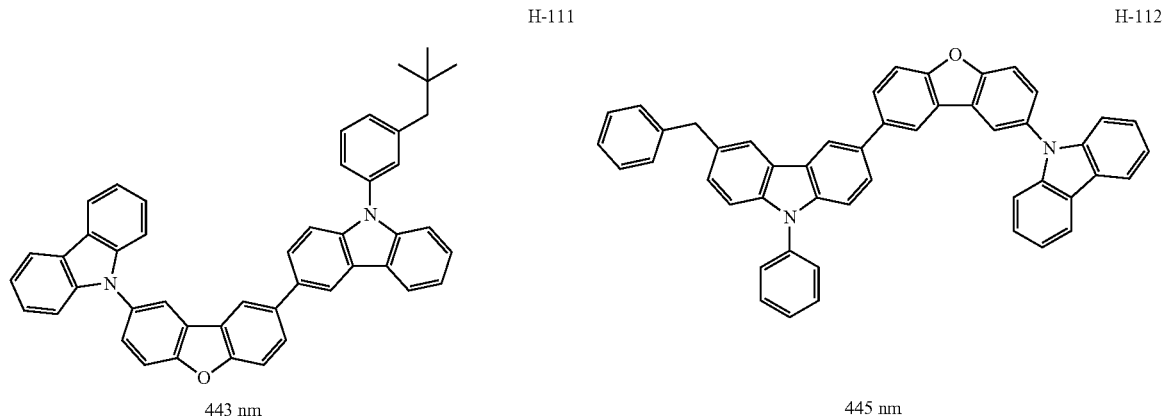
H-111
443 nm
H-112
445 nm
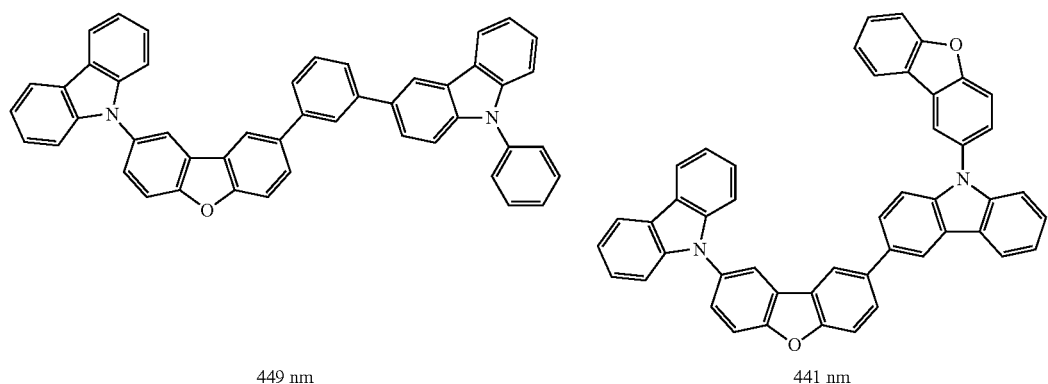
H-113
449 nm
H-114
441 nm
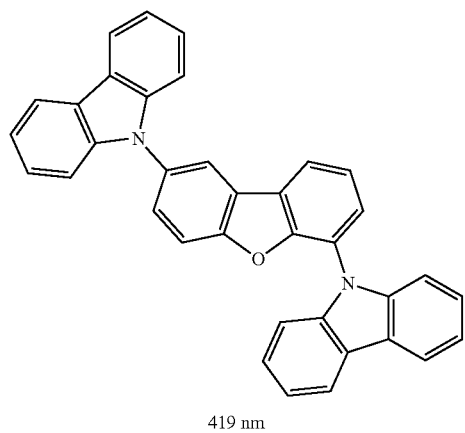
H-115
419 nm

[Chemical Formula 40]
H-116
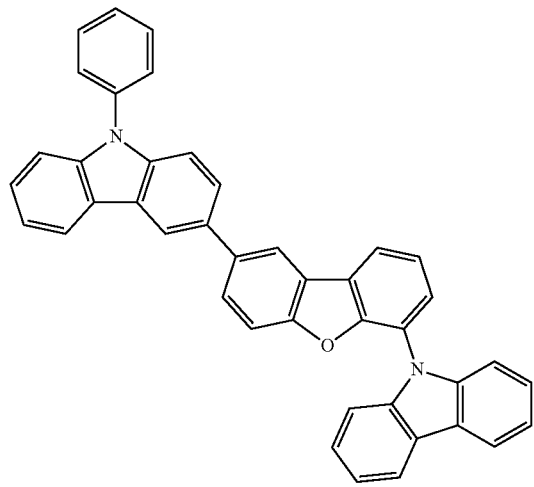
448 nm
H-117
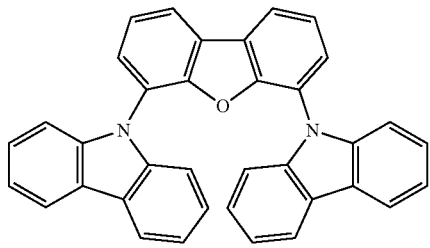
423 nm
H-118
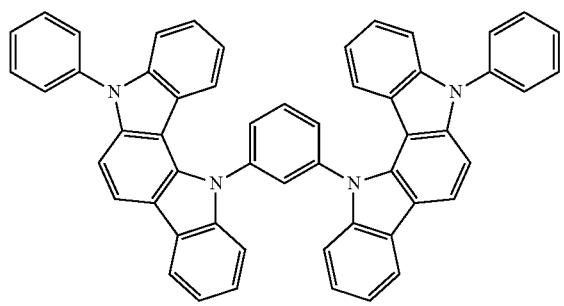
431 nm
H-119
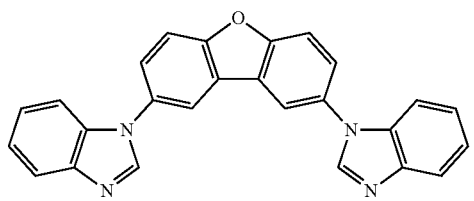
413 nm
H-120
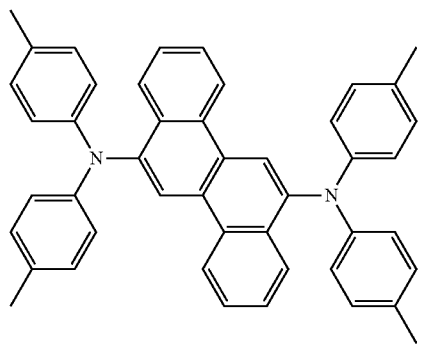
403 nm
H-121
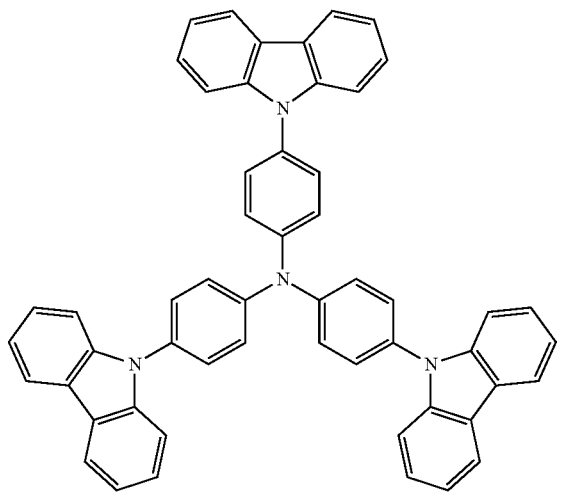
435 nm H-122
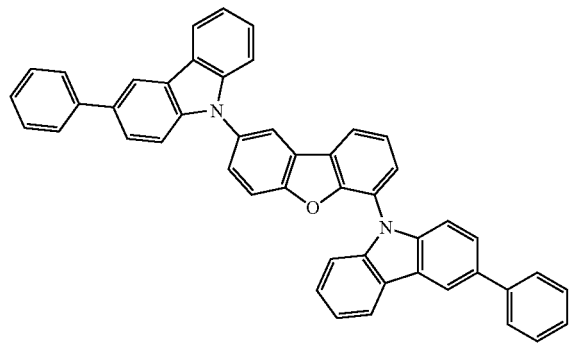
449 nm
[Chemical Formula 41]
H-123
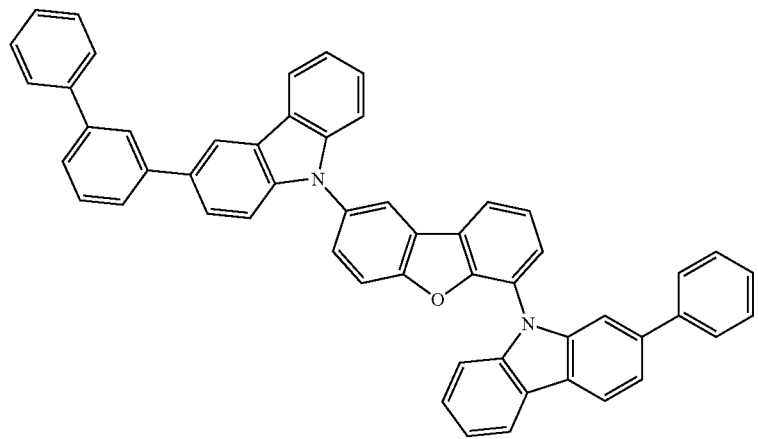
449nm
H-124
H-125
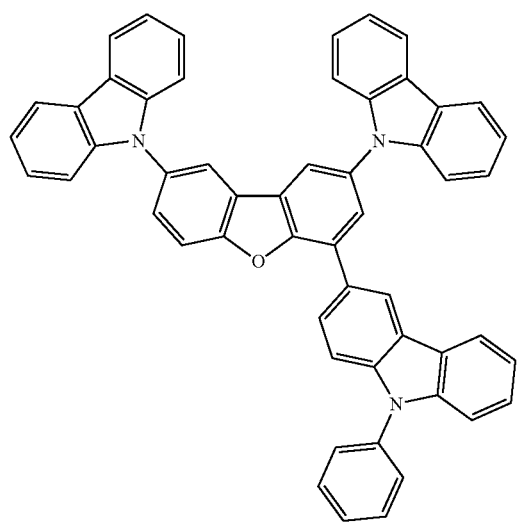
367nm
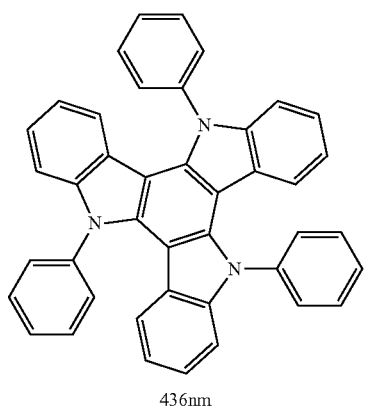
436nm -continued
H-126
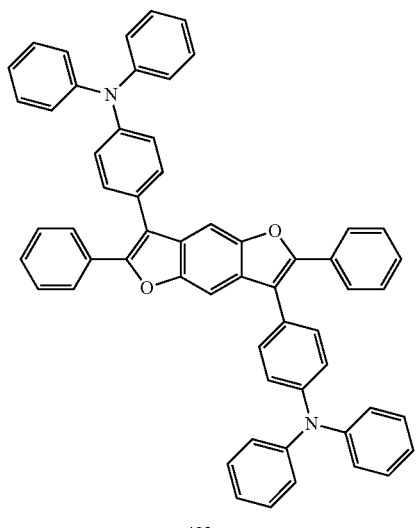
423nm
H-127
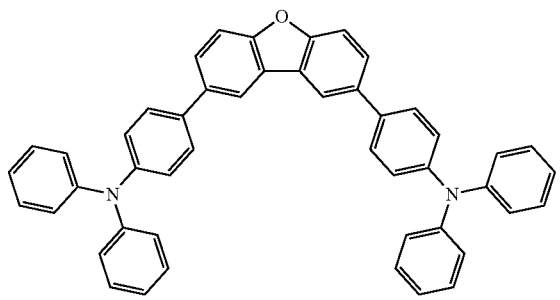
374nm
[Chemical Formula 42]
H-128
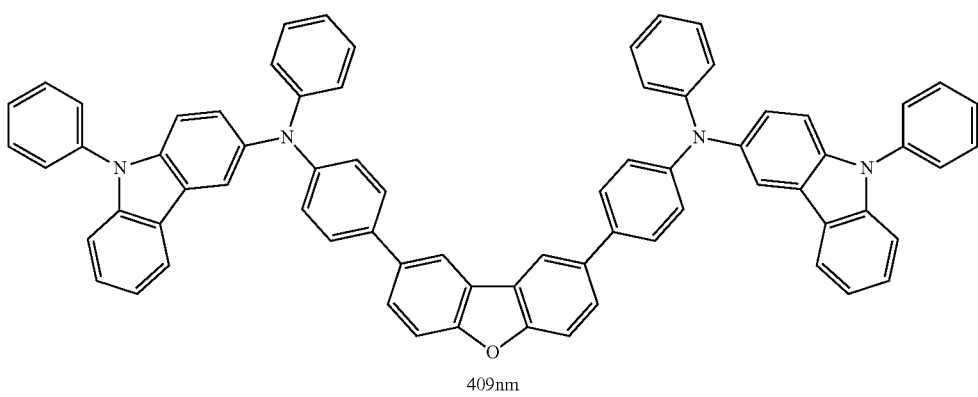
409nm

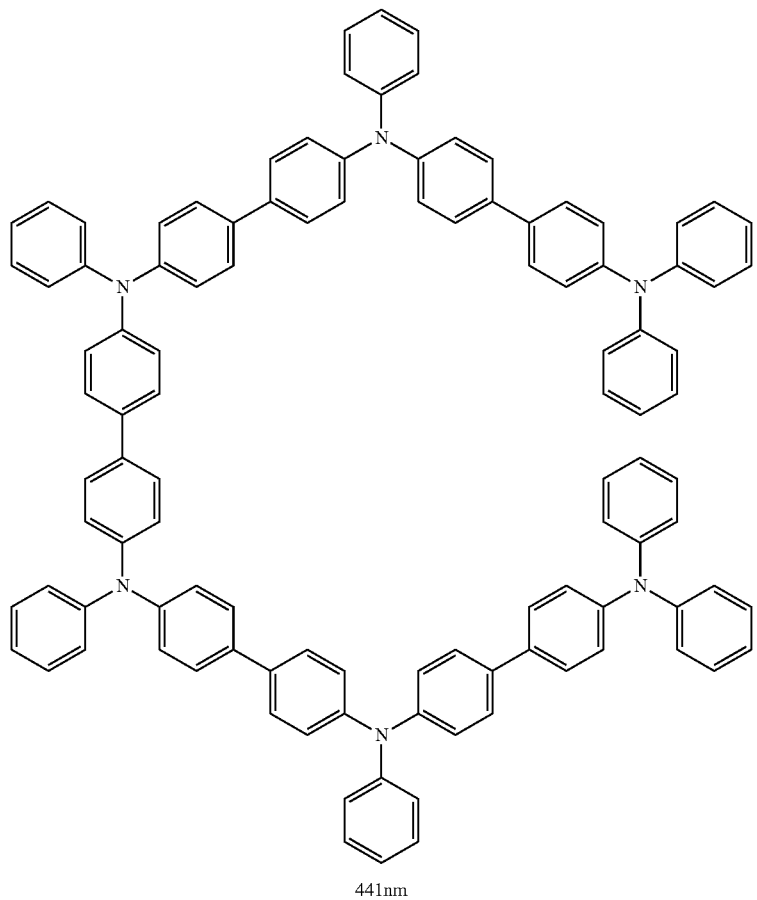
441nm
H-129
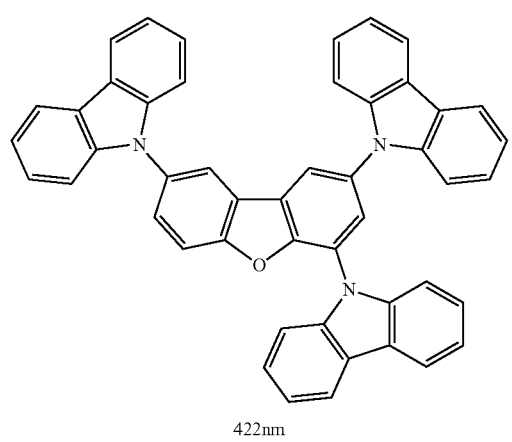
422nm
H-130
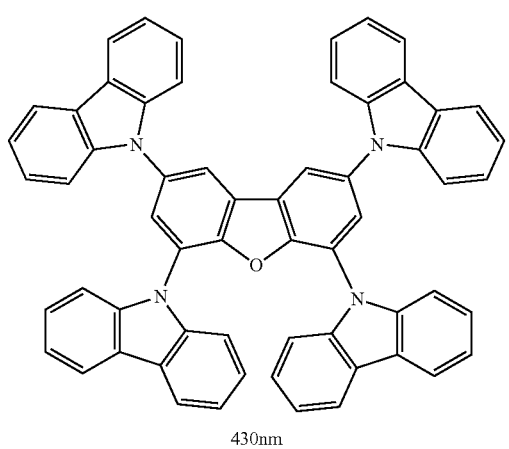
430nm
H-131

-continued
[Chemical Formula 43]
H-132
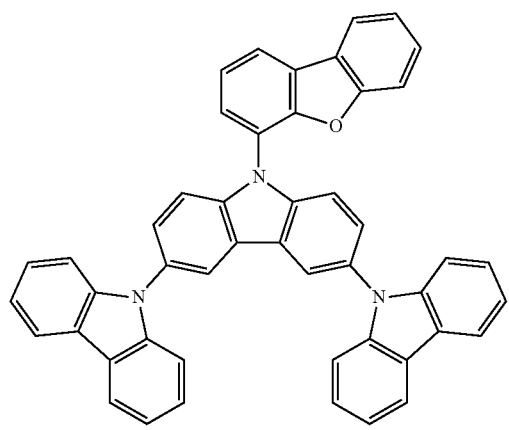
417nm
H-133
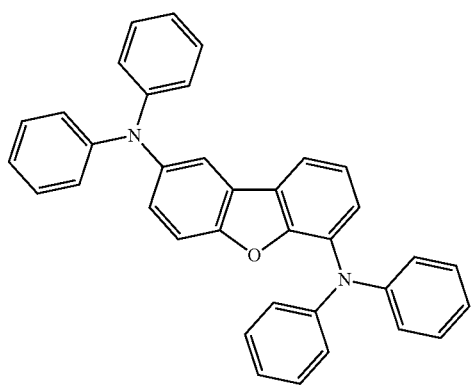
451nm
H-134
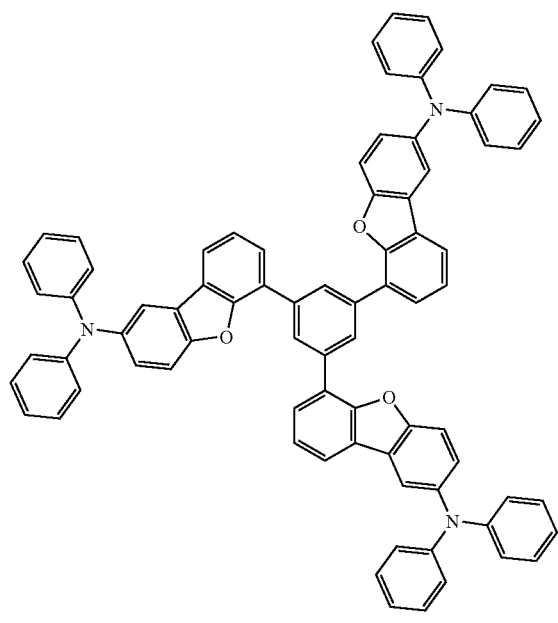
454nm
H-135
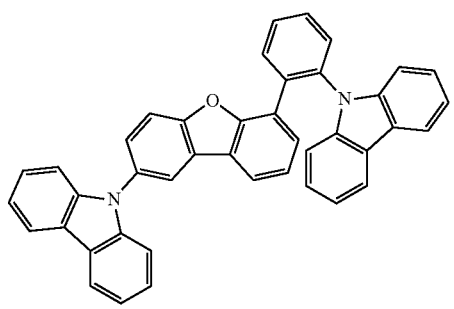
436nm
H-136
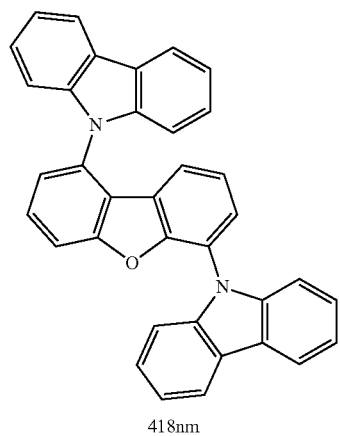
418nm
H-137
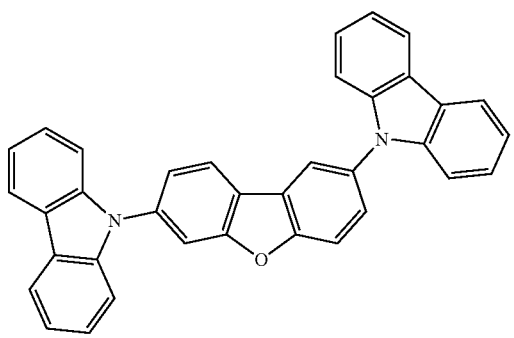
434nm

[Chemical Formula 44]
H-138
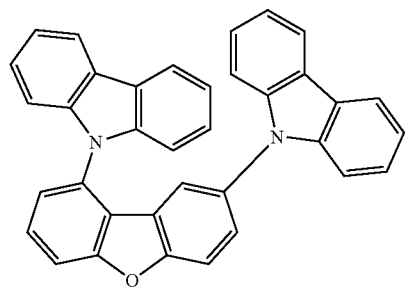
420nm
H-139
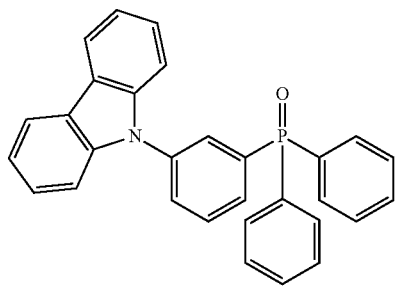
411nm
H-140
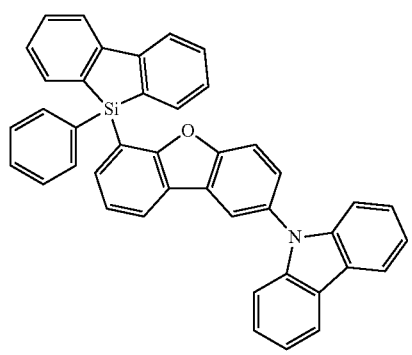
452nm
H-141
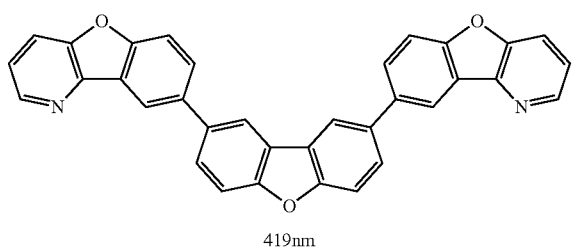
419nm
H-142
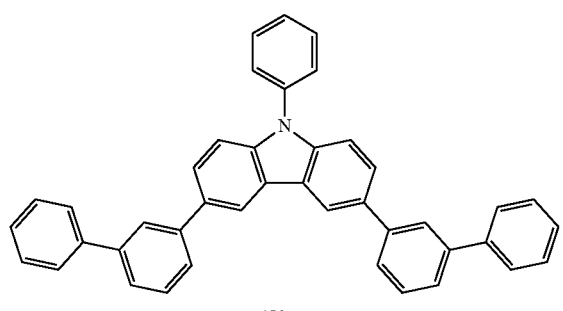
450nm
H-143
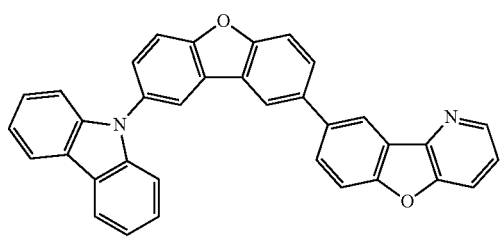
416nm
H-144
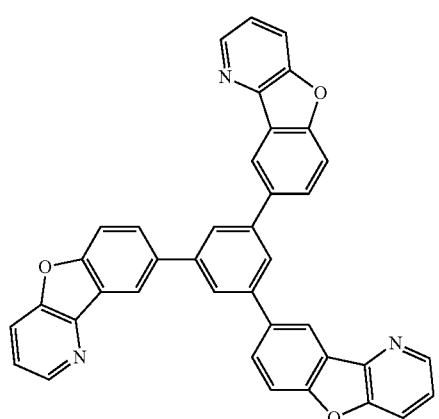
440nm
H-145
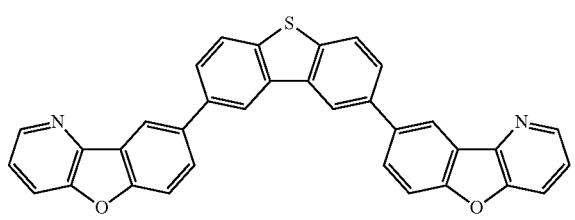
415nm

[Chemical Formula 45]
H-146
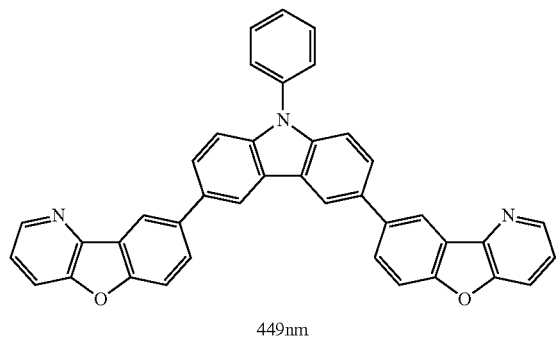
449nm
H-147
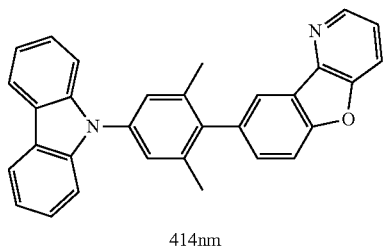
414nm
H-148
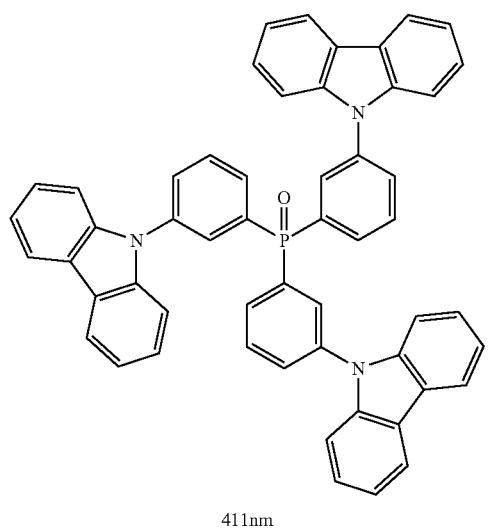
411nm
H-149
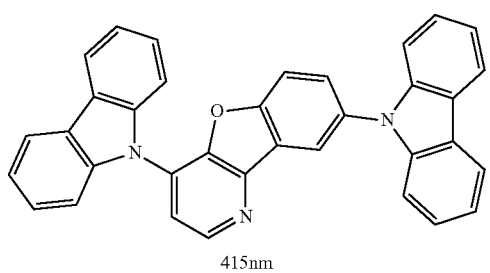
415nm
H-150
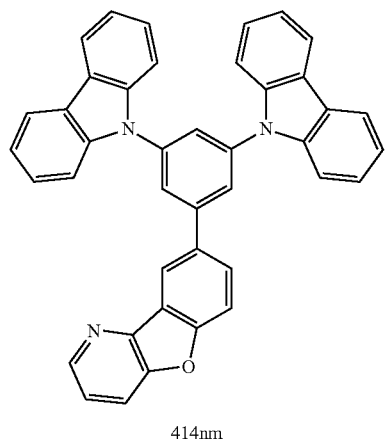
414nm
H-151
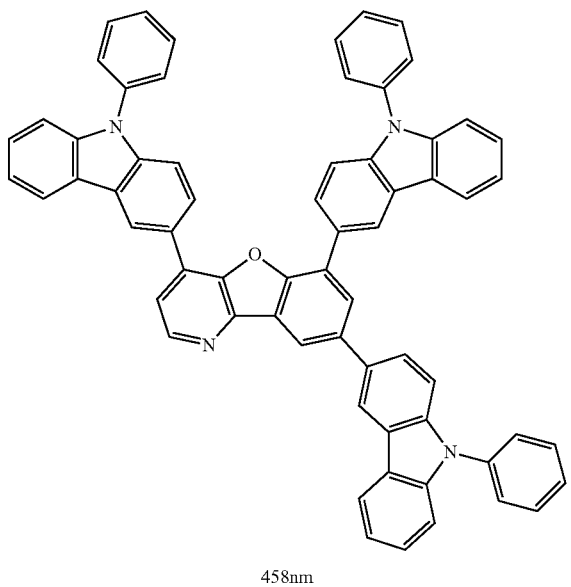
458nm -continued
H-152
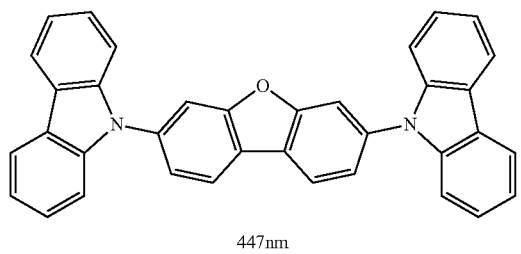
447nm
[Chemical Formula 46]
H-153
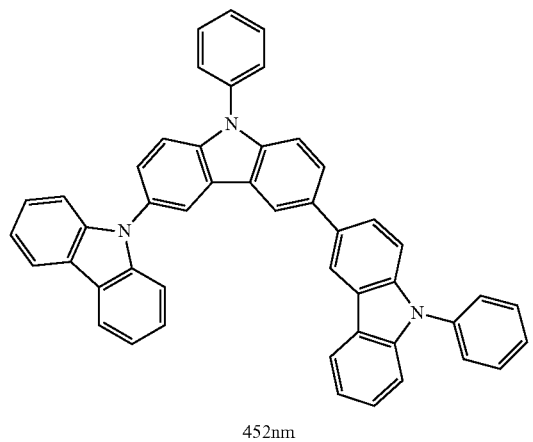
452nm
H-154
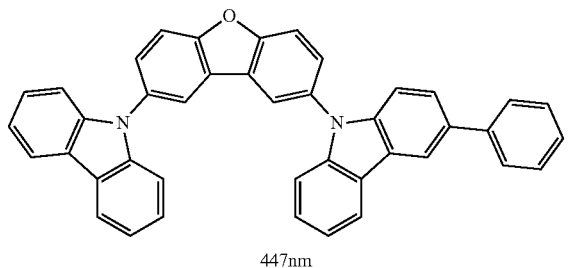
447nm
H-155
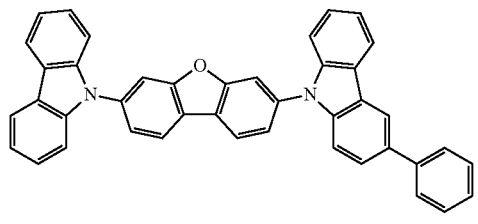
447nm
H-156
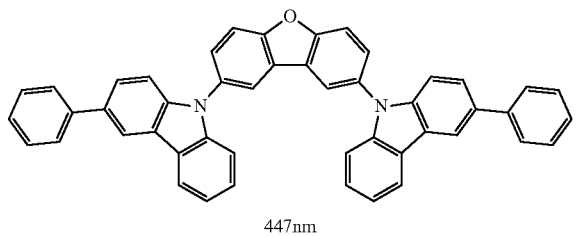
447nm
H-157
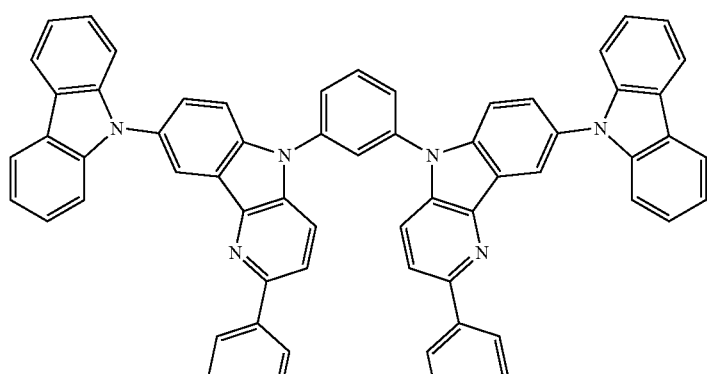
459nm

[Chemical Formula 47]
H-158
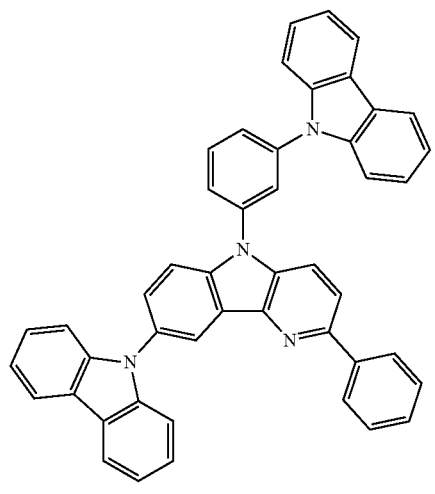
458nm
H-159
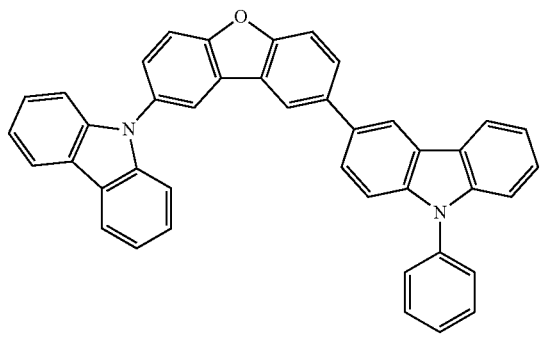
444nm
H-160
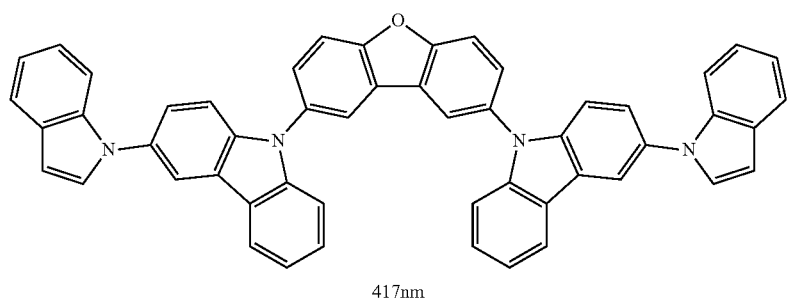
417nm
H-161
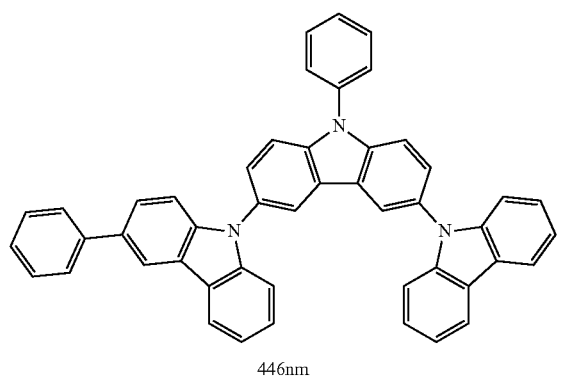
446nm
H-162
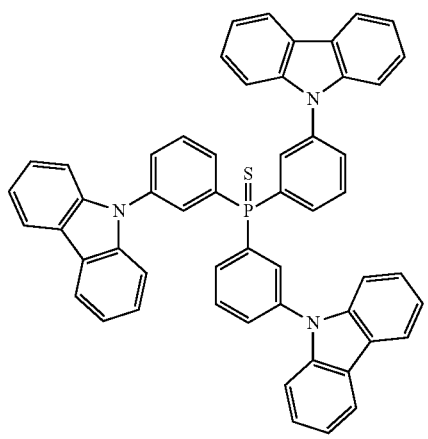
411nm -continued
H-163
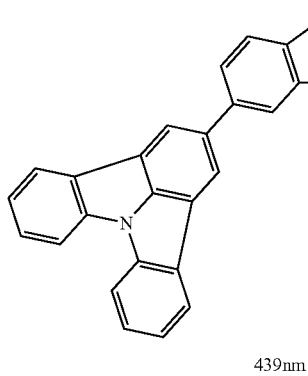
439nm
H-164
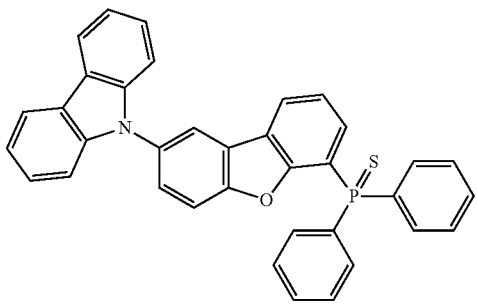
418nm
[Chemical Formula 48]
H-165
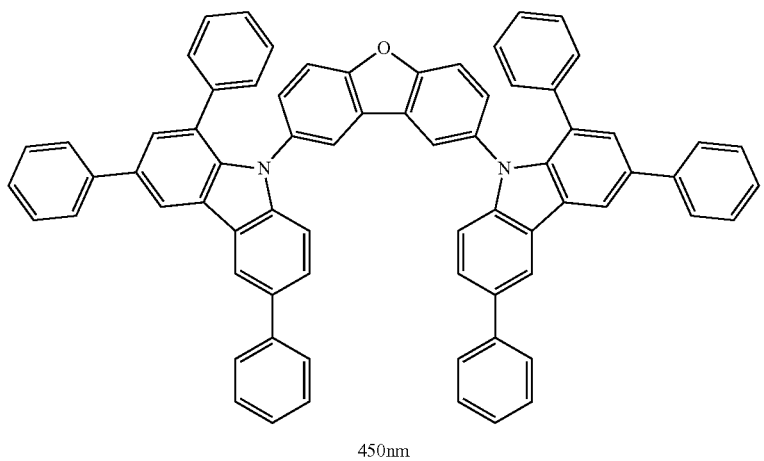
450nm
H-166
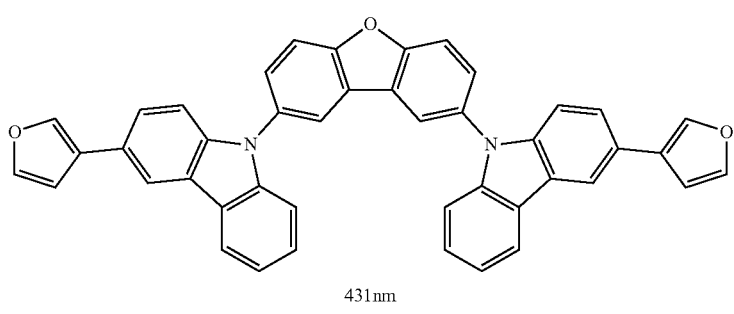
431nm H-167
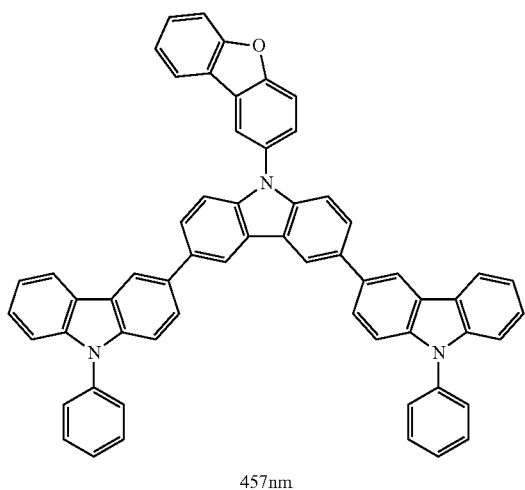
457nm
H-168
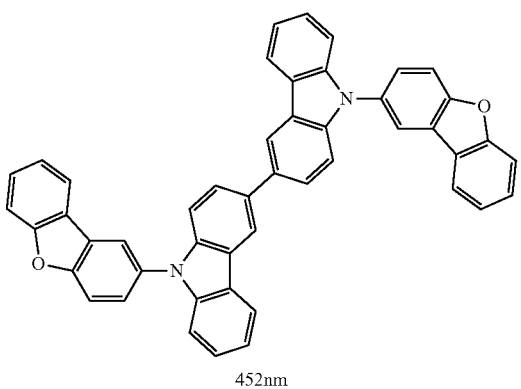
452nm
[Chemical Formula 49]
H-169 H-170
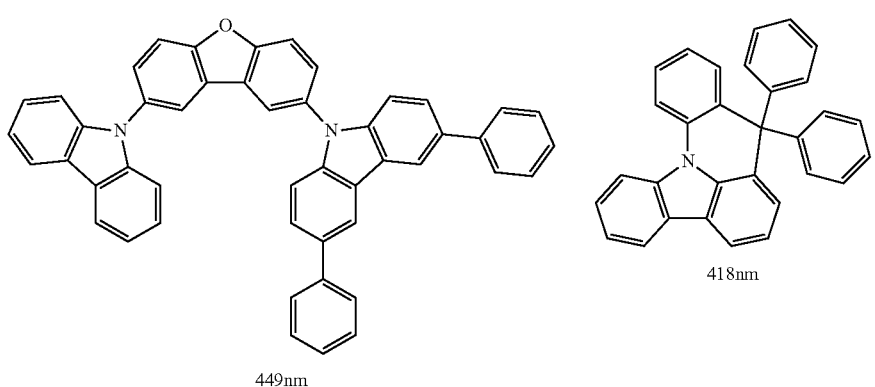
449nm          418nm
H-171
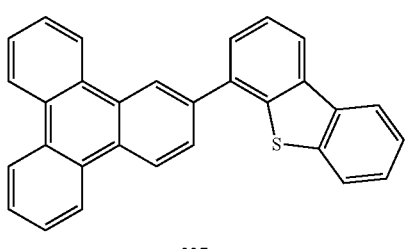
337nm
H-172
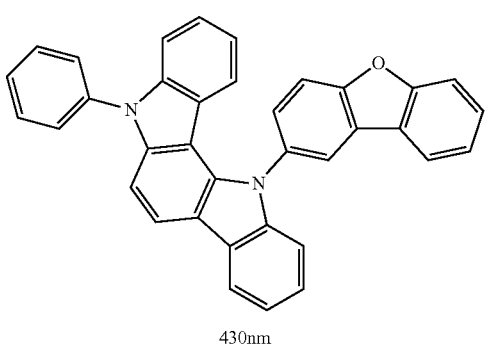
430nm -continued
H-173
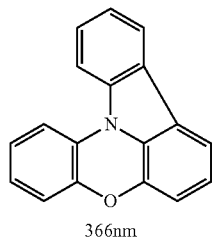
366nm
H-174
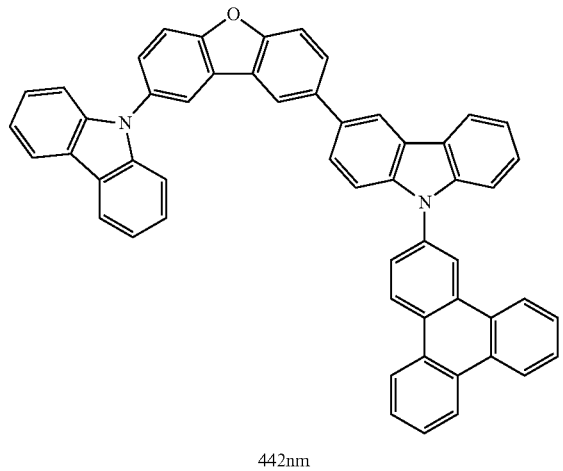
442nm
H-175
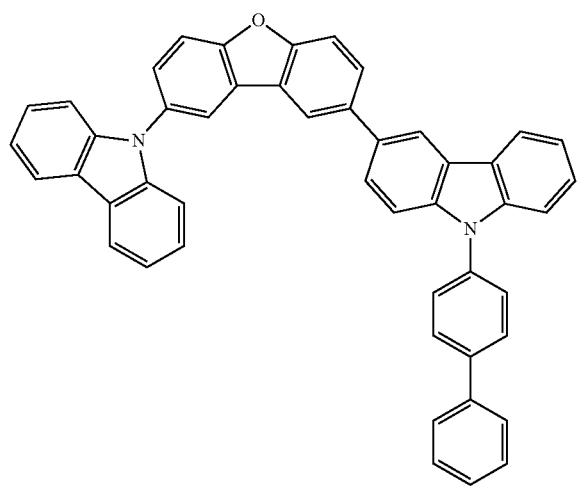
455nm
[Chemical Formula 50]
H-176
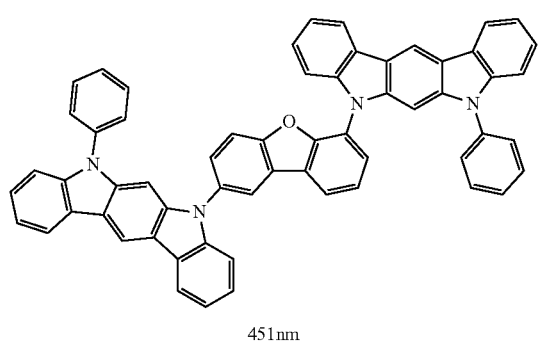
451nm
H-177
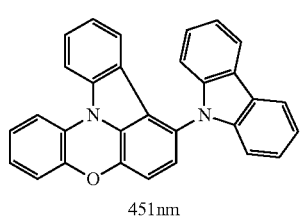
451nm -continued
H-178
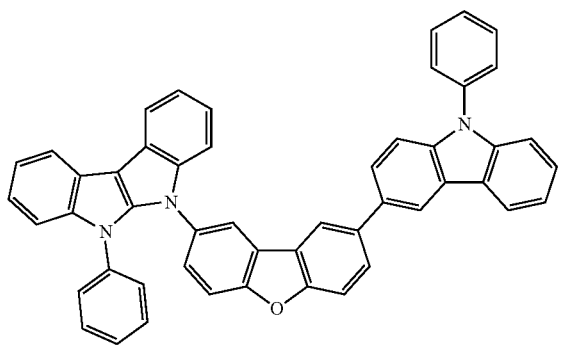
448nm
H-179
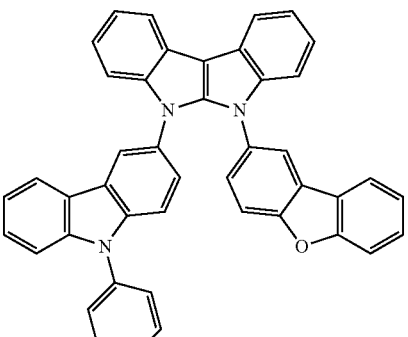
414nm
H-180
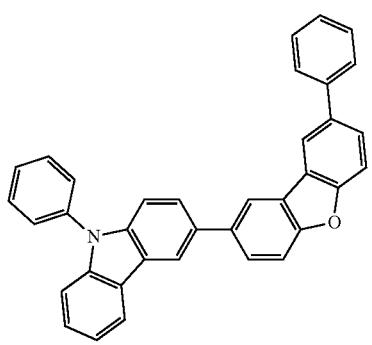
441nm
H-181
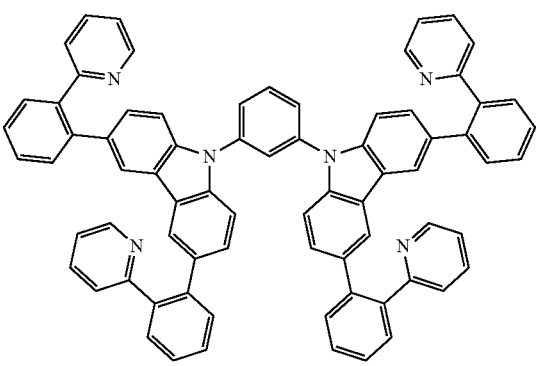
445nm
[Chemical Formula 51]
H-182
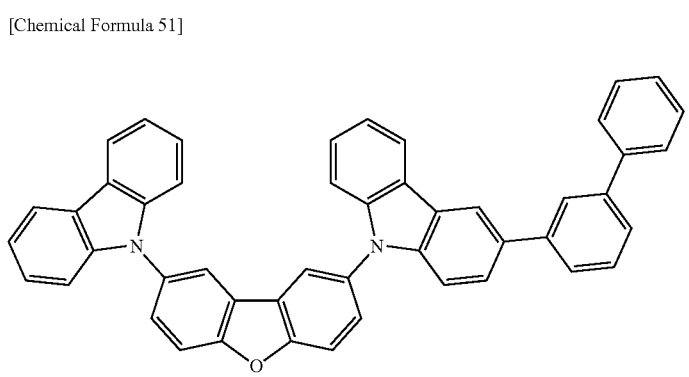
446nm
H-183
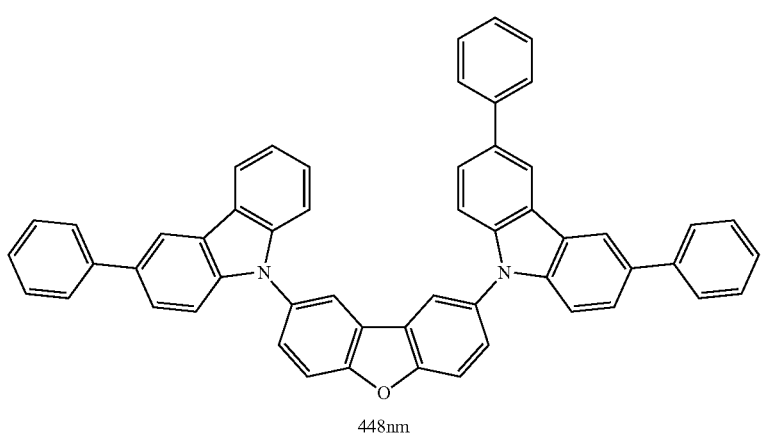
448nm -continued
H-184
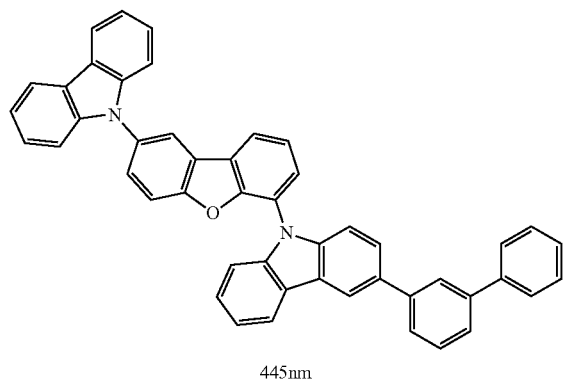
445nm
H-185
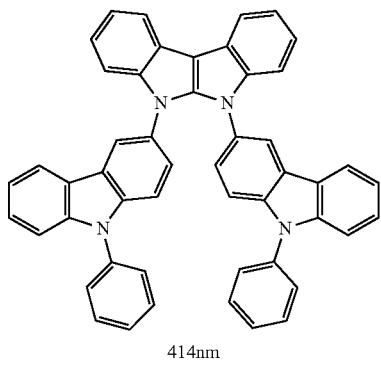
414nm
H-186
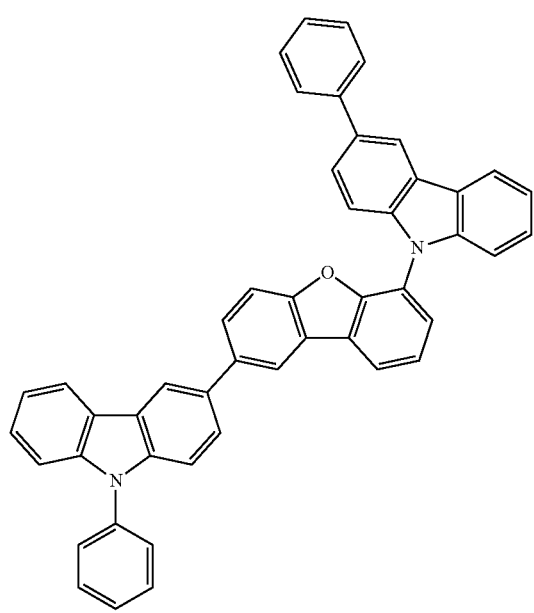
444nm
[Chemical Formula 52]
H-187
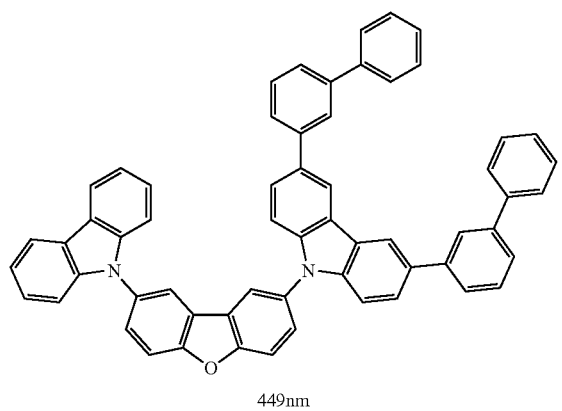
449nm
H-188
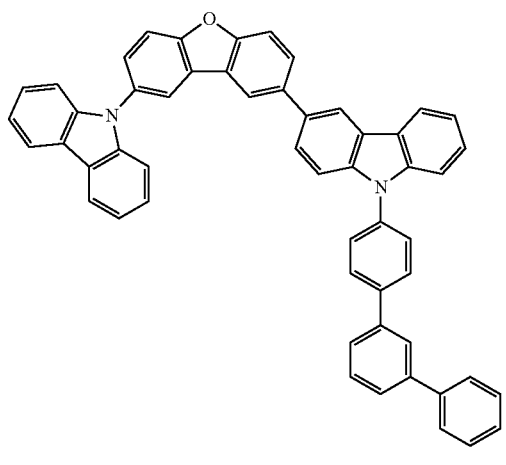
456nm -continued
H-189
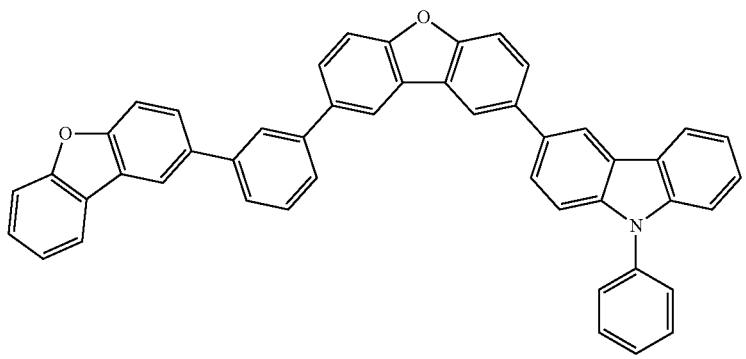
443nm
H-190
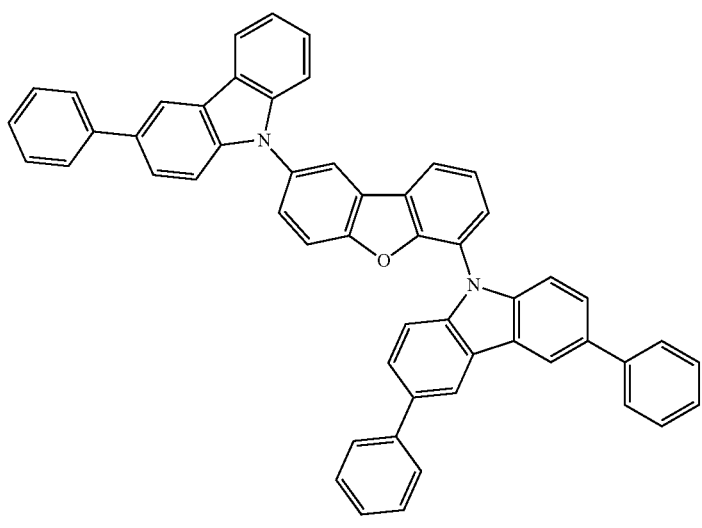
347nm
[Chemical Formula 53]
H-191
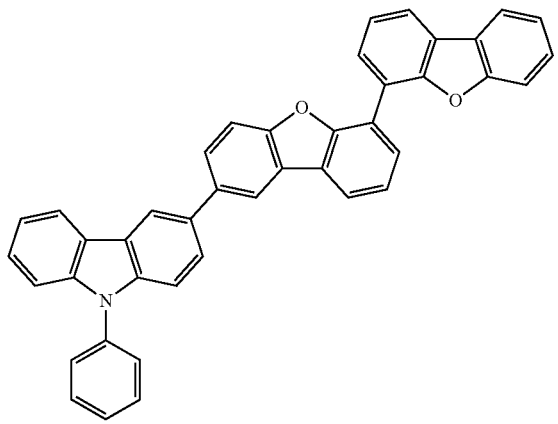
449nm
H-192
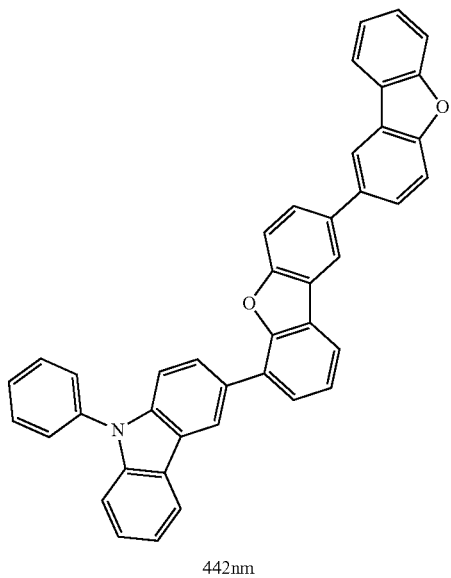
442nm -continued
H-193
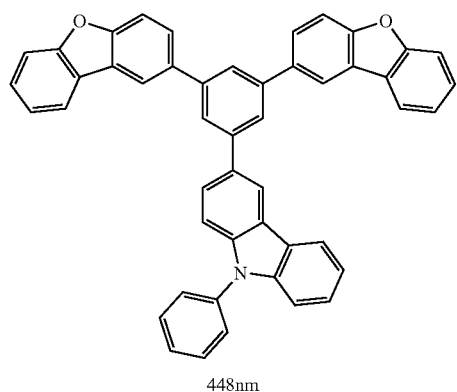
448nm
H-194
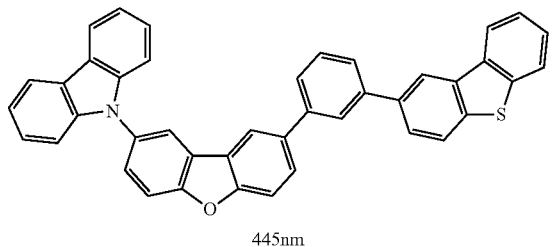
445nm
H-195
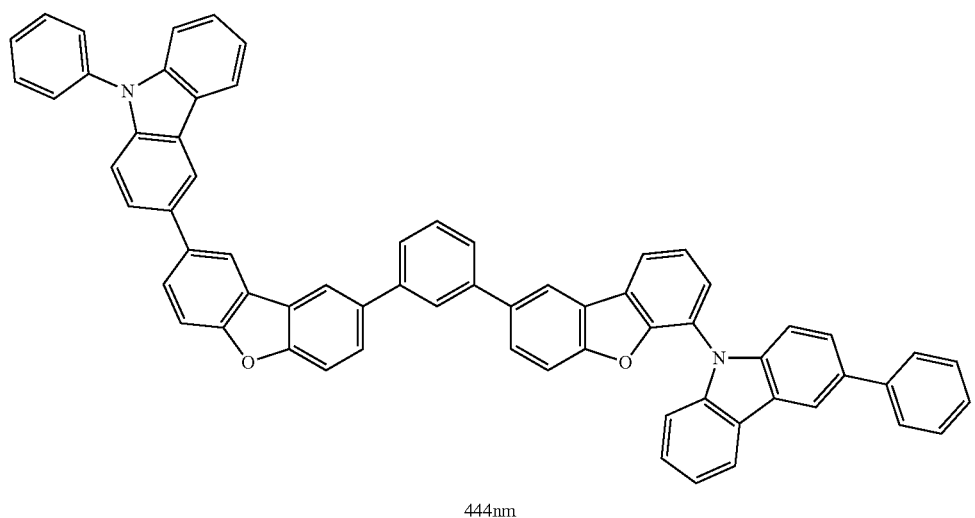
444nm
[Chemical Formula 54]
H-196
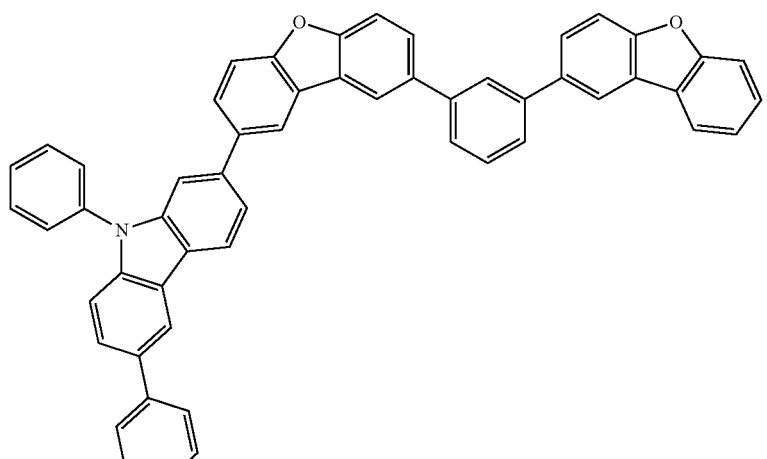
446nm -continued
H-197
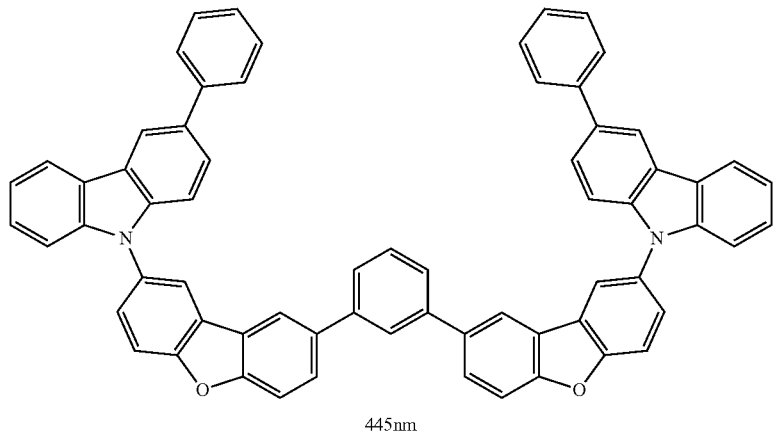
445nm
H-198
H-199
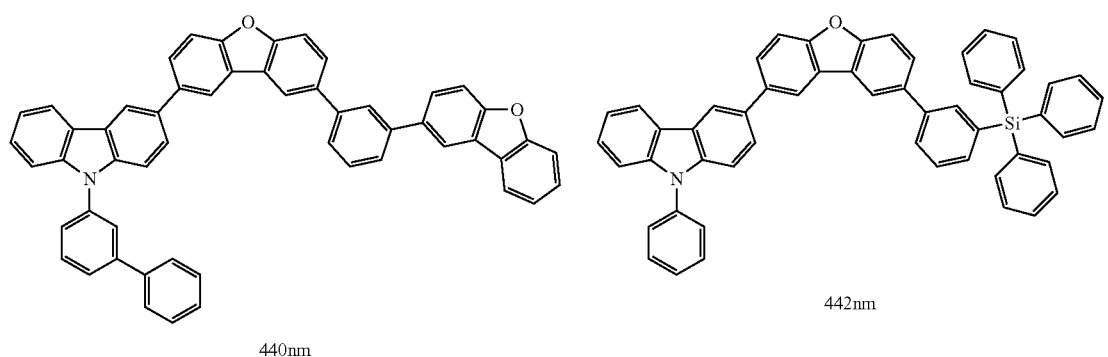
440nm
442nm
[Chemical Formula 55]
H-200
H-201
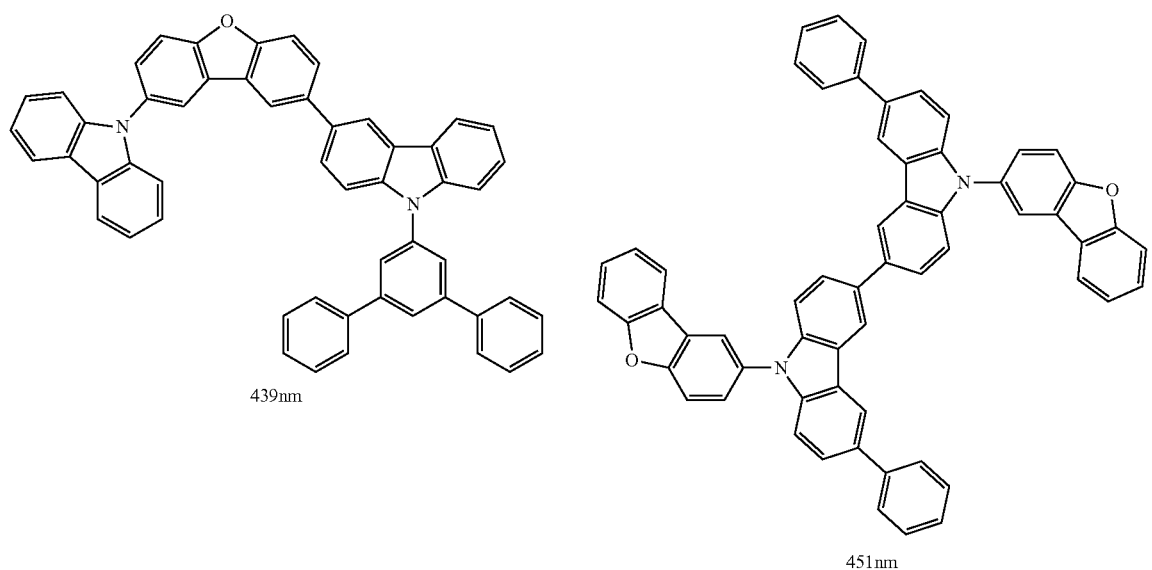
439nm
451nm

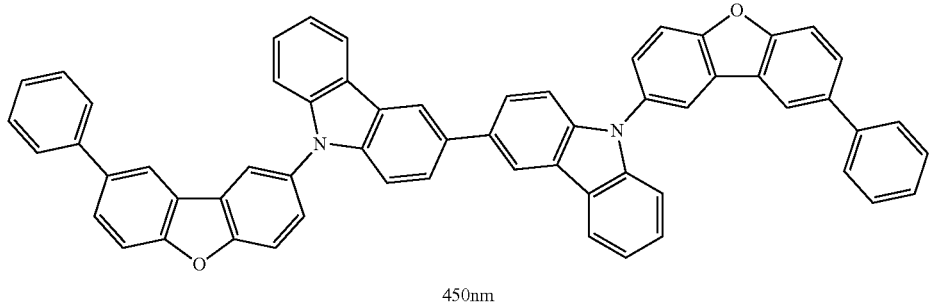
450nm
H-202
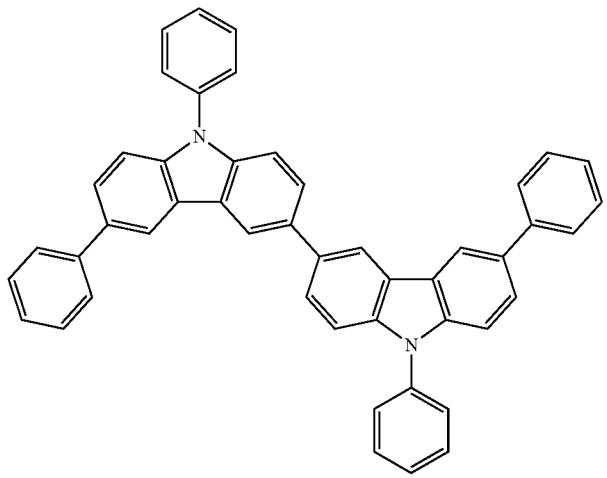
451nm
H-203
[Chemical Formula 56]
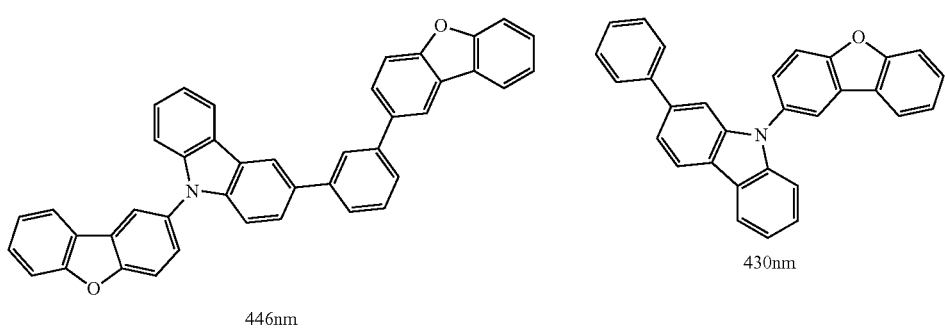
H-204   446nm
H-205   430nm -continued
H-206
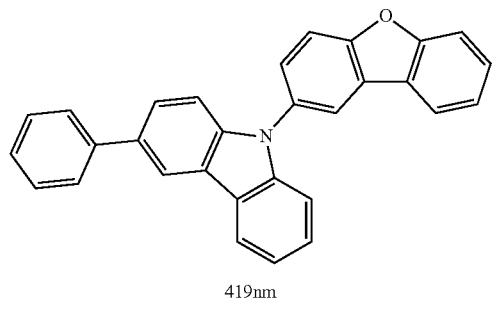
419nm
H-207
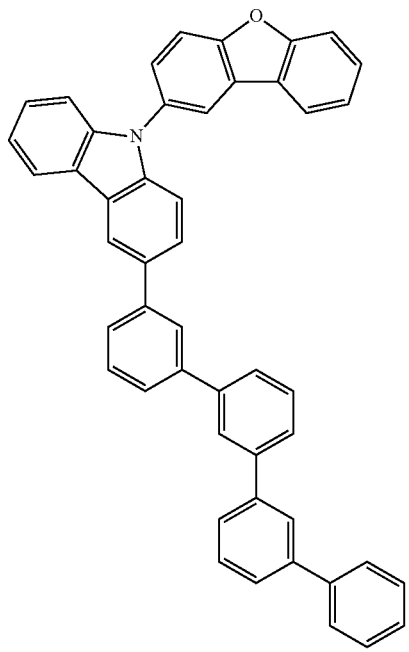
445nm
H-208
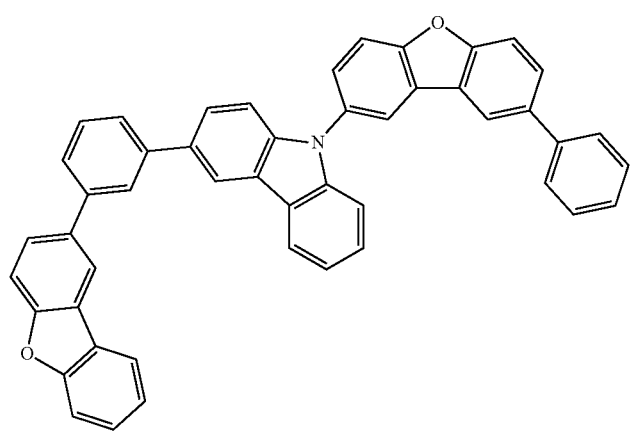
445nm
H-209
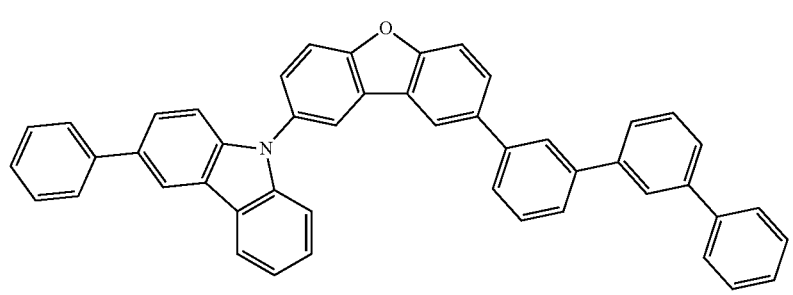
446nm

[Chemical Formula 57]

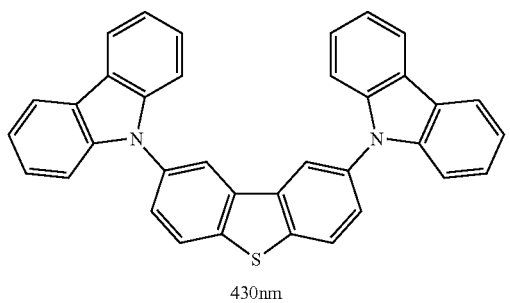

H-210
430nm

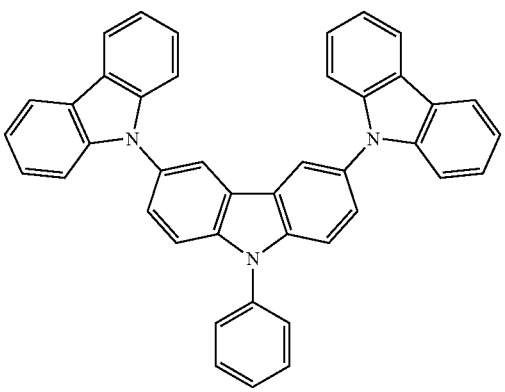

H-211
422nm

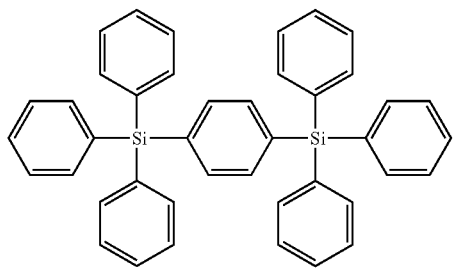

H-212
390nm

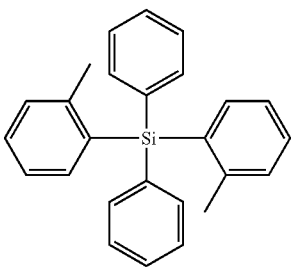

H-213
393nm

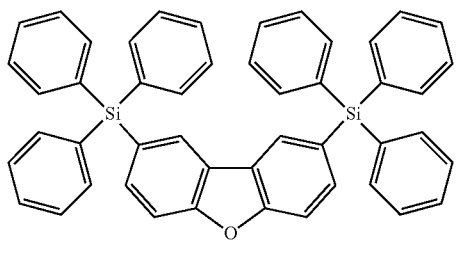

H-214
404nm (4.2) Light Emitting Material

As the light emitting material according to the present invention, a fluorescent compound and a phosphorescent light emitting material (also referred to as a phosphorescent light emitting compound, a phosphorescent light emitting compound) can be generally used.

In the present invention, a phosphorescent light emitting compound is preferably used together, whereby it is possible to obtain an organic EL element having a high color temperature and also high color rendering properties. This is because light emission by a quantum dot has narrow spectrum width, and thus it is unlikely to obtain a white light emission of a broad spectrum having high color rendering properties. As described above, blue light emission with short wave from a quantum dot and a relatively broad light emission from the phosphorescent light emitting material are combined, whereby it is possible to obtain a white light having a high color temperature and also high color rendering properties.

In the present invention, the phosphorescent light emitting compound refers to a compound in which light emission from excited triplet is observed, and specifically a compound that is phosphorescent at room temperature (25° C.). And, the phosphorescent light emitting compound is defined as a compound with a phosphorescence quantum yield at 25° C. of 0.01 or more, and the preferred phosphorescence quantum yield is 0.1 or more.

The phosphorescence quantum yield can be measured by the method described at page 398 of Bunko II of Dai 4-han Jikken Kagaku Kouza 7 (Spectrum II of the fourth edition of Experimental Chemistry Course 7) (1992-edition, Maruzen Publishing Co., Ltd.,). The phosphorescence quantum yield in a solution can be measured using various solvents, and in the case of using a phosphorescent light emitting material in the present invention, it is acceptable if the above phosphorescence quantum yield (0.01 or more) can be achieved in any one of the solvents.

Two kinds of principles regarding emission of a phosphorescent light emitting material are cited. One is an energy transport-type, wherein carriers recombine on a host compound on which the carriers are transported to produce an excited state of the host compound, and then via transfer of this energy to a phosphorescent light emitting material, emission from the phosphorescent light emitting material is realized. The other is a carrier trap-type, wherein a phosphorescent light emitting material serves as a carrier trap and then carriers recombine on the phosphorescent light emitting material to generate emission from the phosphorescent light emitting material. In each case, the excited state energy of the phosphorescent light emitting material is required to be lower than that of the host compound.

The phosphorescent light emitting material can be suitably selected from known materials for use in the light emitting layer of the organic EL element and used, and is preferably a complex compound containing a group 8 to 10 metal of the element periodic table, and further preferably an iridium compound, an osmium compound or a platinum compound (platinum complex compound), a rare earth complex, and among them, most preferably an iridium compound.

In addition, as the phosphorescent light emitting dopant according to the present invention, a phosphorescent light emitting dopant in which the light emitting wavelength assigned to the 0-0 transition band in a phosphorescence spectrum is in the range of 460 to 827 nm (2.7 to 1.5 eV) is preferable.

By the combination of the spectrum of the phosphorescent light emitting dopant having a light emitting wavelength in the above range and the quantum dot compound that emits at 414 to 477 nm according to the present invention, it is possible to obtain a white lighting having high color rendering properties.

Among them, it is preferred to contain a phosphorescent light emitting dopant having a light emitting maximum wavelength at least in the wavelength ranges of 520 to 560 nm and 600 to 640 nm, and it is further preferred to also contain a phosphorescent light emitting dopant having a light emitting maximum wavelength in the wavelength range of 460 to 490 nm.

The light emitting wavelength assigned to the 0-0 transition band of the phosphorescent light emitting dopant according to the present invention can be obtained by the same method as used in the measurement of the light emitting wavelength assigned to the 0-0 transition band of the host compound.

As the phosphorescent light emitting compound having a light emitting maximum wavelength in the wavelength range of 460 to 490 nm, a phosphorescent light emitting dopant represented by the following general formula (3) is preferable.

[Chemical Formula 58]

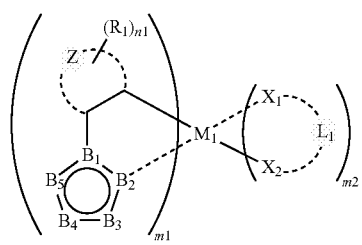

general formula(3)

wherein $R_1$ represents a substituent, Z represents a nonmetal atomic group necessary to form a 5 to 7-membered ring, n1 represents an integer of 0 to 5, $B_1$ to $B_5$ represent a carbon atom, a nitrogen atom, an oxygen atom or a sulfur atom, and at least one represents a nitrogen atom, $M_1$ represents a group 8 to 10 metal in the element periodic table, $X_1$ and $X_2$ represent a carbon atom, a nitrogen atom or an oxygen atom, $L_1$ represents anatomic group forming a bidentate ligand together with $X_1$ and $X_2$, and m1 represents an integer of 1, 2 or 3, m2 represents an integer of 0, 1 or 2, and m1+m2 represents 2 or 3.

The phosphorescent light emitting compound represented by the general formula (3) according to the present invention has a HOMO of −5.15 to −3.50 eV and a LUMO of −1.25 to +1.00 eV, and preferably has a HOMO of −4.80 to −3.50 eV and a LUMO of −0.80 to +1.00 eV.

Examples of the substituent represented by $R_1$ in the phosphorescent light emitting compound represented by the general formula (3) include alkyl groups (for example, a methyl group, an ethyl group, a propyl group, an isopropyl group, a tert-butyl group, apentyl group, a hexyl group, an octyl group, a dodecyl group, a tridecyl group, a tetradecyl group, a pentadecyl group, and the like), cycloalkyl groups (a cyclopentyl group, a cyclohexyl group, and the like), alkenyl groups (for example, a vinyl group, an allyl group, and the like), alkynyl groups (for example, an ethynyl group, a propargyl group, and the like), aromatic hydrocarbon cyclic groups (for example, also referred to as aromatic carbocyclic groups, an aryl group, and the like, for example, a phenyl group, a p-chlorophenyl group, amesityl group, a tolyl group, a xylyl group, a naphthyl group, an anthoryl group, an azulenyl group, an acenaphthenyl group, a fluorenyl group, a phenanthryl group, an indenyl group, a pyrenyl group, a biphenylyl group, and the like), aromatic heterocyclic groups (for example, a pyridyl group, a pyrimidyl group, a furyl group, a pyrrolyl group, an imidazolyl group, a benzimidazolyl group, a pyrazolyl group, a pyrazinyl group, triazolyl groups (for example, a 1,2,4-triazol-1-yl group, a 1,2,3-triazol-1-yl group, and the like), an oxazolyl group, a benzoxazolyl group, a thiazolyl group, an isooxazolyl group, an isothiazolyl group, a furazanyl group, a thienyl group, a quinolyl group, a benzofuryl group, a dibenzofulyl group, a benzothienyl group, a dibenzothienyl group, an indolyl group, a carbazolyl group, a carbolinyl group, a diazacarbazolyl group (a group in which one of the carbon atoms constituting a carboline ring of the carbolinyl group is replaced with a nitrogen atom), a quinoxalinyl group, a pyridazinyl group, a triazynyl group, a quinazolinyl group, a phthalazinyl group, and the like), heterocyclic groups (for example, a pyrrolidyl group, an imidazolidyl group, a morpholyl group, an oxazolidyl group, and the like), alkoxy groups (for example, a methoxy group, an ethoxy group, a propyloxy group, a pentyloxy group, a hexyloxy group, an octyloxy group, a dodecyloxy group, and the like) cycloalkoxy groups (for example, a cyclopentyloxy group, a cyclohexyloxy group, and the like), aryloxy groups (for example, a phenoxy group, a naphthyloxy group, and the like), alkylthio groups (for example, a methylthio group, an ethylthio group, a propylthio group, a pentylthio group, a hexylthio group, an octylthio group, a dodecylthio group, and the like), cycloalkylthio groups (for example, a cyclopentylthio group, a cyclohexylthio group, and the like), arylthio groups (for example, a phenylthio group, a naphthylthio group, and the like), alkoxycarbonyl groups (for example, a methyloxycarbonyl group, an ethyloxycarbonyl group, a butyloxycarbonyl group, an octyloxycarbonyl group, a dodecyloxycarbonyl group, and the like), aryloxycarbonyl groups (for example, a phenyloxycarbonyl group, a naphthyloxycarbonyl group, and the like), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, and the like), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, and the like), acyloxy groups (for example, an acetyloxy group, an ethylcarbonyloxy group, a butylcarbonyloxy group, an octylcarbonyloxy group, a dodecylcarbonyloxy group, a phenylcarbonyloxy group, and the like), amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, and the like), carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, and the like), ureido groups (for example, a methylureido group, an ethylureido group, a pentylureido group, cyclohexylureido group, an octylureido group, a dodecylureido group, a phenylureido group, a naphthylureido group, a 2-pyridylaminoureido group, and the like), sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, and the like), alkylsulfonyl groups (for example, a methylsulfonyl group, an ethylsulfonyl group, a butylsulfonyl group, a cyclohexylsulfonyl group, a 2-ethylhexylsulfonyl group, a dodecylsulfonyl group, and the like), arylsulfonyl groups or heteroarylsulfonyl groups (for example, a phenylsulfonyl group, a naphthylsulfonyl group, a 2-pyridylsulfonyl group, and the like), amino groups (for example, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, and the like), cyano groups, nitro groups, hydroxy groups, mercapto groups, silyl groups (for example, a trimethylsilyl group, a triisopropylsilyl group, a triphenylsilyl group, a phenyldiethylsilyl group, and the like) and the like. Among these substituents, alkyl groups or aryl groups are preferable.

Z represents a non-metal atomic group necessary to form a 5 to 7-membered ring. Examples of the 5 to 7-membered ring formed by Z includes a benzene ring, a naphthalene ring, a pyridine ring, a pyrimidine ring, a pyrrole ring, a thiophene ring, a pyrazole ring, an imidazole ring, an oxazole ring, a thiazole ring, and the like. Among them, a benzene ring is preferable.

$B_1$ to $B_5$ represent a carbon atom, a nitrogen atom, an oxygen atom or a sulfur atom, and at least one represents a nitrogen atom. The aromatic nitrogen-containing heterocyclic ring formed by these five atoms is preferably a monocycle. Examples include a pyrrole ring, a pyrazole ring, an imidazole ring, a triazole ring, a tetrazole ring, an oxazole ring, an isoxazole ring, a thiazole ring, an isothiazole ring, an oxadiazole ring, a thiadiazole ring, and the like. Among them, a pyrazole ring and an imidazole ring are preferable, and an imidazole ring in which $B_2$ and $B_5$ are a nitrogen atom is particularly preferable. These rings may be further substituted by the above substituent. Those preferred as a substituent are alkyl groups and aryl groups, and further preferred are aryl groups.

$L_1$ represents an atomic group forming a bidentate ligand together with $X_1$ and $X_2$. Specific examples of the bidentate ligand represented by $X_1$-$L_1$-$X_2$ include substituted or unsubstituted phenylpyridine, phenylpyrazole, phenylimidazole, phenyltriazole, phenyltetrazole, pyrazabole, picolinic acid, acetylacetone, and the like. These groups may be further substituted by the above substituent.

m1 represents an integer of 1, 2 or 3, m2 represents an integer of 0, 1 or 2, and m1+m2 represents 2 or 3. Among them, m2 is preferably 0. As a metal represented by $M_1$, a group 8 to 10 transition metal elements (also simply referred to as transition metal) of the element periodic table are used, among them, iridium and platinum are preferable, and iridium is further preferable.

Hereinbelow, specific compounds (D-1 to D-93) of the phosphorescent light emitting compound represented by the general formula (3) are exemplified, and among those exemplified, a phosphorescent light emitting compound in which the light emitting wavelength assigned to the 0-0 transition band in a phosphorescence spectrum is in the range of 460 to 827 nm (2.7 to 1.5 eV) is more preferable.

[Chemical Formula 59]

D-1

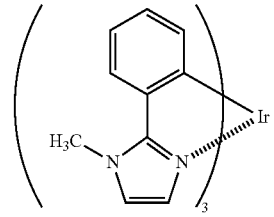

D-2

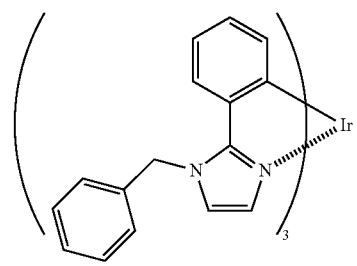

D-3

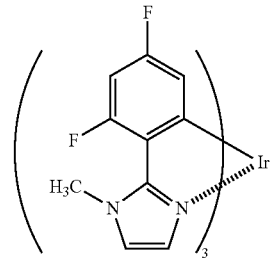

-continued
D-4
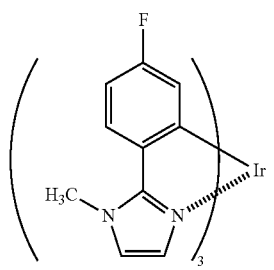
D-5
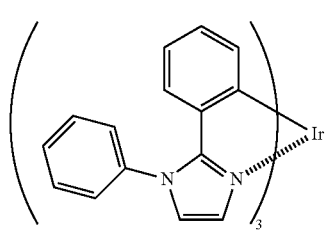
D-6
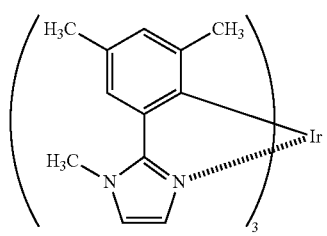
D-7
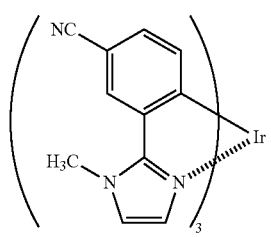
D-8
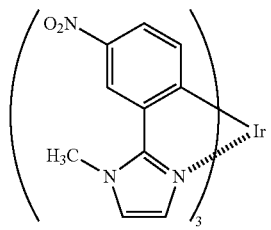
D-9
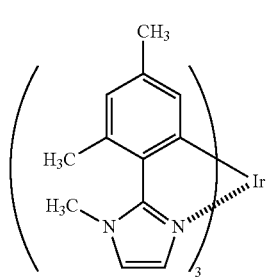
-continued
D-10
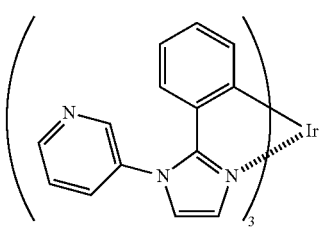
D-11
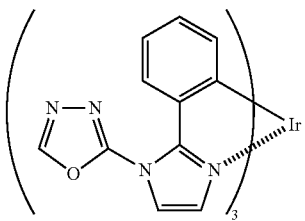
D-12
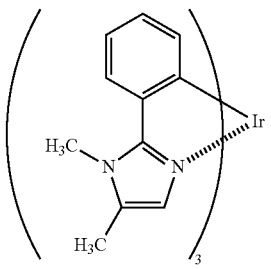
D-13
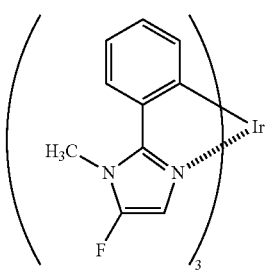
D-14
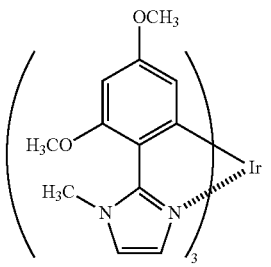
D-15
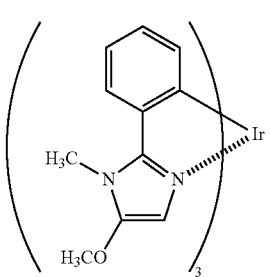

[Chemical Formula 60]
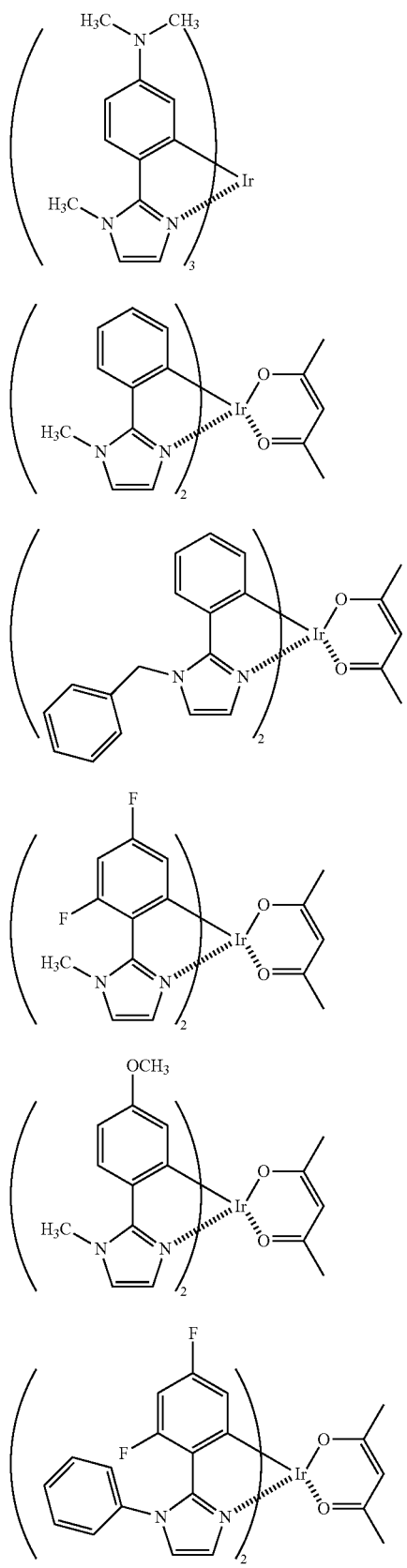
D-16
D-17
D-18
D-19
D-20
D-21
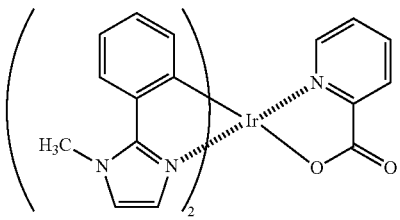
D-22
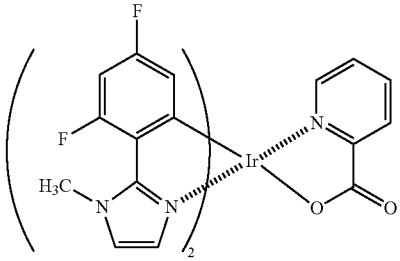
D-23
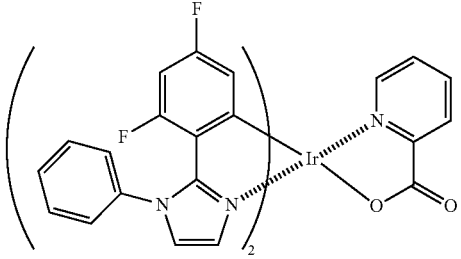
D-24
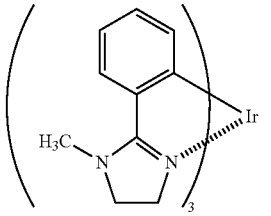
D-25
[Chemical Formula 61]
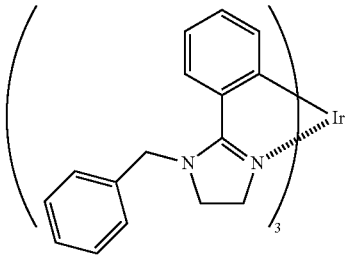
D-26
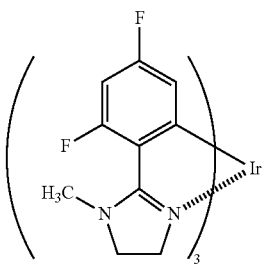
D-27

D-28 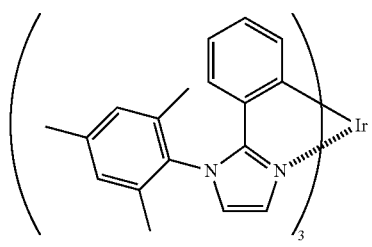
D-29 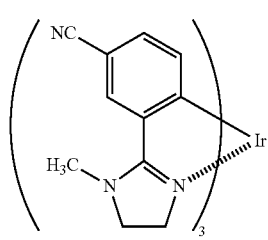
D-30 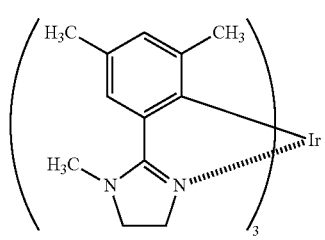
D-31 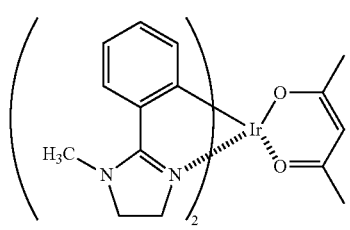
D-32 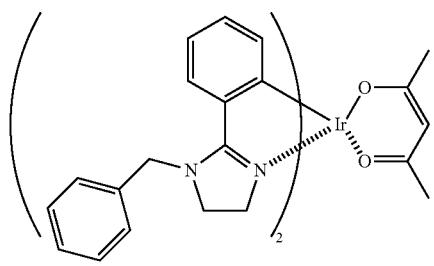
D-33 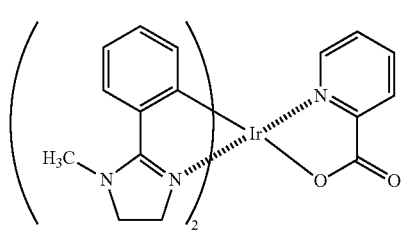
D-34 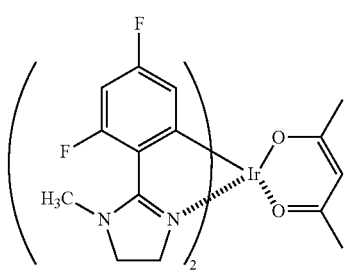
D-35 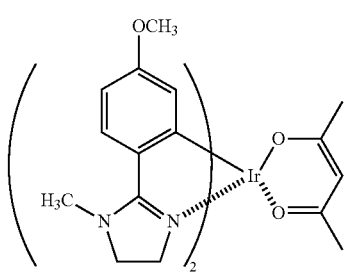
D-36 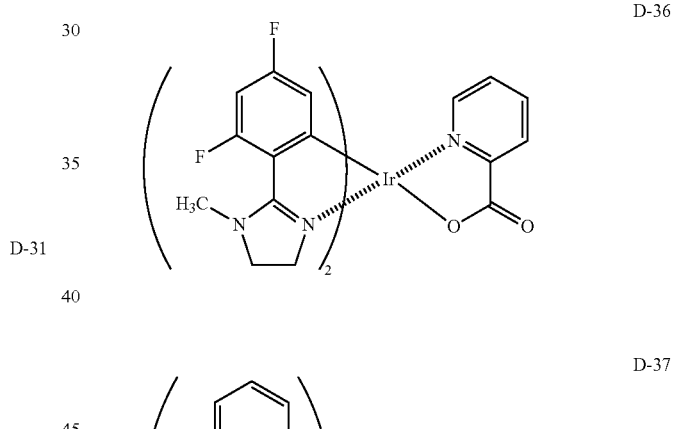
D-37 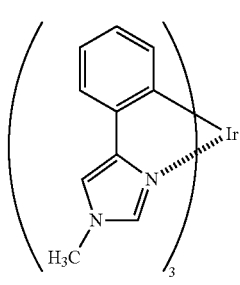
D-38 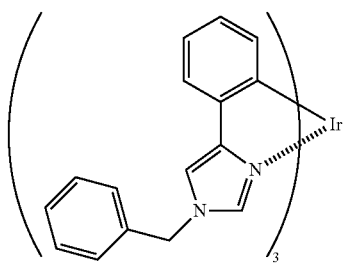

[Chemical Formula 62]
D-39 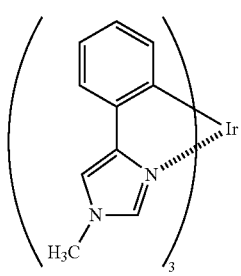
D-40 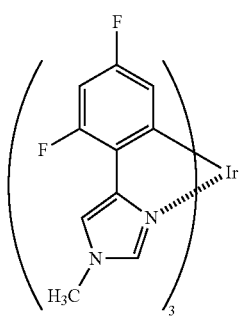
D-41 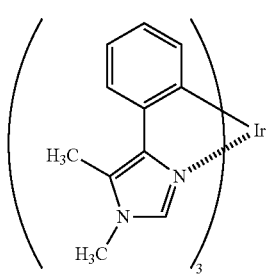
D-42 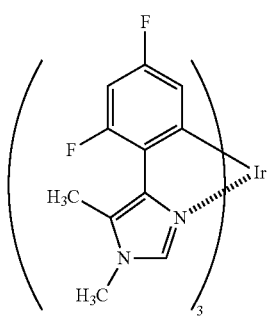
D-43 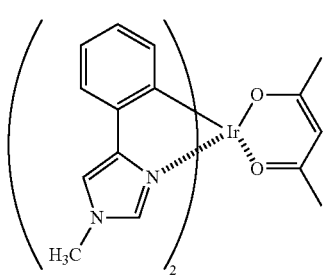
D-44 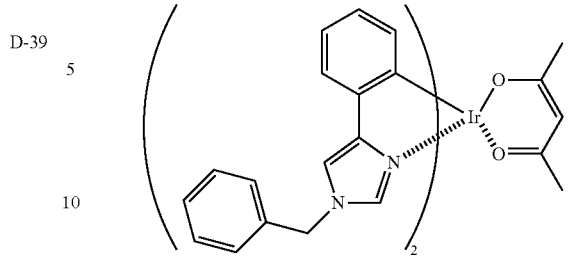
D-45 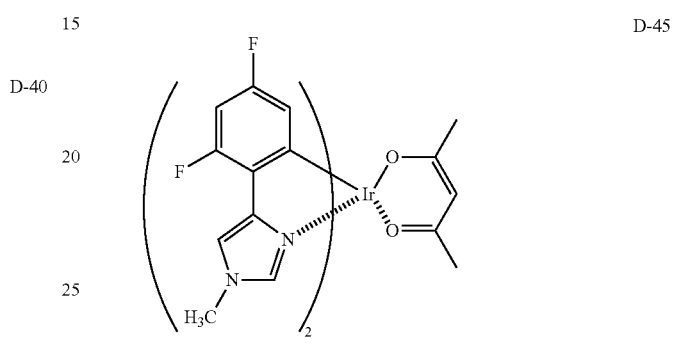
D-46 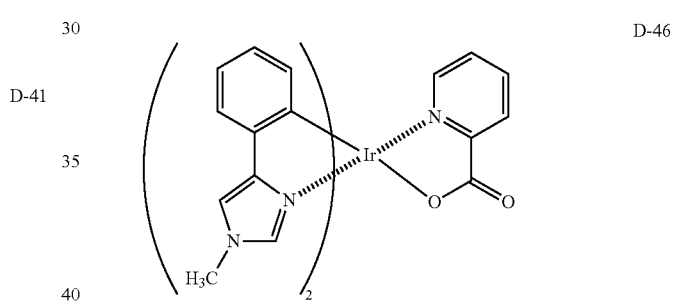
D-47 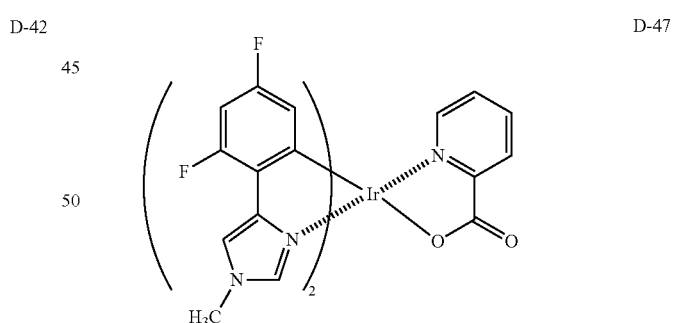
D-48 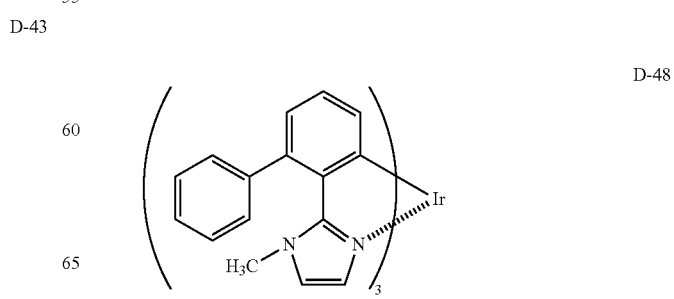

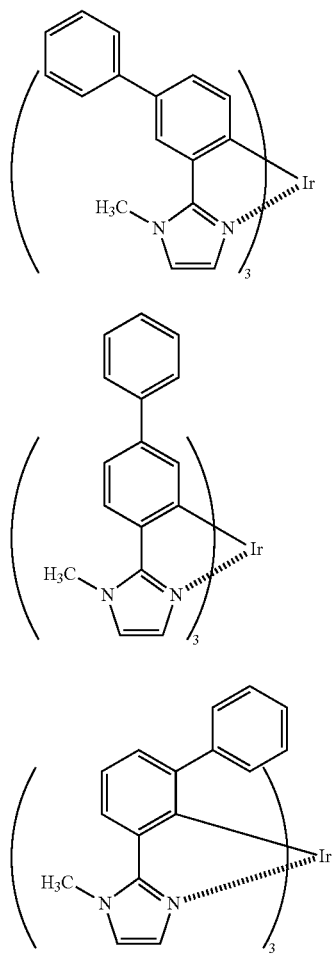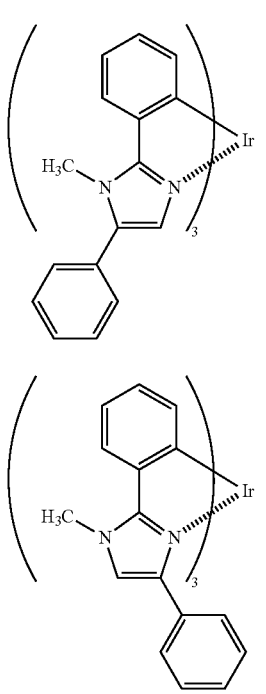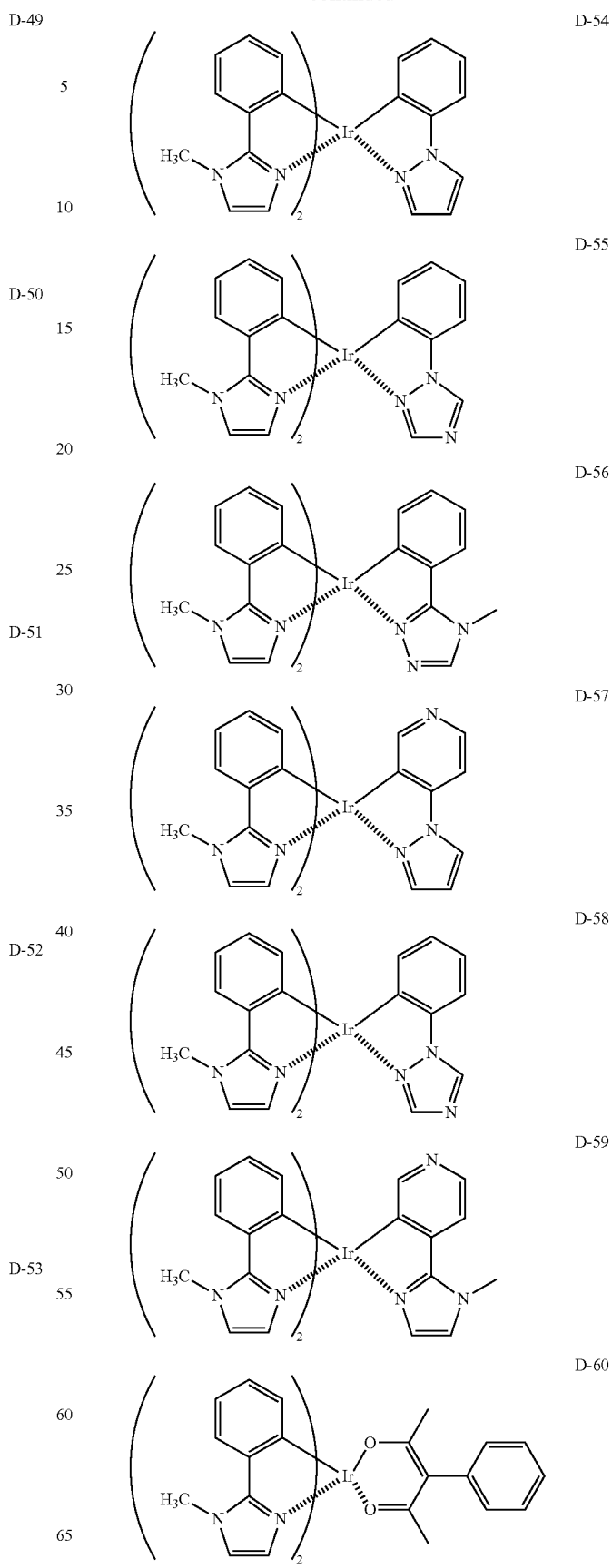

-continued
D-61
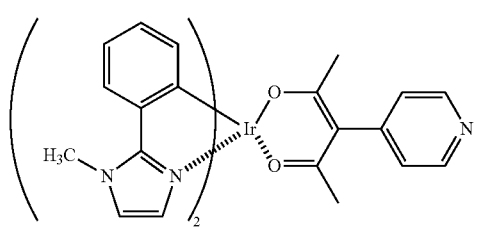
D-62
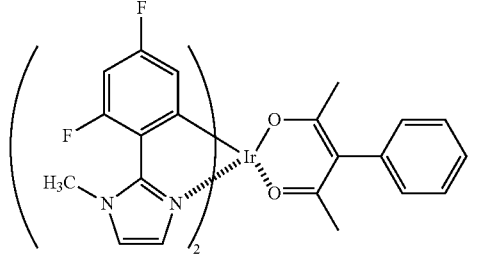
[Chemical Formula 64]
D-63
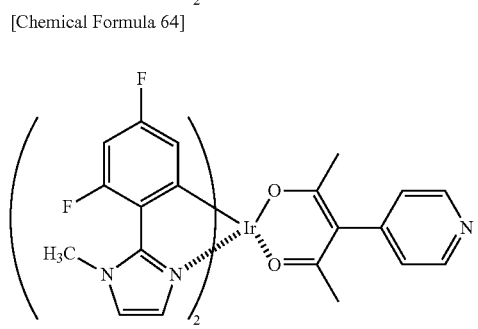
D-64
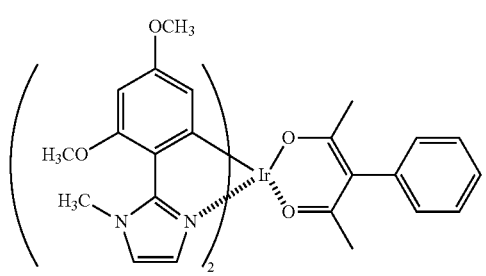
D-65
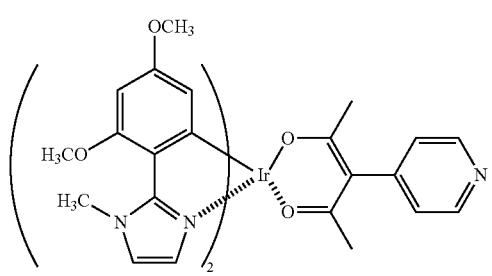
D-66
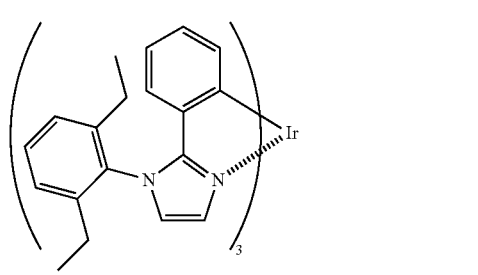
-continued
[Chemical Formula 65]
D-67
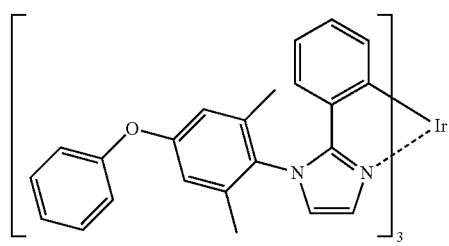
D-68
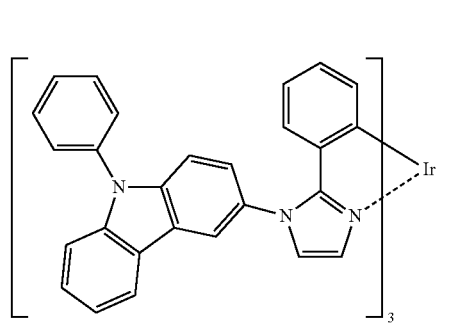
D-69
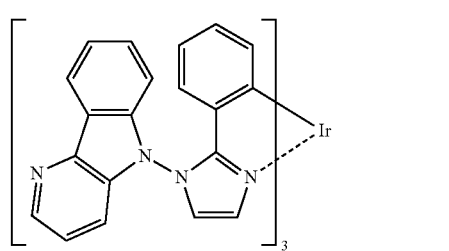
D-70
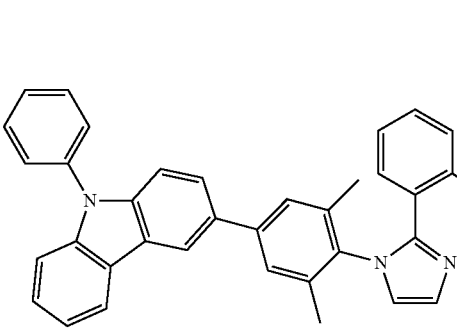
D-71
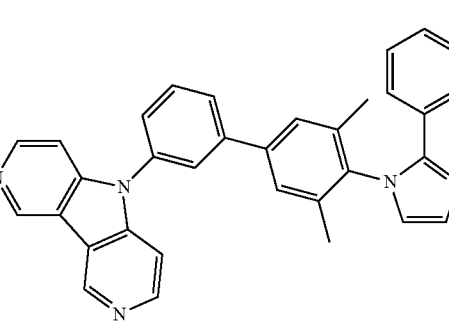

D-72
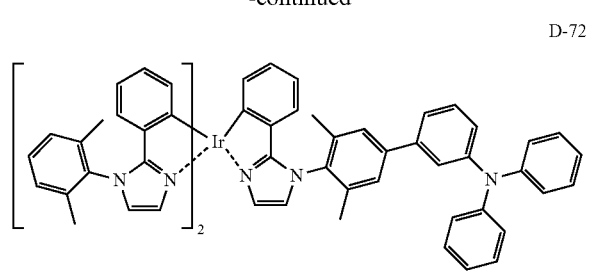
D-77
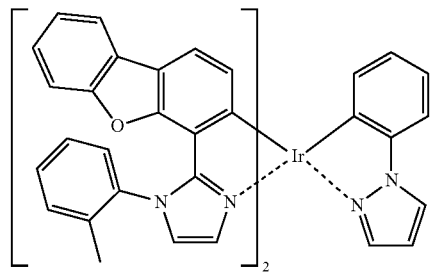
D-73
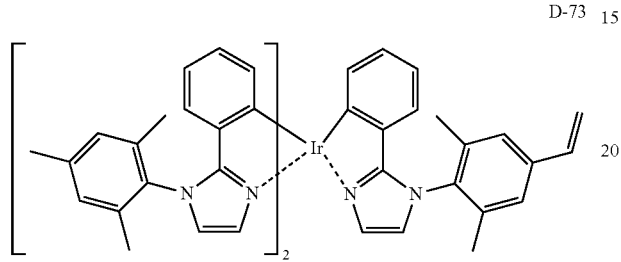
[Chemical Formula 66]
D-78
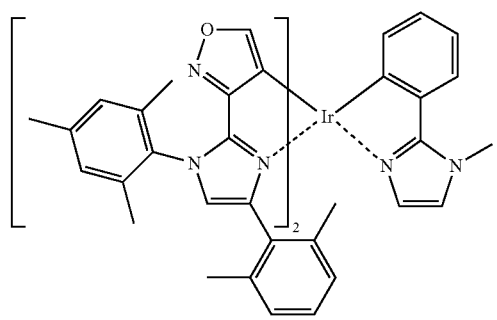
D-74
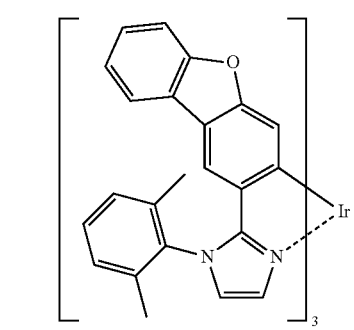
D-79
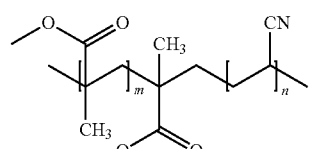
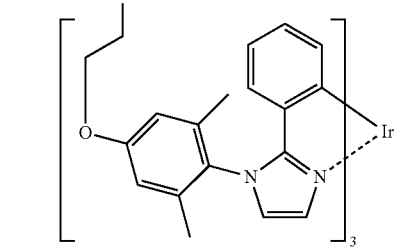
[Chemical Formula 67]
D-75
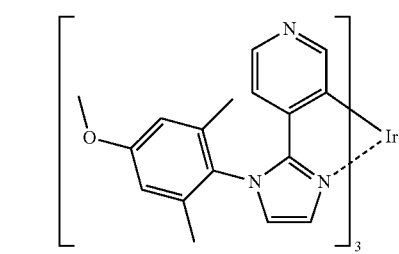
D-80
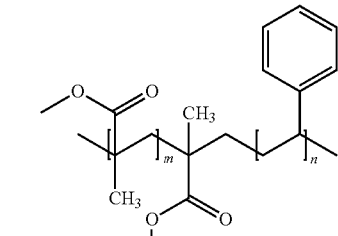
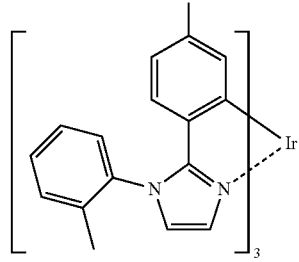
D-76
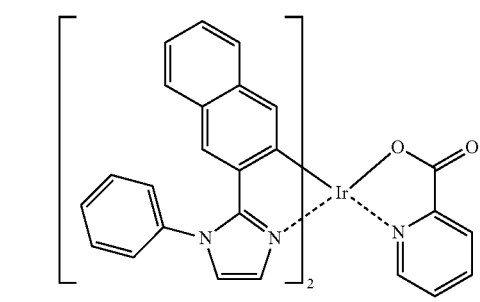

D-81 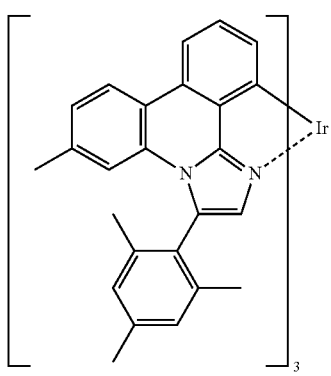
D-82 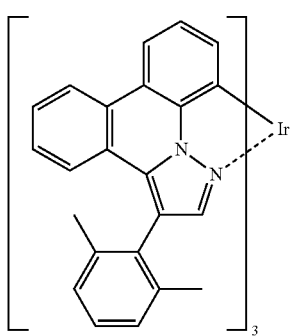
D-83 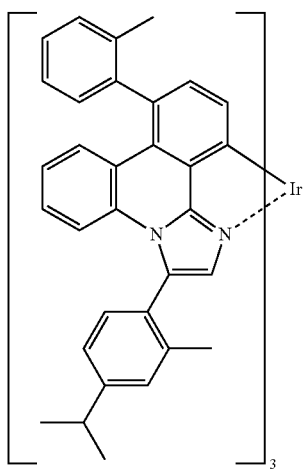
D-84 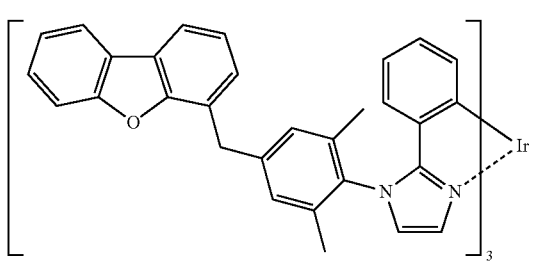
D-85 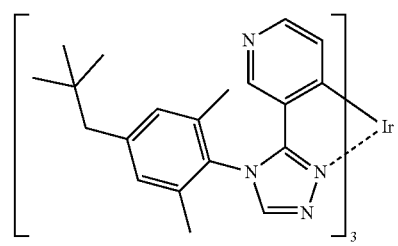
[Chemical Formula 68]
D-86 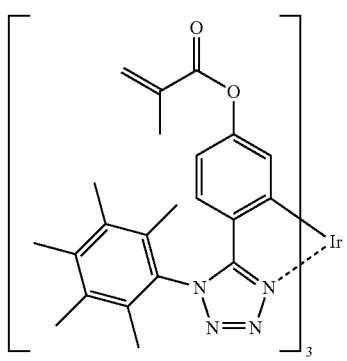
D-87 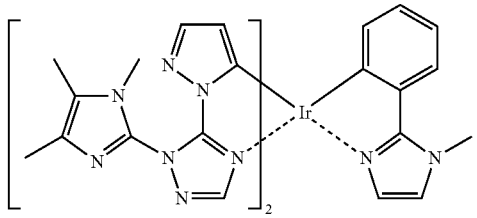
D-88 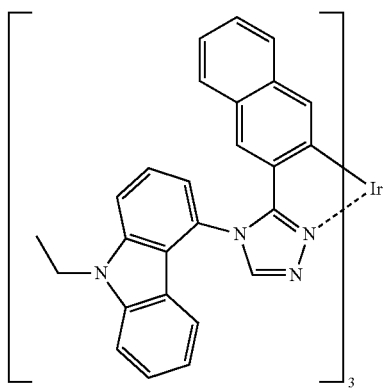
D-89 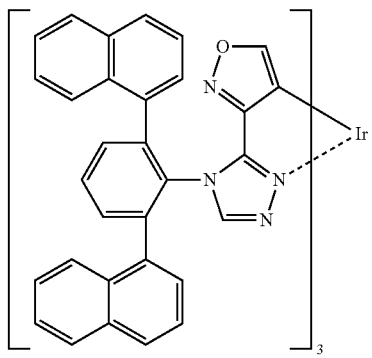

-continued

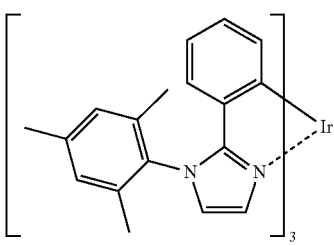
D-90

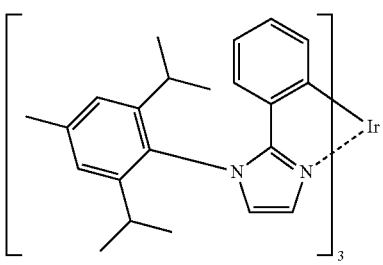
D-91

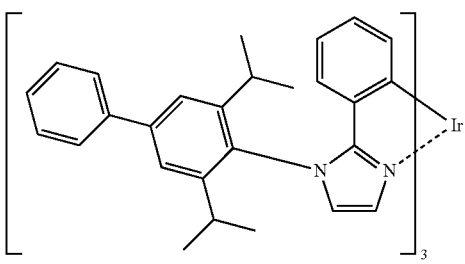
D-92

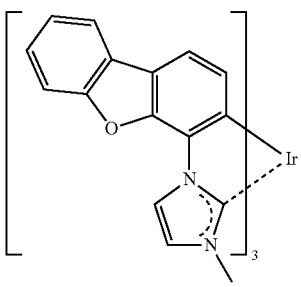
D-93

(4.3) Quantum Dot

In the present invention, the light emitting layer comprises a quantum dot with a light emitting wavelength in the range of 413 to 477 nm.

More specifically, as shown in FIG. 1, a quantum dot 30 is contained in a light emitting layer 22. The quantum dot 30 may be present in an interface between the light emitting layer 22 and a layer adjacent to the light emitting layer (for example, a hole blocking layer 21 or a hole transport layer 23).

In the present invention, an embodiment in which the quantum dot is at least contained in the light emitting layer 22 is particularly preferable.

The quantum dot according to the present invention is constituted by crystals of a semiconductor material, refers to particles of a predetermined size having a quantum confinement effect, and refers to fine particles having a particle size of about several nm to several tens nm, that can obtain the quantum dot effect shown below.

Specifically, the particle size of the quantum dots (fine particles) according to the present invention is preferably in the range of 1 to 20 nm, and further preferably in the range of 1 to 10 nm.

The energy level E of such quantum dot is generally represented by the following equation (I), when the Planck constant is "h", the effective mass of electron is "m", and the radius of fine particle is "R".

$$E \propto h^2/mR^2 \qquad \text{Equation (I)}$$

As shown in the equation (I), a band gap of the quantum dot increases in proportion to "$R^{-2}$", and so-called quantum dot effect is obtained. As described above, the particle size of the quantum dots is controlled and defined, whereby the band gap value of the quantum dots can be controlled. More specifically, the particle size of the fine particles is controlled and defined, so that diversity in which normal atoms do not have can be provided. Therefore, electron and hole are confined in the quantum dot and recombined by exciting the quantum dot by light or applying voltage to the EL element containing the quantum dot, whereby electric energy can be converted to a light of desired wavelength and emitted. In the present invention, the light emitting quantum dot material as described above is defined as a quantum dot.

The quantum dot has an average particle size of about several nm to several tens nm, as described above, and when used as one of the light emitting materials of white light emission, the average particle size is set corresponding to the intended emission color. For example, the average particle size of the quantum dots is preferably set in the range of 3.0 to 20 nm to obtain red light emission, the average particle size of the quantum dots is preferably set in the range of 1.5 to 15 nm to obtain green light emission, and the average particle size of the quantum dots is preferably set in the range of 1.0 to 10 nm to obtain blue light emission. However, the average particle size of the quantum dots of blue light emission varies also depending on a material constituting the quantum dots.

As the measurement method of the average particle size, a known method can be used. For example, the average particle size can be measured by a method of observing particles of the quantum dots by a transmission electron microscope (TEM) and determining the number average particle size of the particle size distribution therefrom, a method of determining the average particle size using an atomic force microscopy (AFM), or using a particle size measuring apparatus by the dynamic light scattering method, for example, a "ZETASIZER Nano Series Nano-ZS" manufactured by Malvern Instruments Ltd. Besides, there are a method of deriving the particle size distribution using a particle size distribution simulation calculation of the quantum dots from a spectrum obtained by the X-ray small angle scattering method, and the like, and in the present invention, a method of determining the average particle size using an atomic force microscopy (AFM) is preferable.

In addition, in the quantum dot according to the present invention, the value of the aspect ratio (major axis diameter/minor axis diameter) is preferably in the range of 1.0 to 2.0, and more preferably in the range of 1.1 to 1.7. The aspect ratio (major axis diameter/minor axis diameter) of the quantum dot according to the present invention also can be determined, for example, by measuring the major axis diameter and minor axis diameter using an atomic force microscopy (AFM). The number of individuals to be measured is preferably 300 or more.

The amount of the quantum dots to be added is preferably in the range of 0.01 to 50% by mass, more preferably in the range of 0.05 to 25% by mass, and most preferably in the range of 0.1 to 20% by mass, based on 100% by mass of all constituent materials of the layer to be added. When the addition amount is 0.01% by mass or more, it is possible to obtain white light emission with sufficient luminous efficiency and excellent color rendering properties, and when 50% by mass or less, it is possible to maintain an appropriate distance between quantum dot particles and sufficiently exert a quantum size effect.

Also, the phosphorescent light emitting compound described above has a relatively long excitation life on the order of milliseconds or microseconds, thus when the concentration in the layer is too high, there is a problem of so-called concentration quenching in which the energy of excitons is lost by vibration relaxation. However, by adding these quantum dots to the light emitting layer or the adjacent layer thereof, not only the light emission of the quantum dots and the phosphorescent light emitting compound themselves is obtained, but also, an effect of improving the light emission efficiency of the phosphorescent light emitting compound assumed to be obtained by the improvement in dispersion of the phosphorescent light emitting compound by shape change of whole layer and surface energy of the quantum dots is obtained while the detail is unknown.

Examples of the constituent material of the quantum dot include single group 14 elements of the periodic table such as carbon, silicon, germanium and tin; single group 15 elements of the periodic table such as phosphorus (black phosphorus); single group 16 elements of the periodic table such as selenium and tellurium; compounds consisting of a plurality of group 14 elements of the periodic table such as silicon carbide (SiC); compounds consisting of a group 14 element of the periodic table and a group 16 element of the periodic table such as tin(IV) oxide ($SnO_2$), tin(II, IV) sulfide ($Sn(II)Sn(IV)S_3$), tin(IV) sulfide ($SnS_2$), tin(II) sulfide (SnS), tin(II) selenide (SnSe), tin(II) telluride (SnTe), lead(II) sulfide (PbS), lead(II) selenide (PbSe) and lead(II) telluride (PbTe); compounds consisting of a group 13 element of the periodic table and a group 15 element of the periodic table (or group III-V compound semiconductors) such as boron nitride (BN), phosphorus borohydride (BP), boron arsenide (BAs), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs) and indium antimonide (InSb); compounds consisting of a group 13 element of the periodic table and a group 16 element of the periodic table such as aluminum sulfide ($Al_2S_3$), aluminum selenide ($Al_2Se_3$), gallium sulfide ($Ga_2S_3$), gallium selenide ($Ga_2Se_3$), gallium telluride ($Ga_2Te_3$), indium oxide ($In_2O_3$), indium sulfide ($In_2S_3$), indium selenide ($In_2Se_3$) and indium telluride ($In_2Te_3$); compounds consisting of a group 13 element of the periodic table and a group 17 element of the periodic table such as thallium(I) chloride (TlCl), thallium(I) bromide (TlBr) and thallium(I) iodide (TlI); compounds consisting of a group 12 element of the periodic table and a group 16 element of the periodic table (or group II-VI compound semiconductors) such as zinc oxide (ZnO), zinc sulfide (ZnS), zinc selenide (ZnSe), zinc telluride (ZnTe), cadmium oxide (CdO), cadmium sulfide (CdS), cadmium selenide (CdSe), cadmium telluride (CdTe), mercury sulfide (HgS), mercury selenide (HgSe) and mercury telluride (HgTe); compounds consisting of a group 15 element of the periodic table and a group 16 element of the periodic table such as arsenic(III) sulfide ($As_2S_3$), arsenic(III) selenide ($As_2Se_3$), arsenic(III) telluride ($As_2Te_3$), antimony(III) sulfide ($Sb_2S_3$), antimony(III) selenide ($Sb_2Se_3$), antimony (III) telluride ($Sb_2Te_3$), bismuth (III) sulfide ($Bi_2S_3$), bismuth (III) selenide ($Bi_2Se_3$) and bismuth (III) telluride ($Bi_2Te_3$); compounds consisting of a group 11 element of the periodic table and a group 16 element of the periodic table such as copper (I) oxide ($Cu_2O$) and copper (1) selenide ($Cu_2Se$); compounds consisting of a group 11 element of the periodic table and a group 17 element of the periodic table such as copper (I) chloride (CuCl), copper (I) bromide (CuBr), copper (I) iodide (CuI), silver chloride (AgCl) and silver bromide (AgBr); compounds consisting of a group 10 element of the periodic table and a group 16 element of the periodic table such as nickel (II) oxide (NiO); compounds consisting of a group 9 element of the periodic table and a group 16 element of the periodic table such as cobalt (II) oxide (CoO) and cobalt (II) sulfide (CoS), compounds consisting of a group 8 element of the periodic table and a group 16 element of the periodic table such as triton tetraoxide ($Fe_3O_4$) and iron (II) sulfide (FeS); compounds consisting of a group 7 element of the periodic table and a group 16 element of the periodic table such as manganese (II) oxide (MnO); compounds consisting of a group 6 element of the periodic table and a group 16 element of the periodic table such as molybdenum (IV) sulfide ($MoS_2$) and tungsten (IV) oxide ($WO_2$); compounds consisting of a group 5 element of the periodic table and a group 16 element of the periodic table such as vanadium (II) oxide (VO), vanadium (IV) oxide ($VO_2$) and tantalum (V) oxide ($Ta_2O_5$); compounds consisting of a group 4 element of the periodic table and a group 16 element of the periodic table such as titanium oxide (such as $TiO_2$, $TiO_2O_5$, $Ti_2O_3$ and $Ti_5O_9$); compounds consisting of a group 2 element of the periodic table and a group 16 element of the periodic table such as magnesium sulfide (MgS) and magnesium selenide (MgSe); chalcogen spinels such as cadmium (II) oxide chromium (III) ($CdCr_2O_4$), cadmium (II) selenide chromium (III) ($CdCr_2Se_4$), copper (II) sulfide chromium (III) ($CuCr_2S_4$) and mercury (II) selenide chromium (III) ($HgCr_2Se_4$); barium titanate ($BaTiO_3$); and the like. The compounds consisting of a group 14 element of the periodic table and a group 16 element of the periodic table such as $SnS_2$, SnS, SnSe, SnTe, PbS, PbSe and PbTe; the group III-V compound semiconductors such as GaN, GaP, GaAs, GaSb, InN, InP, InAs and InSb; compounds consisting of a group 13 element of the periodic table and a group 16 element of the periodic table such as $Ga_2O_3$. $Ga_2S_3$, $Ga_2Se_3$, $Ga_2Te_3$, $In_2O_3$, $In_2S_3$, $In_2Se_3$ and $In_2Te_3$; the group II-VI compound semiconductors such as ZnO, ZnS, ZnSe, ZnTe, CdO, CdS, CdSe, CdTe, HgO, HgS, HgSe and HgTe; compounds consisting of a group 15 element of the periodic table and a group 16 element of the periodic table such as $As_2O_3$, $As_2S_3$, $As_2Se_3$, $As_2Te_3$, $Sb_2O_3$, $Sb_2S_3$, $Sb_2Se_3$, $Sb_2Te_3$, $Bi_2O_3$, $Bi_2S_3$, $Bi_2Se_3$ and $Bi_2Te_3$; and compounds consisting of a group 2 element of the periodic table and a group 16 element of the periodic table such as MgS and MgSe are preferable, and among them, Si, Ge, GaN, GaP, InN, InP, $Ga_2O_3$, $Ga_2S_3$, $In_2O_3$, $In_2S_3$, ZnO, ZnS, CdO and CdS are more preferable. These substances do not contain a highly toxic negative element, thus are excellent in environmental pollution resistance and safety to living organisms, and also can stably obtain a pure spectrum in a visible light region, thus is advantageous in the formation of the light emitting element. Among these materials, CdSe, ZnSe and CdS are preferable in terms of stability of light emission. From the viewpoint of light emission efficiency, high refractive index, and economic efficiency of safety, quantum dots of ZnO and ZnS are preferable. Also, quantum dots may be CuInS, CuInSe and CuInGaSe.

The above materials may be used alone, or two or more kinds may be used in combinations.

Here, it is possible to dope a small amount of each element into the above-described quantum dots as impurities, as necessary. Such dope substance is added, whereby light emitting characteristics can be greatly improved.

The quantum dot according to the present invention has a light emitting wavelength in the range of 413 to 477 nm (2.6 to 3.6 eV).

As to the light emitting wavelength (band gap) referred in the present invention, in the case of quantum dot as an inorganic matter, the energy difference of the valence band and the conduction band is a band gap (eV) in the quantum dot, and represented by light emitting wavelength (nm) =1240/band gap (eV).

The band gap (eV) of the quantum dot can be measured using Tauc plot.

Tauc plot that is one of optical measuring methods of the band gap (eV) will be described.

The measurement principle of band gap ($E_0$) using Tauc plot is shown below.

It is considered that the following equation (A) holds between optical absorption coefficient α and light energy by (herein, h is Planck constant, ν is frequency) and band gap energy $E_0$ in the area where absorption is relatively large near optical absorption edge in the long wavelength side of the semiconductor material.

$$\alpha h\nu = B(h\nu - E_0)^2 \quad \text{Equation (A)}$$

Therefore, the absorption spectrum is measured, then the by is plotted (so-called, Tauc plot) against 0.5-square of (αhν), and the value of by at α=0 extrapolating the straight section is the band gap energy $E_0$ of the quantum dot to be obtained.

In the case of quantum dots, the difference (Stokes shift) in the spectrum of absorption and emission is small, and the waveform is sharp, thus, the maximum wavelength of light emitting spectrum can be also simply used as an indicator of the band gap.

In addition, as other methods, the method of estimating the energy levels of the organic and inorganic functional materials include methods of determining from the energy levels obtained by scanning tunneling spectroscopy, ultraviolet photoelectron spectroscopy, X-ray photoelectron spectroscopy and Auger electron spectroscopy and a method of optically estimating the band gap.

Also, these quantum dots may obtain not only light emission by direct recombination of holes and electrons in the quantum dots, but also light emission from the core of the quantum dots by absorbing the energy of excitons generated in the organic electron block hole transport layer and organic light emitting layer or the hole block electron transport layer in the quantum dots. These quantum dots are lightly-doped, thus can obtain light emission by absorbing the energy of excitons also in other phosphorescent light emitting compound.

It is preferred that the surface of the quantum dots is covered with a coating film constituted by a coating layer of an inert inorganic matter or an organic ligand. More specifically, it is preferred that the surface of the quantum dots has a core/shell structure having a core region constituted by a quantum dot material, and a shell region constituted by a coating layer of an inert inorganic matter or an organic ligand.

This core/shell structure is preferably formed by at least two compounds, and a gradient structure (inclined structure) may be formed by two or more compounds. Whereby, aggregation of quantum dots in the coating liquid can be effectively prevented, dispersion of quantum dots can be improved, and also, the luminous efficiency is improved, and a color shift which occurs when continuously driven can be suppressed. In addition, due to the presence of the coating layer, light emitting characteristics can be stably obtained.

Also, when the surface of the quantum dots is covered with a coating film (shell part), the surface modifier set forth below can be securely carried on near the surface of the quantum dots.

The thickness of the coating film (shell part) is not particularly limited, and is preferably in the range of 0.1 to 10 nm, and more preferably in the range of 0.1 to 5 nm.

Generally, the emission color can be controlled by the average particle size of quantum dots, and when the thickness of the coating film is the value in the above range, the thickness of the coating film is from a thickness corresponding to several atoms to a thickness of less than one quantum dot. Thus, the quantum dots can be filled at high density, and the sufficient emitted light quantity is obtained. Also, due to the presence of the coating film, a defect present in the particle surface of each other's core particles and non-emitting electron energy transfer due to an electronic trap in a dangling bond can be suppressed, and lowering of the quantum efficiency can be suppressed.

(4.4) Functional Surface Modifier

When an organic function layer containing quantum dots is formed by a wet application system, in the coating liquid used therefor, it is preferred that a surface modifier adheres in the vicinity of the surface of the quantum dots. Whereby, dispersion stability of the quantum dot in the coating liquid can be made particularly excellent. Also, during production of quantum dots, a surface modifier is adhered to the surface of the quantum dots, so that the shape of the formed quantum dots becomes one having a high sphericity, and the particle size distribution of quantum dots is suppressed low, thus the quantum dot can be made particularly excellent.

The functional surface modifier applicable in the present invention may be ones which directly adhere to the surface of the quantum dots, and may adhere via a shell (one to which the surface modifier directly adheres is a shell, and is not in contact with the core part of the quantum dots).

Examples of the surface modifier include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphosphine; polyoxyethylene alkylphenyl ethers such as polyoxyethylene n-octylphenyl ether and polyoxyethylene n-nonylphenyl ether; tertiary amines such as tri(n-hexyl) amine, tri(n-octyl) amine, and tri(n-decyl) amine; organic phosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds such as pyridine, lutidine, collidine and quinoline; amino alkanes such as hexylamine, octylamine, decylamine, dodecylamine, tetradecylamine, hexadecylamine, and octadecylamine; dialkyl sulfides such as dibutyl sulfide; dialkyl sulfoxides such as dimethyl sulfoxide and dibutyl sulfoxide; organic sulfur compounds such as sulfur-containing aromatic compounds such as thiophene; higher fatty acids such as palmitic acid, stearic acid, and oleic acid; alcohols; sorbitan fatty acid esters; fatty acid modified polyesters; tertiary amine modified polyurethanes; polyethyleneimine; and the like. However, when the quantum dots are prepared by the method set forth below, as the surface modifier, a substance that is coordinated with fine particles of the quantum dots in a high-temperature liquid phase and stabilized is preferable, and specifically, trialkylphosphines, organic phosphorus compounds, amino alkanes, tertiary amines, organic nitrogen compounds, dialkyl sulfides, dialkyl sulfoxides, organic sulfur compounds, higher fatty acids and alcohols are preferable. The surface modifier as described above is used, so that dispersion of quantum dots in the coating liquid can be made particularly excellent. Also, the shape of the quantum dots formed during production of quantum dots is made to have a higher sphericity, and the particle size distribution of quantum dots can be made sharper.

In the present invention, as described above, the size (average particle size) of the quantum dots is preferably in the range of 1 to 20 nm. In the present invention, the size of the quantum dots represents the total size of the core region constituted by a quantum dot material, the shell region constituted by a coating layer of an inert inorganic matter or an organic ligand and the surface modifier. When a surface modifier and a shell are not contained, it represents the size not including them.

(4.5) Method for Producing Quantum Dots

The method for producing quantum dots include methods for producing quantum dots as described below conventionally carried out and the like, but is not limited thereto, and a known arbitrary method can be used. Also, quantum dots can be purchased as a commercial product from Sigma-Aldrich Co. LLC., Crystalplex Corporation, NN-LABS, LLC., and the like.

Example of the process under high vacuum includes a molecular beam epitaxy method and a CVD method; and the liquid phase production method includes a reverse micelle method in which a raw material aqueous solution is, for example, made present in a non-polar organic solvent such as alkanes such as n-heptane, n-octane and isooctane, or aromatic hydrocarbons such as benzene, toluene and xylene as a reverse micelle to grow crystal in the reverse micelle phase, a hot soap method in which a thermally degradable raw material is injected in a liquid phase organic medium at a high temperature to grow crystal, further, a solution reaction method that involves crystal growth at a relatively low temperature using an acid-base reaction as driving force as same as the hot soap method, and the like. An arbitrary method from these production methods can be used. Among them, the liquid phase production method is preferable.

In the liquid phase production method, on the synthesis of quantum dots, the organic surface modifier present in the surface is referred as an initial surface modifier. Examples of the initial surface modifier in the hot soap method include trialkylphosphines, trialkylphosphine oxides, alkylamines, dialkyl sulfoxides, alkanephosphonic acids, and the like. It is preferred that these initial surface modifiers are exchanged to the above-described functional surface modifier by an exchange reaction.

Specifically, for example, an initial surface modifier such as trioctylphosphine oxide obtained by the above hot soap method can be exchanged with a functional surface modifier by an exchange reaction carried out in a liquid phase containing the above-described functional surface modifier.

Hereinbelow, an example of a method for producing a quantum dot is shown.

<1> Production Example 1 of Quantum Dot

First, CdO powder (1.6 mmol, 0.206 g; Aldrich, +99.99%) and oleic acid (6.4 mmol, 1.8 g; Aldrich, 95%) are mixed in 40 ml of trioctylamine (TOA, Aldrich, 95%). The mixed solution is heat-treated at 150° C. while rapidly stirring, and the temperature is raised to 300° C. while flowing N2. Subsequently, 0.2 ml of 2.0 mol/L Se (Alfa Aesar) added to trioctylphosphine (TOP, Strem, 97%) at 300° C. is rapidly injected to the Cd-containing mixture.

After 90 seconds, 1.2 mmol of n-octanethiol added to TOA (210 it in 6 ml) is injected at a rate of 1 ml/min using a syringe pump to react the mixture for 40 minutes.

Next, 0.92 g of zinc acetate and 2.8 g of oleic acid are dissolved in 20 ml of TOA at 200° C. under $N_2$ atmosphere to prepare a 0.25 mol/L Zn precursor solution.

Subsequently, 16 ml aliquot of a Zn-oleic acid solution (heated at 100° C.) is rapidly injected to the Cd-containing reaction medium at a rate of 2 ml/min. Thereafter, 6.4 mmol of n-octanethiol in TOA (1.12 ml in 6 ml) is injected at a rate of 1 ml/min using a syringe pump.

The whole reaction is performed over 2 hours. After the reaction is over, the product is cooled to about 50 to 60° C., and the organic sludge is removed by centrifugation (5,600 rpm). Ethanol (Fisher, HPLC grade) is added until opaque lump is disappeared. Subsequently, the precipitate obtained by centrifugation is dissolved in toluene (Sigma-Aldrich, Anhydrous 99.8%), so that a CdSe/CdS/ZnS core-shell quantum dot colloidal solution can be obtained.

<2> Production Example 2 of Quantum Dot

To obtain a quantum dot having CdSe/ZnS core-shell structure, a precursor material corresponding to core (CdSe) such as $(CH_3)_2Cd$ (dimethyl cadmium) and TOPSe (trioctylphosphine selenide) is injected to an organic solvent using TOPO (trioctylphosphine oxide) as a surfactant so as to produce a crystal, and the mixture is maintained at a high temperature for a certain time so that the crystal is grown to a certain size. Thereafter, a precursor material corresponding to shell (ZnS) is injected so as to form a shell on the surface of already produced core, whereby a CdSe/ZnS quantum dot capped with TOPO can be obtained.

<3> Production Example 3 of Quantum Dot

Under argon stream, 2.9 g of stearic acid (manufactured by Kanto Chemical Co., Inc.), 620 mg of n-tetradecylphosphonic acid (manufactured by AVOCADO Inc.) and 250 mg of cadmium oxide (manufactured by Wako Pure Chemical Industries, Ltd.) are added to 7.5 g of tri-n-octylphosphine oxide (TOPO) (manufactured by Kanto Chemical Co., Inc.), and the mixture is heated to 370° C. and mixed. This mixture is naturally cooled to 270° C., then a solution prepared by previously dissolving 200 mg of selenium (manufactured by Strem Chemicals, Inc.) in 2.5 mL of tributylphosphine (manufactured by Kanto Chemical Co., Inc.) is added, and the mixture is dried under reduced pressure to obtain CdSe fine particles coated with TOPO.

Subsequently, 15 g of TOPO is added to the obtained CdSe fine particles and heated, then a solution obtained by dissolving 1.1 g of zinc diethyldithiocarbamate (manufactured by Tokyo Kasei Co., Ltd.) in 10 mL of trioctylphosphine (manufactured by Sigma-Aldrich Co. LLC.) at 270° C. is added to obtain nanoparticles with nanocrystals of CdSe as a core and a ZnS as a shell in which TOPO is immobilized on the surface (hereinafter also referred to as TOPO immobilized quantum dots). Here, the quantum dot in this state is soluble in an organic solvent such as toluene and tetrahydrofuran (THF).

Thereafter, the prepared TOPO immobilized quantum dots are dissolved in THF and heated to 85° C., and 100 mg of N-[(S)-3-mercapto-2-methylpropionyl]-L-proline (manufactured by Sigma-Aldrich Co. LLC.) dissolved in ethanol is added dropwise, and the mixture is refluxed for about 12 hours. After refluxing for 12 hours, an aqueous NaOH solution was added, and the mixture is heated to 90° C. for 2 hours to evaporate THF. The obtained unpurified quantum dots are purified and concentrated using a ultrafiltration (manufactured by Merck Millipore, "Microcon") and a Sephadex column (manufactured by Amersham Biosciences Corp., "MicroSpin G-25 Columns"), whereby hydrophilic quantum dots in which N—[(S)-3-mercapto-2-methylpropionyl]-L-proline is immobilized on the surface of the quantum dots can be produced.

(4.6) Method for Forming Film of Quantum Dots

The method for forming a film of quantum dots is preferably a method by a wet process. Examples include a spin coating method, a casting method, a die coating method, a blade coating method, a roll coating method, an ink-jet method, a printing method, a spray coating method, a curtain coating method, an LB method (Langmuir-Blodgett method) and the like.

Furthermore, a film forming method by a transfer method (film, stamps, and the like) such as transferring a monomolecular film of the quantum dots after forming on other medium is also useful.

At this time, the solvent used preferably contains a solvent having a boiling point of 100 to 150° C. By using a solvent in this range, the drying rate becomes appropriate, and the quantum dot compound contained in the coating film can be properly oriented, whereby higher light emission efficiency and durability can be obtained.

The solvent as described above includes toluene, xylene, chlorobenzene, n-butanol, and the like. Also, the solvent may be a mixed solvent containing these solvents, and the ratio thereof is preferably in the range of 9:1 to 0:10.

<<First Electrode (Cathode)>>

As the first electrode, one using a metal having a small work function (4 eV or less) (referred to as electron injecting metal), an alloy, an electrically conductive compound and a mixture thereof for the electrode material is used. Specific examples of the electrode material described above include sodium, sodium-potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, rare earth metals, and the like.

Among them, in terms of durability against oxidation and the like, as the second electrode, for example, magnesium/silver mixture, magnesium/aluminum mixture, magnesium/indium mixture, aluminum/aluminum oxide ($Al_2O_3$) mixture, lithium/aluminum mixture, aluminum and the like are preferable.

Here, in order to transmit the emitted light, when either one of the first electrode or the second electrode of the EL element is transparent or translucent, it is convenient since the light emitting luminance is improved. However, generally, the substrate and the first electrode are made transparent, whereby the light generated in the light emitting layer is extracted to the outside, thus the first electrode is preferably a transparent electrode. More specifically, the electrode may also be made of a metal oxide such as ITO, IZO, AZO, and FTO.

The first electrode can be prepared by forming a thin film by a method such as vapor deposition or sputtering of the electrode material described above. Also, the sheet resistance as the first electrode is preferably several hundred $\Omega/\square$ or less, and the thickness is selected in the range of normally 10 nm to 5 μm, and preferably 50 to 200 nm.

<<Second Electrode (Anode)>>

As the first electrode, one using a metal having a large work function (4 eV or more), an alloy, an electrically conductive compound or a mixture thereof for the electrode material is preferably used. Specific examples of the electrode material described above include metals such as Au, CuI, a composite oxide of indium-tin (hereinafter abbreviated as ITO), and conductive transparent materials such as $SnO_2$ and ZnO. Also, a material capable of preparing a transparent conductive film with amorphous such as IDIXO ($In_2O_3$—ZnO) may be used.

On the first electrode, a thin film may be formed by a method such as vapor deposition or sputtering of these electrode materials, and a desired shape pattern may be formed by a photolithography method, or when a high pattern accuracy is not required so much (100 μm or more), a pattern may be formed via a mask having a desired shape in vapor deposition or sputtering of the electrode materials. Alternatively, when a coatable substance such as an organic conductive compound is used, a wet film forming method such as printing system and coating system can be also used.

When light emission is extracted from this first electrode, the transmittance is desirably greater than 10%, and the sheet resistance as the first electrode is preferably several hundreds $\Omega/\square$ or less. Further, the film thickness depends on the material, but is normally in the range of 10 to 1000 nm, and is preferably selected in the range of 10 to 200 nm.

Also, after forming the metal in a film thickness of 1 to 20 nm on the second electrode, the conductive transparent material of the metal oxide mentioned in the description of the first electrode is formed thereon, whereby a transparent or translucent second electrode can be prepared. Then, with application of this, an EL element in which both the first electrode and the second electrode have transmissiveness can be prepared.

<<Supporting Substrate>>

As the supporting substrate (hereinafter, also referred to as base substance, substrate, base material, and support, and the like), the material thereof is glass, plastic or the like, and is not particularly limited, and may be transparent or opaque. When light is extracted from the supporting substrate side, the supporting substrate is preferably transparent. Examples of the transparent supporting substrate preferably used include glass, quartz and a transparent resin film. Since a flexible substrate greatly exhibits high-temperature storage stability and an effect of suppressing chromatic variations as compared to a rigid substrate, particularly preferred supporting substrate is a resin film having flexibility capable of providing flexibility to the EL element.

Examples of the resin film include polyesters such as polyethylene terephthalate (PET) and polyethylene naphthalate (PEN); cellulose esters or derivatives thereof such as polyethylene, polypropylene, cellophane, cellulose diacetate, cellulose triacetate (TAC), cellulose acetate butyrate, cellulose acetate propionate (CAP), cellulose acetate phthalate and cellulose nitrate; polyvinylidene chloride, polyvinyl alcohol, polyethylene vinyl alcohol, syndiotactic polystyrene, polycarbonate, norbornene resins, polymethylpentene, polyether ketone, polyimide, polyether sulfone (PES), polyphenylene sulfide, polysulfones, polyetherimide, polyetherketoneimide, polyamide, fluororesins, nylon, polymethyl methacrylate, acryl, polyacrylates, cycloolefin based resins such as ARTON (trade name, manufactured by JSR Corporation) or APL (trade name, manufactured by Mitsui Chemical, Inc.), and the like.

On the surface of the resin film, a coating film of an inorganic matter or an organic matter or a hybrid coating film of both of them may be formed. The above coating film is preferably a barrier film having a water vapor permeability (25±0.5° C., relative humidity (90±2)% RH), measured by the method in accordance with JIS K 7129-1992, of 0.01 g/(m$^2$·24 h·atm) or less. Further, the above coating film is preferably a high barrier film having an oxygen permeability, measured by the method in accordance with JIS K 7126-1987, of $1\times10^{-3}$ cm$^3$/(m$^2$·24 h·atm) or less and a water vapor permeability of $1\times10^{-3}$ g/(m$^2$·24 h·atm) or less, and further preferably a water vapor permeability of $1\times10^{-5}$ g/(m$^2$·24 h·atm) or less.

As a material to form the barrier film, any materials having a function to suppress the infiltration of factors which degrade EL elements such as moisture and oxygen may be used. For example, silicon oxide, silicon dioxide, silicon nitride and the like can be used. Further, in order to decrease brittleness of the film, it is more preferred to have a laminated structure of the above inorganic layer and a layer composed of organic materials. The lamination order of the inorganic layer and the organic function layer is not particularly limited, but it is preferred that both are alternately laminated multiple times.

The method of forming a barrier film is not particularly limited, and it is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method (CVD: Chemical Vapor Deposition), a laser CVD method, a thermal CVD method, a coating method, and the like. And, the atmospheric pressure plasma polymerization method, as described in Japanese Patent Application Laid Open Publication No. 2004-68143, is particularly preferable.

Examples of the opaque supporting substrate include metal plates of aluminum, stainless steel or the like, films and opaque resin substrates, substrates made of ceramic, and the like.

In the EL element, the external light extraction efficiency of light emission at room temperature is preferably 1% or more, and more preferably 5% or more.

Here, the external extraction quantum efficiency (%)=the number of photons emitted to the outside of the EL element/the number of electrons flown to the EL element×100.

<<Sealing>>

Examples of a sealing means applicable to seal the EL element include a method of adhering a sealing member, electrodes and a supporting substrate with a sealing adhesive.

As the sealing member, any member which is arranged so as to cover the display area of the EL element can be used, and the member may be in the form of an intaglio plate or a flat plate. Also, transparency and electric insulation properties are not particularly limited.

Specifically included are glass plates, polymer plates/films, metal plates/films, and the like. The glass plate includes, in particular, soda-lime glass, barium and strontium-containing glass, lead glass, aluminosilicic acid glass, borosilicic acid glass, barium borosilicic acid glass, quartz, and the like. Also, the polymer plate includes polycarbonate, acryl, polyethylene terephthalate, polyether sulfide, polysulfone, and the like. The metal plate includes those composed of one or more metals or an alloy selected from the group consisting of stainless steel, iron, copper, aluminum, magnesium, nickel, zinc, chromium, titanium, molybdenum, silicon, germanium and tantalum.

In the present invention, as the sealing member, a polymer film or metal film can be preferably used, since it can make an EL element into a thinner film. Furthermore, it is preferred that the polymer film has an oxygen permeability, measured by the method in accordance with JIS K 7126-1987, of $1\times10^{-3}$ cm$^3$/(m$^2$·24 h·atm) or less, and a water vapor permeability (25±0.5° C. and relative humidity (90±2)% RH), measured by the method in accordance with JIS K 7129-1992, of $1\times10^{-3}$ g/(m$^2$·24 h) or less.

In order to process the sealing member into a form of an intaglio, processes such as sandblasting and chemical etching are used.

The sealing adhesives specifically include photocurable and thermosetting type adhesives having a reactive vinyl group of acrylic acid-based oligomers and methacrylic acid-based oligomers, and moisture curable type adhesives such as 2-cyanoacrylic acid ester. Also, there can be included a thermal and chemical curing type (a two-liquid mixed) adhesives such as epoxy-based adhesives. Further, there can be included hot-melt type polyamide, polyester, and polyolefin. Still further, there can be included cationically curable type ultraviolet ray curable type epoxy resin adhesives.

Since the EL elements are sometimes degraded due to a thermal treatment, preferred are those which are adhesion-curable from room temperature to 80° C. Further, desiccants may be dispersed in the adhesives. Application of the adhesive onto the sealing portion may be achieved by using a commercially available dispenser or by printing in the same manner as screen printing.

Further, on the outside of an electrode on the side facing a supporting substrate interposing an organic function layer, the electrode and the organic function layer are covered, a layer of an inorganic matter or organic matter is also preferably formed as the sealing film in contact with the supporting substrate. In this case, as a material to form the film, any materials can be used, as long as they have a function to suppress the infiltration of substances which degrade elements such as moisture and oxygen. For example, silicon oxide, silicon dioxide, silicon nitride and the like can be used. Further, in order to decrease brittleness of the film, it is preferred to have a laminated structure of the above inorganic layer and a layer composed of organic materials. The method of forming these films is not particularly limited, and it is possible to employ, for example, a vacuum deposition method, a sputtering method, a reactive sputtering method, a molecular beam epitaxy method, a cluster ion beam method, an ion plating method, a plasma polymerization method, an atmospheric pressure polymerization method, a plasma CVD method, a laser CVD method, a thermal CVD method, a coating method, and the like.

It is preferred that, for the purpose of forming a gas phase and a liquid phase, an inert gas such as nitrogen or argon or an inert liquid such as fluorinated hydrocarbon or silicone oil is injected into the space between the sealing member and the display area of the EL element. Also, the above space can be vacuumized. In addition, a hygroscopic compound can be sealed inside.

Examples of the hygroscopic compound include metal oxides (for example, sodium oxide, potassium oxide, calcium oxide, barium oxide, magnesium oxide, aluminum oxide, and the like), sulfates (for example, sodium sulfate, calcium sulfate, magnesium sulfate, cobalt sulfate, and the like), metal halides (for example, calcium chloride, magnesium chloride, cesium fluoride, tantalum fluoride, cerium bromide, magnesium bromide, barium iodide, magnesium iodide, and the like), and perchlorates (for example, barium perchlorate, magnesium perchlorate, and the like). Of sulfates, metal halides and perchlorates, anhydrous salts are suitably employed.

There are casing type sealing (can sealing) and contact type sealing (solid sealing), and the solid sealing is preferable from the viewpoint of thinning. Moreover, in a case of preparing a flexible EL element, flexibility is also required in a sealing member, thus the solid sealing is preferable.

Hereinafter, a preferable embodiment for performing solid sealing will be described.

A thermosetting adhesive, an ultraviolet curing resin or the like can be used as the sealing adhesive according to the present invention. And, thermosetting adhesives such as epoxy resins, acrylic resins and silicon resins are preferably used, and epoxy-based thermosetting type adhesive resins having excellent moisture resistance and water resistance and showing low shrinkage when curing are more preferably used.

The moisture content of the sealing adhesive according to the present invention is preferably 300 ppm or less, more preferably from 0.01 to 200 ppm, and most preferably from 0.01 to 100 ppm.

The moisture content referred in the present invention may be measured by any method including, for example, a volumetric moisture meter (Karl Fischer), an infrared moisture meter, a microwave transmission type moisture meter, a heating and drying weight method, GC/MS, IR, DSC (differential scanning calorimetry), and TDS (thermal desorption spectroscopy). Moreover, it is possible to measure moisture from increased pressure caused by evaporation of moisture by use of AVM-3000 moisture analyzer (manufactured by OMNITECH CORPORATION) or the like and to measure the moisture rate of a film, a solid film or the like.

In the present invention, the moisture content of the sealing adhesive can be adjusted by placing the adhesive under a nitrogen atmosphere with a dew-point temperature of −80° C. or lower and an oxygen concentration of 0.8 ppm, and changing the period of time to be left. Moreover, the adhesive can be also dried by being placed in a vacuum of 100 Pa or less and changing the period of time to be left. In addition, although a sealing adhesive material can be dried by the adhesive alone, the material can be also previously arranged in the sealing member and dried.

In a case where the contact sealing (solid sealing) is carried out, for example, PET (polyethylene terephthalate) having a thickness of 50 μm on which an aluminum foil (a thickness of 30 μm) is laminated can be used as a sealing member. Using the above as the sealing member, the sealing adhesive is uniformly applied on the aluminum surface using a dispenser to be previously arranged, and the resin substrate and the sealing member are positioned and then pressure bonded (0.1 to 3 MPa), and contacted and bonded (adhered) at a temperature of 80 to 180° C., whereby contact sealing (solid sealing) can be achieved.

The heating or bonding time differs depending on the type and amount of the adhesive, the area of application and the like, but temporary adhesion may be carried out at a pressure of 0.1 to 3 MPa and at a temperature of 80 to 180° C., and the thermosetting time may be selected from a range of 5 seconds to 10 minutes.

It is preferred when a heated pressing roll is used because pressure bonding (temporary adhesion) and heating can be carried out simultaneously, and an internal gap can be simultaneously removed.

Moreover, as the method of forming an adhesive layer, coating methods and printing methods such as roll coating, spin coating method, screen printing method and spray coating can be used, using a dispenser, depending on the material.

As described above, the solid sealing is a form where the sealing member and the EL element substrate are covered with a cured resin with no space therebetween.

The sealing member includes metals such as stainless, aluminum and magnesium alloy, plastics such as polyethylene terephthalate, polycarbonate, polystyrene, nylon and polyvinyl chloride, and composites thereof, glass, and the like, and as necessary, particularly for a resin film, a laminated gas-barrier layer such as aluminum, aluminum oxide, silicon oxide and silicon nitride can be used, as same as the resin substrate.

The gas-barrier layer can be formed on one or both sides of the sealing member before forming the sealing member by way of sputtering, vapor deposition or the like, or may be formed on one or both sides of the sealing member after sealing by the same method. Concerning the above, it is also preferred that the oxygen permeability is $1\times10^{-3}$ ml/(m$^2$·24 h·atm) or less and the water vapor permeability (25±0.5° C., relative humidity (90±2)% RH) is $1\times10^{-3}$ g/(m$^2$·24 h) or less.

As the sealing member, a film or the like on which a metal foil such as aluminum is laminated may be used. As a method for laminating a polymer film on one side of the metal foil, a generally used lamination machine can be used. A polyurethane-based, a polyester-based, an epoxy-based or an acrylic-based adhesive or the like can be used as the adhesive. A curing agent may be used together, as necessary. Although a hot melt lamination method, an extrusion lamination method and a coextrusion lamination method can be also used, a dry lamination system is preferable.

Moreover, in a case where a metal foil is formed by sputtering, vapor deposition or the like, and the sealing member is formed from a fluid electrode material such as a conductive paste, conversely, the member may be formed by a method of using a polymer film as a base material and forming a film of a metal foil thereon.

<<Protection Film and Protection Plate>>

For the purpose of strengthening mechanical strength of the EL element, a protection film or a protection plate may be provided on a sealing film on the side facing the supporting substrate, interposing an organic function layer, or to the outside of the sealing film. Particularly, in a case where sealing is carried out by the sealing film, its mechanical strength is not necessarily high and therefore it is preferable to provide such a protection film or a protection plate. The material to be used for the above includes a glass plate, a polymer plate or film, a metal plate or film, or the like, similarly to the ones used for the sealing. However, because it is light weighted and thin, it is preferable to use a polymer film.

In the present invention, it is preferred that a light-extraction member is provided between the flexible supporting substrate and the first electrode or any position from the flexible supporting substrate to the light emitting side.

The light-extraction member includes a prism sheet, a lens sheet, and a diffusion sheet. Moreover, a diffraction grating and a diffusion structure which are introduced in an interface which causes total reflection or in any of media may also be included.

Generally, in an EL element which emits light from its substrate, part of the light emitted from the light emitting layer causes total reflection in the interface between the substrate and air, causing a problem of loss of light. In order to solve this problem, a prism or a lens-shaped processing is carried out on the surface of the substrate, or a prism sheet, a lens sheet, or a diffusion sheet is attached onto the surface of the substrate, so that the total reflection is suppressed and the light extraction efficiency is improved.

Moreover, in order to improve the light extraction efficiency, a method of introducing a diffraction grating in an interface which causes total reflection or in any of media and a method of introducing a diffusion structure have been known.

<<Production Method of EL Element>>

As one example of the methods for producing an EL element, a method of producing an EL element comprising first electrode/hole blocking layer/light emitting layer/hole transport layer/hole injection layer/second electrode will be described.

First, a desired electrode material, for example, a thin film composed of a first electrode material is formed on an appropriate base substance so as to have a film thickness of 1 µm or less and preferably from 10 to 200 nm, by a method of forming a thin film such as vapor deposition or sputtering to produce a first electrode.

Next, on the above, an organic function layer (organic compound thin film) of a hole blocking layer, a light emitting layer, a hole transport layer and a hole injection layer is formed.

The step of forming an organic function layer mainly consists of (i) a step of applying and laminating a coating liquid constituting the organic function layer on the first electrode of the supporting substrate, and (ii) a step of drying the applied and laminated coating liquid.

In the step (i), as the method of forming each layer, as described above, the vapor deposition method and a wet process (for example, a spin coating method, a casting method, a die coating method, a blade coating method, a roll coating method, an ink-jet method, a printing method, a spray coating method, a curtain coating method, an LB method (can include Langmuir-Blodgett method, and the like) or the like can be used.

In the method of producing an EL element of the present invention, the light emitting layer at least containing a quantum dot is formed by a coating system, and a form in which a coating liquid for forming the light emitting layer contains a solvent having a boiling point in the range of 100 to 150° C. is preferable.

Also in the formation of the organic function layer other than the light emitting layer, because it is easy to obtain uniform films, pin holes are not easily generated, and the like, the wet process is preferable in the present invention. Among them, a film formation by a coating method such as a spin coating method, a casting method, a die coating method, a blade coating method, a roll coating method or an ink jet method is preferable.

As a liquid medium for dissolving or dispersing the EL materials, for example, organic solvents such as ketones such as methyl ethyl ketone and cyclohexanone, fatty acid esters such as ethyl acetate, halogenated hydrocarbons such as dichlorobenzene, aromatic hydrocarbons such as toluene, xylene, mesitylene and cyclohexyl benzene, aliphatic hydrocarbons such as cyclohexane, decalin and dodecane, dimethylformamide (DMF), and dimethylsulfoxide (DMSO) can be used. Among them, a solvent having a boiling point in the range of 100 to 150° C. is preferably used. Moreover, as a dispersion method, the EL materials can be dispersed by a method such as an ultrasonic dispersion method, a high shearing force dispersion method, or a media dispersion.

In addition, it is preferred that a liquid preparation step of dissolving or dispersing the EL materials and an application step of applying the liquid on the substrate are carried out under an inert gas atmosphere. However, a film can be formed without deteriorating EL element performance even when the steps are not carried out under an inert gas atmosphere depending on the used substance, thus there are cases where the steps may not necessarily be carried out under an inert gas atmosphere. In this case, it is preferred since the production cost can be suppressed.

Here, each of layers of the organic function layer other than the light emitting layer (for example, hole transport layer, hole injection layer, and the like) is formed, the layer can be also formed by a known vapor deposition method.

In the step (ii), drying of the applied and laminated organic function layer is carried out.

The drying used herein refers that the solvent content of the film is reduced to 0.2% or less, based on 100% of the content immediately after application.

As the drying means, a general-purpose means can be used, and examples include drying under reduced pressure or pressure drying, heating drying, blast drying, IR drying, electromagnetic drying and the like. Among them, heating drying is preferable, and it is most preferable to maintain at a temperature not lower than the boiling point of the solvent having the lowest boiling point of the organic function layer coating solvents, and a temperature lower than (Tg+20° C. of the material that is the lowest Tg of Tg of the organic function layer material. In the present invention, more specifically, it is preferable to maintain and dry the organic function layer at 80° C. or more and 150° C. or less, and more preferable to maintain and dry the organic function layer at 100° C. or more and 130° C. or less.

It is preferred that the atmosphere during drying the applied and laminated coating liquid is an atmosphere in which a volume concentration of gas other than inert gas is 200 ppm or less. However, there are cases where the drying may not necessarily be carried out under an inert gas atmosphere as same as the liquid preparation and application steps. In this case, it is preferred since the production cost can be suppressed.

The inert gas is preferably a noble gas such as a nitrogen gas and an argon gas, and most preferably a nitrogen gas in the production cost.

These application and lamination and drying steps of the layers may be a single wafer production and may be a line production. Furthermore, the drying step may be carried out during carriage on the line, and also may be dried by accumulation or winding up the layers in a roll shape in a non-contact manner, from the viewpoint of productivity.

After drying these layers, a thin film composed of a second electrode material is formed thereon by, for example, a method such as vapor deposition or sputtering, so as to have a film thickness of 1 µm or less, preferably within the range of 50 nm to 200 nm, to provide a second electrode, so that a desired EL element can be obtained.

The EL element can be produced by, after the heat treatment, carrying out the contact sealing or adhering the sealing member, the electrodes and the supporting substrate with the adhesive.

<<Usage>>

The EL element of the present invention can be used as various types of light emitting sources such as a display device, a display, or a lighting.

Examples of the light emitting source include a wide range of use applications such as household lighting, lighting in a car, a backlight for a clock or a liquid crystal, a signboard advertisement, a traffic signal, a light source of an optical storage medium, a light source of an electrophotographic copy machine, a light source of an optical communication processor, a light source of an optical sensor, and further general electric home appliances which require a display unit. Particularly, the present invention can be effectively used as a backlight of a liquid crystal display device combined with a color filter or as a light source for lighting.

In the EL element of the present invention, patterning may be carried out when a film is formed, as necessary, by way of a metal masking, an ink jet printing method, or the like. When the patterning is carried out, only the electrode may be patterned, the electrode and the light emitting layer may be patterned, or the entire layers of the element may be patterned. For preparation of the element, a conventionally known method can be used.

Hereinafter, the present invention will be specifically described with reference to examples. However, the present invention is not limited thereto. The expression of "part(s)" or "%" used in the embodiment respectively represents "part(s) by mass" or "% by mass" unless otherwise indicated.

Example 1

Confirmation of Lamination Coatability of Compound of Present Invention

A quartz glass substrate was cleaned in order of ultrasonic cleaning with a surfactant and ultrapure water and ultrasonic cleaning with ultrapure water, then dried by blowing nitrogen, and finally subjected to UV ozone cleaning.

On the cleaned substrate, a solution was prepared by dissolving Exemplary Compound 15 in hexafluoroisopropanol so as to have a concentration of 0.1% by mass.

This solution was applied and dried on the quartz glass substrate using a blade coater controlled to a temperature of 65° C., so as to have a dry film thickness of about 20 nm. Thereafter, the dried film was heat-treated with a hot air at 100° C. for 2 minutes, to forma coating film of Exemplary Compound 15.

Figure 2:
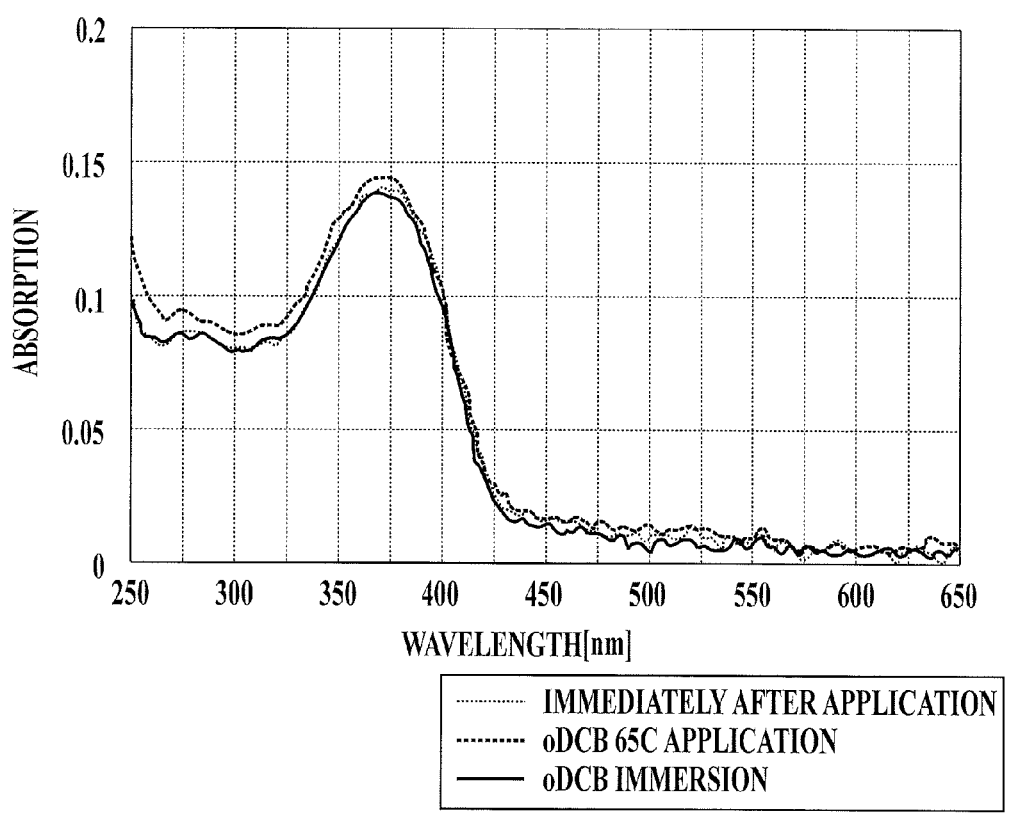
FIG. 2 is a view showing a schematic absorption spectrum of a polymer having an amino group (Exemplary Compound 15).

In FIG. 2, the spectrum of this coating film is a spectrum with a thin dotted-line (immediately after application). In addition, the spectrum of the film obtained by applying again only o-dichlorobenzene on this coating film is a spectrum with a bold dotted-line (oDCB 65C application), and the spectrum of the film obtained by immersing this coating film in o-dichlorobenzene for 1 minute is a spectrum with a solid line (oDCB immersion).

Based on the result shown in FIG. 2, it is shown that the coating film of the conjugated polymer compound (Exemplary Compound 15) according to the present invention does not dissolve in o-dichlorobenzene generally used for applying a light emitting layer and a photoelectric conversion layer. Therefore, it is considered that, according to a method of applying a light emitting layer and a photoelectric conversion layer on this coating film, the coating film can be easily formed on the light emitting layer and the photoelectric conversion layer without being mutually mixed.

Example 2

Preparation of Blue Light Emitting EL Element (1) Preparation of Comparative Example Sample 1
(1.1) Preparation of Gas-Barrier Flexible Film As a flexible film, a gas barrier film of an inorganic matter made of SiOx was formed successively on the flexible film, on the entire surface of the side in which a first electrode of a polyethylene naphthalate film (a film manufactured by Teijin DuPont Films Japan Limited, hereinafter abbreviated as PEN) was formed so as to have a thickness of 500 nm, using an atmospheric pressure plasma discharge treatment device comprising the constitution described in Japanese Patent Application Laid Open Publication No. 2004-68143, to prepare a gas barrier flexible film having an oxygen permeability of 10E-4 ml/m$^2$/day or less and a water vapor permeability of 10E-4 g/m$^2$/day or less.

(1.2) Formation of First Electrode

A film was formed with ITO (indium tin oxide) having a thickness of 120 nm on the prepared gas barrier flexible film by a sputtering method, and patterning is carried out by a photolithography method to form a first electrode (cathode). Here, the pattern to have a light emitting area of 50 mm square was used.

(1.3) Formation of Hole Blocking Layer

The hole blocking layer was prepared according to the method described in J. Am. Chem. Soc 2010,132, PP 17381 to 17383. However, calcination at 300° C. used herein is impossible for a PEN substrate, thus it was changed to calcination at 120° C. that is a heatable maximum temperature of the PEN substrate.

More specifically, the ITO substrate after the patterning was cleaned ultrasonically with isopropyl alcohol, and dried by dry nitrogen gas, and subjected to UV ozone cleaning for 5 minutes. On this substrate, a film was formed with a liquid for forming a sol-gel ZnO prepared by the following method by a spin coating method at 2000 rpm for 30 seconds, then the film was calcined at 120° C. for 5 minutes, so that a hole blocking layer having a film thickness of 30 nm composed of ZnO was provided.

<Preparation of Liquid for Forming Sol-Gel ZnO>

Anhydrous zinc acetate (manufactured by Sigma-Aldrich Co. LLC., 99.999% grade) 157 parts by mass
2-Methoxyethanol 960 parts by mass
Ethanol amine 40 parts by mass (1.4) Formation of Light Emitting Layer Subsequently, a film was each formed with a light emitting layer composition having the following composition and the composition diluted twice with the same solvent by a spin coating method at 1500 rpm for 30 seconds, then maintained at 120° C. for 30 minutes to each form a light emitting layer having a film thickness of 40 nm.

<Light-Emitting Layer Composition>

Quantum Dot (Trilite (Registered Trademark) 450 manufactured by Cytodiagnostics Inc., 450 nm light emission) 3.0 parts by mass
Toluene 2000 parts by mass (1.5) Formation of Hole Transport Layer, Hole Injection Layer and Second Electrode Subsequently, the substrate was attached to a vacuum deposition equipment without exposing the substrate to air. Moreover, a molybdenum resistance heating boat in which Spiro-TPD, H-121 (TCTA) and F4-TCNQ were placed was attached to the vacuum deposition equipment, and the vacuum tank was depressurized to 4×10$^{-5}$ Pa. Then, the boat was energized to heat, and a hole transport layer having a film thickness of 60 nm was formed on the light emitting layer with Spiro-TPD at 0.02 nm/second, subsequently, a hole injection layer having a film thickness of 10 nm was formed on the hole transport layer with H-121 and F4-TCNQ at 0.02 nm/second and 0.005 nm/second, respectively, in the same manner.

Subsequently, a second electrode (anode) having a thickness of 100 nm was formed by vapor deposition of aluminum.

[Chemical Formula 69]

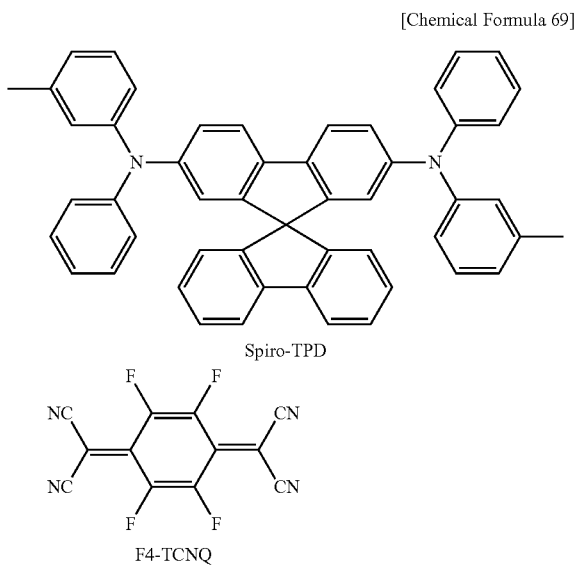

Spiro-TPD

F4-TCNQ (1.6) Sealing and Preparation of EL Element

Subsequently, the sealing member was adhered using a commercially available roll lamination device to prepare Comparative Example Sample 1 (EL element).

Here, as the sealing member, a flexible aluminum foil having a thickness of 30 μm (manufactured by Toyo Aluminum K. K.) to which a polyethylene terephthalate (PET) film (having a thickness of 12 μm) had been laminated using an adhesive for dry lamination (two-liquid reaction type urethane-based adhesive) (thickness of the adhesive layer of 1.5 μm) was used.

On the aluminum surface, a thermosetting adhesive was applied uniformly as a sealing adhesive to have a thickness of 20 μm along the adhesive surface (a glazed surface) of the aluminum foil using a dispenser. The foil was dried under vacuum of 100 Pa or less for 12 hours. Further, the foil was moved to a nitrogen atmosphere with a dew point temperature of −80° C. or lower and an oxygen concentration of 0.8 ppm to be dried for 12 hours or more, so that the moisture content of the sealing adhesive is 100 ppm or less.

As the thermo-setting adhesive, an epoxy-based adhesive in which the following (A) to (C) were mixed was used.
(A) Bisphenol A diglycidyl ether (DGEBA)
(B) Dicyandiamide (DICY)
(C) Epoxy adduct-based curing promoter As described above, a sealing substrate was taken out, contacted and disposed so as to cover a joint part of the electrode and electrode lead, and contact sealing was carried out using a pressing roll, under pressing conditions of a pressing roll temperature of 120° C., a pressure of 0.5 MPa, and a device rate of 0.3 m/min, so as to have the embodiment of FIG. 1, to prepare Comparative Example Sample 1 (EL element).

(2) Preparation of Comparative Example Sample 2

In the "Preparation of Comparative Example Sample 1" described above, a hole blocking layer was formed using zinc oxide nanoparticles synthesized by the following method.

Comparative Example Sample 2 was obtained in the same manner as described above except that.

<Synthesis of Zinc Oxide Nanoparticles>

Zinc oxide nanoparticles were synthesized with reference to Angew. Chem. Int. Ed. 2002, 41, No. 7, p 1188.

A solution prepared by dissolving potassium hydroxide in 65 ml of 30 mM methanol at 60° C. was added to 125 ml of a 10 mM solution of zinc acetate dihydrate maintained at 60° C., and yielded a white turbidity, then the mixture was refluxed to be colorless and transparent and then refluxed for 3 hours, and left at room temperature for 4 hours. The supernatant was decanted, then 100 ml of methanol was again added thereto, and the mixture was left for 16 hours. The supernatant was again decanted, and instantly chlorobenzene was added thereto to adjust the amount to 18 ml to obtain an about 50 mg/ml ZnO nanoparticle dispersion.

Thereafter, on the substrate obtained in the (1.1) described above, a film was formed with the zinc oxide nanoparticle solution by a spin coating method at 3000 rpm for 30 seconds, then the film was dried at 120° C. for 10 minutes, to provide a hole blocking layer having a film thickness of 30 nm.

After that, the same procedures were carried out as in Comparative Example Sample 1 up to sealing to prepare Comparative Example Sample 2.

(3) Preparation of Example Samples 11 to 27 and 31

In the "Preparation of Comparative Example Sample 1" described above, Example Samples 11 to 27 and 31 were prepared each using the materials described below as a coating liquid of the hole blocking layer, and changing the calcination conditions (calcination temperature and calcination time) to the conditions described below.

In Example Samples 20 to 27 and 31, a host compound (refer to Table 2) was also used in addition to quantum dots to form a light emitting layer. The amount of the host compound added is 7.0 parts by mass in 2000 parts by mass of toluene.

In Example Sample 31, polyethylene terephthalate (PET) was used in place of PEN, as a flexible film, and the kind of quantum dots (refer to Table 2) in the light-emitting layer was changed.

In Example Samples 13 to 27 and 31, in the formation of the hole blocking layer, there were synthesized Exemplary Compound 1 according to J. Am. Chem. Soc. 2011, 133, 8416, Exemplary Compound 2 according to Adv. Mater., 2011, 23, p 3086, Exemplary Compound 3 according to J. Am. Chem. Soc. 2011, 133, 8416, and Exemplary Compound 11 according to Adv. Mater. 2007, 19, 2010.

Exemplary Compounds 10 and 15 were synthesized as described below.

Production Example 1: Synthesis of Exemplary Compound 10

Exemplary Compound 10 was synthesized by the following reaction.

[Chemical Formula 70]

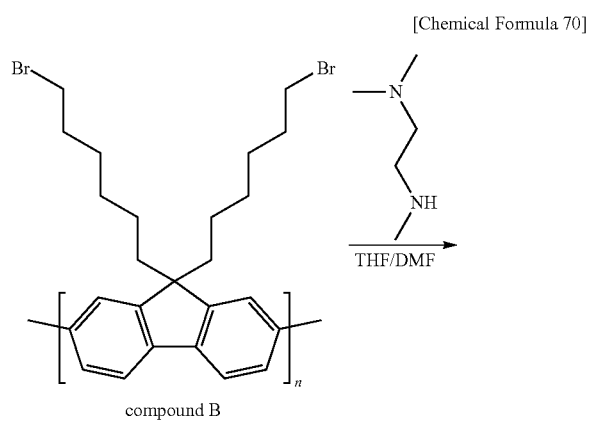

compound B

[Chemical Formula 71]

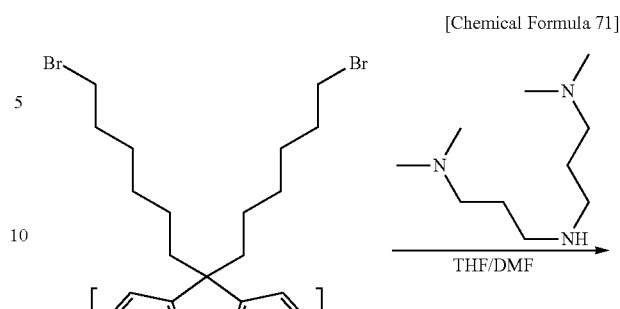

compound B

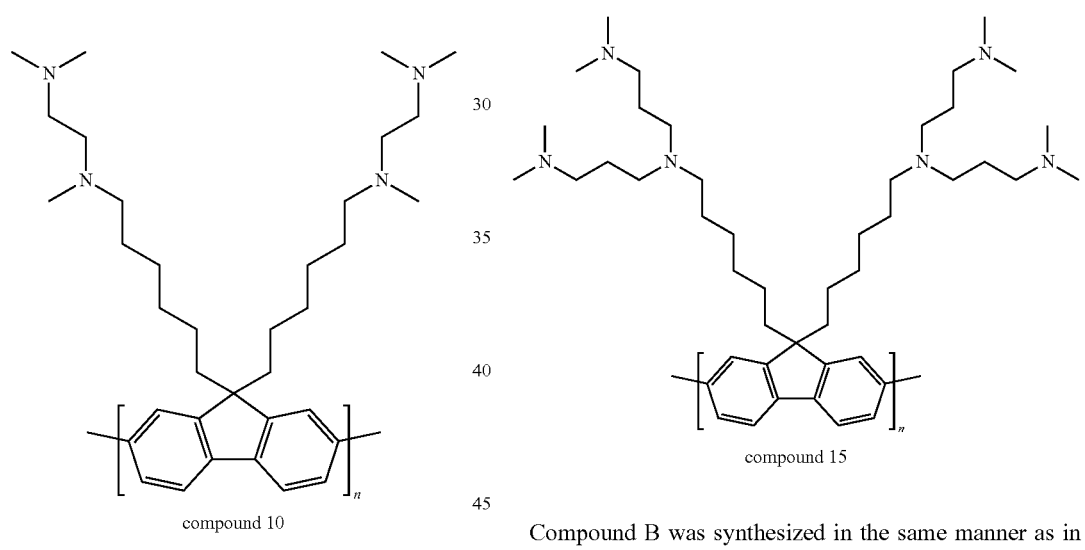

compound 10 compound 15

Compound B was synthesized with reference to Adv. Mater. 2007, 19, 2010. The weight average molecular weight of Compound B was 4400. 1.0 g of Compound B and 5.5 g of N,N,N'-trimethylethylenediamine (manufactured by Sigma-Aldrich Co. LLC.) were dissolved in a mixed solvent of 100 ml of tetrahydrofuran and 100 ml of N,N-dimethylformamide, and the solution was stirred at room temperature (25° C.) for 48 hours to carry out a reaction. After the completion of the reaction, the solvent was distilled off under reduced pressure, and the residue was further redeposited in water to obtain 1.0 g of Exemplary Compound 10 (yield 90%).

Production Example 2: Synthesis of Exemplary Compound 15

Exemplary Compound 15 was synthesized by the following reaction.

Compound B was synthesized in the same manner as in Production Example 1. 1.0 g of Compound B and 9.0 g of 3,3'-iminobis(N,N-dimethylpropylamine) (manufactured by Sigma-Aldrich Co. LLC.) were dissolved in a mixed solvent of 100 ml of tetrahydrofuran and 100 ml of N,N-dimethylformamide, and the solution was stirred at room temperature (25° C.) for 48 hours to carry out a reaction. After the completion of the reaction, the solvent was distilled off under reduced pressure, and the residue was further redeposited in water to obtain 1.3 g of Exemplary Compound 15 (yield 90%).

As to the obtained compound, the structure was specified by H-NMR. The result is shown below. 7.6 to 8.0 ppm (br), 2.88 ppm (br), 2.18 ppm (m), 2.08 ppm (s), 1.50 ppm (m), 1.05 ppm (br).

(3.1) Example Sample 11 n-butanol:PEI (polyethyleneimine):DEG (polyfunctional epoxy, 2 or 3 substituent of trimethylolpropane triglycidyl ether)=100:0.2:0.1

Calcination conditions; 100° C., 3 minutes

[Chemical Formula 72]

PEI

DEG (3.2) Example Sample 12
n-butanol:2-aminoethyl-2-aminopropyltrimethoxysilane (AEAPTMS)=100:0.3

AEAPTMS itself is a low molecular compound, but a trimethoxysilane group reacts by catalytic effects of moisture, amino group and the like during application and baking in the air, thus a polymeric insoluble layer can be formed.

Calcination conditions; 100° C., 3 minutes (3.3) Example Samples 13 to 27 and 31
TFPO (tetrafluoropropanol):compounds listed in Table 1 and Table 2=100:0.3
Calcination conditions; 70° C., 30 seconds

[Chemical Formula 73]

CBP

<<Evaluation of EL Element>>
As to Comparative Example Samples 1 to 2 and Example Samples 11 to 27 and 31, each of the following evaluations was performed.

(1) Evaluation of Coatability

The calcination temperature (film forming temperature) and calcination time (drying and baking time) of the coating liquid in forming the hole blocking layer were evaluated under the following criteria, from the viewpoint of productivity.

<Calcination Temperature>
Excellent: 70° C. or lower
Good: 100° C. or lower
Fair: 120° C. or lower
Poor: 121° C. or higher <Drying and Baking Time>
Excellent: 30 seconds or less
Good: 1 minute or less
Fair: 3 minutes or less
Poor: 3 minutes or more (2) Measurement of Light Emission Efficiency As to each sample, the light emission efficiency was measured by lighting under the constant current condition of 2.5 mA/cm$^2$, at room temperature (about 23 to 25° C.), using a spectroradiometer CS-2000 (manufactured by Konica Minolta Sensing, Inc.).

In Table 3, based on 1.00 of the light emission efficiency of Comparative Example Sample 2, the light emission efficiency of other sample is indicated by a relative value. It shows that, the larger the numeric value, the more excellent the light emission efficiency. Comparative Example Sample 1 did not emit light.

(3) Evaluation of Continuous Driving Stability (Lifetime)

Each sample was continuously driven, and the luminance was measured using the spectroradiometer CS-2000 to obtain the time when the measured luminance was 70% (LT70). The driving condition was set to the current value such that the luminance was 1000 cd/m$^2$ at the start of continuous driving.

The relative value was obtained based on 1.00 of the LT70 of Comparative Example Sample 2, and this value was used as the measure of continuous driving stability.

In Table 3, it shows that, the larger the numeric value, the more excellent the continuous driving stability (has long lifetime).

TABLE 1

| SAMPLE | SUBSTRATE | FIRST ELECTRODE (CATHODE) | HOLE BLOCKING LAYER | | LIGHT-EMITTING LAYER (LIGHT EMISSION WAVELENGTH) | HOLE TRANSPORT LAYER | HOLE INJECTION LAYER | SECOND ELECTRODE (ANODE) | CONSTITUTION |
|---|---|---|---|---|---|---|---|---|---|
| | | | TYPE | LAYER THICKNESS | | | | | |
| 1 | PEN | ITO | ZnO (SOL-GEL) | 30 nm | Trilite 450 (450 nm) | spiro-TPD | H-121:F4-TCNQ = 4:1 | Al | REVERSE LAYER |
| 2 | | | ZnO (NANOPARTICLES) | | | | | | |
| 11 | PEN | ITO | PEI:DEG | 5 nm | Trilite 450 (450 nm) | spiro-TPD | H-121:F4-TCNQ = 4:1 | Al | REVERSE LAYER |
| 12 | | | AEAPTMS | | | | | | |
| 13 | PEN | ITO | EXEMPLARY COMPOUND 1 | 5 nm | Trilite 450 (450 nm) | spiro-TPD | H-121:F4-TCNQ = 4:1 | Al | REVERSE LAYER |
| 14 | | | EXEMPLARY COMPOUND 2 | | | | | | |
| 15 | | | EXEMPLARY COMPOUND 3 | | | | | | |

TABLE 1-continued

| SAMPLE | SUBSTRATE | FIRST ELECTRODE (CATHODE) | HOLE BLOCKING LAYER TYPE | LAYER THICKNESS | LIGHT-EMITTING LAYER (LIGHT EMISSION WAVELENGTH) | HOLE TRANSPORT LAYER | HOLE INJECTION LAYER | SECOND ELECTRODE (ANODE) | CONSTITUTION |
|---|---|---|---|---|---|---|---|---|---|
| 16 | | | EXEMPLARY COMPOUND 10 | | | | | | |
| 17 | | | EXEMPLARY COMPOUND 13 | | | | | | |
| 18 | | | EXEMPLARY COMPOUND 15 | | | | | | |
| 19 | | | EXEMPLARY COMPOUND 11 | | | | | | |

TABLE 2

| SAMPLE | SUBSTRATE | FIRST ELECTRODE (CATHODE) | HOLE BLOCKING LAYER TYPE | LAYER THICKNESS | LIGHT-EMITTING LAYER (LIGHT EMISSION WAVELENGTH) | HOLE TRANSPORT LAYER | HOLE INJECTION LAYER | SECOND ELECTRODE (ANODE) | CONSTITUTION |
|---|---|---|---|---|---|---|---|---|---|
| 20 | PEN | ITO | EXEMPLARY COMPOUND 15 | 5 nm | CBP Trilite 450 (450 nm) | spiro-TPD | H-121:F4-TCNQ = 4:1 | Al | REVERSE LAYER |
| 21 | | | | | H-212 Trilite 450 (450 nm) | | | | |
| 22 | | | | | H-211 Trilite 450 (450 nm) | | | | |
| 23 | | | | | H-73 Trilite 450 (450 nm) | | | | |
| 24 | | | | | H-210 Trilite 450 (450 nm) | | | | |
| 25 | PEN | ITO | EXEMPLARY COMPOUND 15 | 5 nm | H-115 Trilite450 (450 nm) | spiro-TPD | H-121:F4-TCNQ = 4:1 | Al | REVERSE LAYER |
| 26 | | | | 2 nm | | | | | |
| 27 | | | | 10 nm | | | | | |
| 31 | PET | ITO | EXEMPLARY COMPOUND 15 | 5 nm | H-73 Trilite 500 (550 nm) Trilite 650 (650 nm) | spiro-TPD | H-121:F4-TCNQ = 4:1 | Al | REVERSE LAYER |

TABLE 3

| SAMPLE | COATABILITY CALCINATION TEMPERATURE | CALCINATION TIME | LIGHT EMISSION EFFICIENCY | LT70 | REMARK |
|---|---|---|---|---|---|
| 1 | △ | X | 0.00 | 0.00 | COMPARATIVE EXAMPLE |
| 2 | △ | X | 1.00 | 1.00 | |
| 11 | ○ | △ | 1.04 | 1.25 | EXAMPLE |
| 12 | ○ | △ | 1.01 | 1.17 | |
| 13 | ◎ | ◎ | 1.24 | 1.21 | EXAMPLE |
| 14 | ◎ | ◎ | 1.1 | 1.33 | |
| 15 | ◎ | ◎ | 1.19 | 1.23 | |
| 16 | ◎ | ◎ | 1.42 | 1.51 | |
| 17 | ◎ | ◎ | 1.33 | 1.31 | |
| 18 | ◎ | ◎ | 1.72 | 1.85 | |
| 19 | ◎ | ◎ | 1.75 | 1.77 | |
| 20 | ◎ | ◎ | 2.21 | 2.11 | EXAMPLE |
| 21 | ◎ | ◎ | 2.46 | 2.63 | |
| 22 | ◎ | ◎ | 2.87 | 3.06 | |
| 23 | ◎ | ◎ | 3.12 | 3.22 | |
| 24 | ◎ | ◎ | 2.9 | 3.01 | |
| 25 | ◎ | ◎ | 3.53 | 3.78 | EXAMPLE |
| 26 | ◎ | ◎ | 3.41 | 2.75 | |
| 27 | ◎ | ◎ | 2.77 | 2.94 | |
| 31 | ◎ | ◎ | 10.2 | 10.7 | EXAMPLE |

(3) Summary

As shown in Table 3, in Example Samples 11 to 27 and 31, it is clear that a film can be formed at very low temperature and high rate, as compared to the hole blocking layer composed of a known metal oxide. Also, the element obtained using the hole blocking layer has sufficiently high light emitting luminance (light emission efficiency) even on the plastic substrate, and the lifetime is also improved. In addition, it can be seen that these characteristics can be further improved by containing a specific host compound in the light emitting layer.

Based on the results described above, in order to increase the efficiency and prolong the lifetime of an electroluminescence element containing quantum dots, it can be seen as useful that the hole blocking layer as disclosed in the present invention is used, and further the wavelength of the 0-0 transition band in a phosphorescence spectrum as the host compound of the light emitting layer containing quantum dots is controlled to a certain range.

Example 3

Preparation of White Light Emitting EL Element (1) Preparation of Comparative Example Sample 41

Sample 41 was prepared with reference to Patent Document 3.

(1.1) Formation of First Electrode

A film was formed with ITO (indium tin oxide) having a thickness of 120 nm on the prepared white plate glass substrate having a thickness of 0.5 mm by a sputtering method, and patterning was carried out by a photolithography method to form a first electrode layer (anode). Here, the pattern to have a light emitting area of 50 mm square was used.

(1.2) Formation of Hole Blocking Layer

A film was formed with the zinc oxide nanoparticle solution used in "Preparation of Comparative Example Sample 2" of Example 2 by a spin coating method at 3000 rpm for 30 seconds, then the film was dried at 120° C. for 10 minutes to provide a hole blocking layer having a film thickness of 30 nm.

(1.3) Formation of First Light Emitting Layer

Subsequently, a film was each formed with a light emitting layer composition having the following composition and the composition diluted twice with the same solvent by a spin coating method at 1500 rpm for 30 seconds, then maintained at 120° C. for 30 minutes to each form a light emitting layer having a film thickness of 40 nm.

<Quantum Dot Light Emitting Layer Composition>

Quantum dot (Trilite (registered trademark) 450 manufactured by Cytodiagnostics Inc., 450 nm light emission) 3.0 parts by mass Exemplary Compound H-115 7.0 parts by mass Toluene 2000 parts by mass (1.4) Formation of Intermediate Layer Subsequently, the substrate was attached to a vacuum deposition equipment without exposing the substrate to air. Moreover, a molybdenum resistance heating boat in which H-73 was placed was attached to the vacuum deposition equipment, and the vacuum tank was depressurized to $4 \times 10^{-5}$ Pa. Then, the boat was energized to heat, and an intermediate layer composed of H-73 having a thickness of 20 nm was formed.

(1.5) Formation of Second Light Emitting Layer

Subsequently, a second light emitting layer was formed in a film thickness of 30 nm by adjusting the vapor deposition rate so as to have the following ratio.

Iridium complex G: 4.0 parts by mass
Iridium complex R: 1.0 parts by mass
Host compound H-73: 92 parts by mass
Iridium complex G;

[Chemical Formula 74]

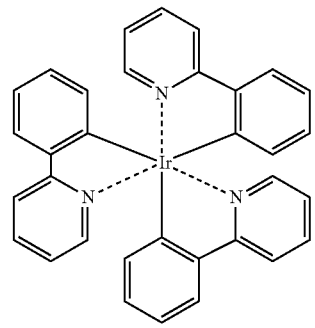

Iridium complex R;

[Chemical Formula 75]

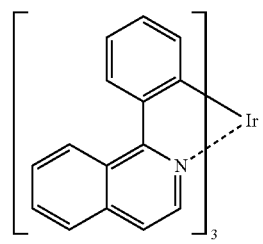

(1.6) Formation of Hole Transport Layer, Hole Injection Layer and Second Electrode Subsequently, the substrate was attached to a vacuum deposition equipment without exposing the substrate to air. Moreover, a molybdenum resistance heating boat in which Spiro-TPD, H-121 and F4-TCNQ were placed was attached to the vacuum deposition equipment, and the vacuum tank was depressurized to $4 \times 10^{-5}$ Pa. Then, the boat was energized to heat, and a hole transport layer having a film thickness of 60 nm was formed on the light emitting layer with Spiro-TPD at 0.02 nm/second, subsequently, a hole injection layer having a film thickness of 10 nm was formed on the hole transport layer with H-121 (TCTA) and F4-TCNQ at 0.02 nm/second and 0.005 nm/second, respectively, in the same manner.

Subsequently, an anode having a thickness of 100 nm was formed by vapor deposition of aluminum.

(1.7) Sealing and Preparation of White Electric Field Light Emitting Device

Subsequently, the substrate was taken out from the vacuum deposition equipment without exposing the substrate to air, and sealed using a glass cap and an epoxy-based adhesive as a thermo-setting adhesive in a glove box to prepare Comparative Example Sample 41.

As the thermo-setting adhesive, an epoxy-based adhesive in which the following (A) to (C) were mixed was used.

(A) Bisphenol A diglycidyl ether (DGEBA)
(B) Dicyandiamide (DICY)
(C) Epoxy adduct-based curing promoter (2) Preparation of Example Samples 42 to 44

In the "Preparation of Comparative Example Sample 41" described above, Example Samples 42 to 44 were prepared each using the materials described below as a coating liquid of the hole blocking layer.

(2.1) Example Sample 42 n-butanol:PEI (polyethyleneimine):DEG (polyfunctional epoxy, 2 or 3 substituent of trimethylolpropane triglycidyl ether)=100:0.2:0.1

(2.2) Example Sample 43 n-butanol:2-aminoethyl-2-aminopropyltrimethoxysilane=100:0.3

(2.3) Example Sample 44

TFPO (tetrafluoropropanol):Exemplary Compound 15=100:0.3

(3) Preparation of Comparative Example Sample 45 and Example Samples 46 to 48

In the "Preparation of Comparative Example Sample 41" described above, the same procedures were carried out except for changing the composition in the formation of the second light emitting layer to the following composition to prepare Comparative Example Samples 45.

In the "Preparation of Example Samples 42 to 44" described above, the same procedures were carried out except for changing the composition in the formation of each of the second light emitting layer to the following composition to prepare Example Samples 46 to 48.

Iridium complex D-90 (B): 7.6 parts by mass
Iridium complex G: 0.3 parts by mass
Iridium complex R: 0.1 parts by mass
Host compound H-73: 92 parts by mass (4) Preparation of Example Sample 49 (Tandem Element)

In the "Preparation of Example Sample 48" described above, the same procedures were carried out except for changing the composition in the formation of the intermediate layer to the charge generating layer described below to prepare Example Sample 49.

<Charge Generating Layer>

First layer (hole transport layer) Spiro-TPD, thickness of 20 nm

Second layer (p-type layer) H-121:F4-TCNQ=100:10, thickness of 5 nm

Third layer (metal layer) aluminum, thickness of 1 nm

Fourth layer (n-type layer) BPhen:Alq3:lithium=49:49:2, thickness of 40 nm

[Chemical Formula 76]

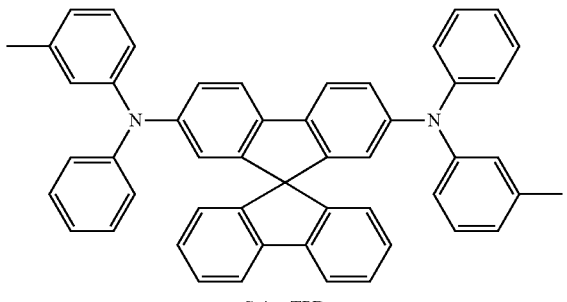

Spiro-TPD

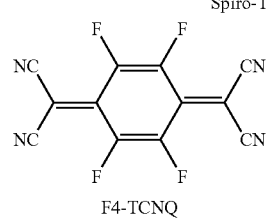

F4-TCNQ

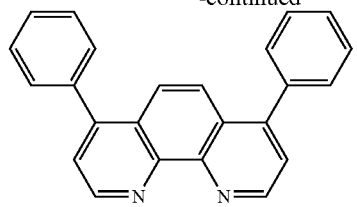

Bphen

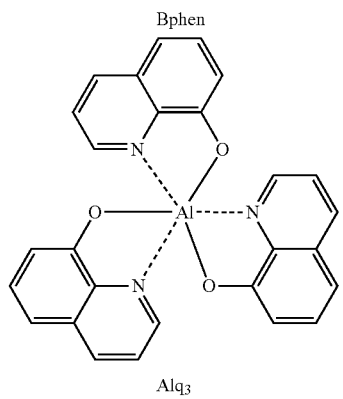

Alq3

<<Evaluation of EL Element>>

As to Comparative Example Samples 41 and 45 and Example Samples 42 to 44, 46 to 48 and 49, each of the following evaluations was performed.

(1) Measurement of Color Temperature and Color Rendering Properties

As to each sample, the light emitting luminance was measured at room temperature (about 23 to 25° C.), using a spectroradiometer CS-2000 (manufactured by Konica Minolta Sensing, Inc.), and the color temperature and color rendering properties at a light emitting luminance of 1000 cd/m$^2$ were evaluated. The evaluation criteria are as described below.

<Color Temperature>
Excellent: 5000 K or higher
Good: lower than 5000 K
Fair: lower than 4000 K
Poor: lower than 3000 K <Color Rendering Properties>
Excellent: 85 or more
Good: less than 85
Fair: less than 75
Poor: less than 65

(2) Measurement of Light Emission Efficiency

Each sample was made to emit light under the constant current condition of 2.5 mA/cm$^2$, at room temperature (about 23° C.), and the light emission efficiency L immediately after light emission start was measured using a spectroradiometer CS-2000 (manufactured by Konica Minolta Sensing, Inc.).

Subsequently, the relative light emitting luminance was obtained based on 1.00 of the light emitting luminance of Comparative Example Sample 41 was obtained, and this value was used as the measure of initial light emission efficiency (external extraction quantum efficiency). It shows that, the larger the numeric value, the more excellent the light emission efficiency.

(3) Evaluation of Continuous Driving Stability (Lifetime)

Each sample was continuously driven, and the luminance was measured using the spectroradiometer CS-2000 to obtain the time when the measured luminance was 70%

(LT70). The driving condition was set to the electric current value such that the luminance was 4000 cd/m² at the start of continuous driving.

The relative value was obtained based on 1.00 of the LT70 of Comparative Example Sample 41, and this value was used as the measure of continuous driving stability. It shows that, the larger the numeric value, the more excellent the continuous driving stability (has long lifetime).

Based on the results described above, in order to increase the efficiency and prolong the lifetime of a white light emitting electroluminescence element containing quantum dots, it can be seen as useful that the hole blocking layer as disclosed in the present invention is used, and further that the light emitting layer is contained not only the quantum dot compound, but also the specific phosphorescent light emitting compound.

TABLE 4

| *1 | SUB-STRATE | FIRST ELECTRODE (CATHODE) | HOLE BLOCKING LAYER | | | INTER-MEDIATE LAYER | *3 | HOLE TRANS-PORT LAYER | HOLE INJEC-TION LAYER | SECOND ELEC-TRODE (ANODE) |
|---|---|---|---|---|---|---|---|---|---|---|
| | | | TYPE | LAYER THICK-NESS | *2 | | | | | |
| 41 | GLASS | ITO | ZnO (NANOPAR-TICLES) | 30 nm | H-115 Trilite 450 (450 nm) | H-73 | H-73 COMPLEX G COMPLEX R | spiro-TPD | H-121:F4-TCNQ = 4:1 | Al |
| 42 43 44 | GLASS | ITO | PEI:DEG AEAPTMS EXEMPLARY COMPOUND 15 | 5 nm | H-115 Trilite 450 (450 nm) | H-73 | H-73 COMPLEX G COMPLEX R | spiro-TPD | H-121:F4-TCNQ = 4:1 | Al |
| 45 | GLASS | ITO | ZnO (NANOPAR-TICLES) | 30 nm | H-115 Trilite 450 (450 nm) | H-73 | H-73 D-90 COMPLEX G COMPLEX R | spiro-TPD | H-121:F4-TCNQ = 4:1 | Al |
| 46 47 48 | GLASS | ITO | PEI:DEG AEAPTMS EXEMPLARY COMPOUND 15 | 5 nm | H-115 Trilite 450 (450 nm) | H-73 | H-73 D-90 COMPLEX G COMPLEX R | spiro-TPD | H-121:F4-TCNQ = 4:1 | Al |
| 49 | GLASS | ITO | EXEMPLARY COMPOUND15 | 5 nm | H-115 Trilite 450 (450 nm) | CHARGE GENERATING LAYER | H-73 D-90 COMPLEX G COMPLEX R | spiro-TPD | H-121:F4-TCNQ = 4:1 | Al |

*1: SAMPLE
*2: FIRST LIGHT-EMITTING LAYER (LIGHT EMISSION WAVELENGTH)
*3: SECOND LIGHT-EMITTING LAYER

TABLE 5

| SAMPLE | COLOR TEMPER-ATURE | COLOR REN-DERING PROPER-TIES | LIGHT EMISSION EFFI-CIENCY | LT70 | REMARK |
|---|---|---|---|---|---|
| 41 | Δ | X | 1.00 | 1.00 | COMPAR-ATIVE EXAMPLE |
| 42 | ○ | Δ | 1.85 | 2.3 | EXAMPLE |
| 43 | ○ | Δ | 1.48 | 19 | |
| 44 | ○ | ○ | 2.32 | 3.3 | |
| 45 | Δ | Δ | 1.12 | 0.78 | COMPAR-ATIVE EXAMPLE |
| 46 | ○ | ◎ | 2.12 | 3.5 | EXAMPLE |
| 47 | ○ | ○ | 2.25 | 2.9 | |
| 48 | ◎ | ◎ | 2.75 | 4.4 | |
| 49 | ◎ | ◎ | 2.51 | 5.7 | EXAMPLE |

(4) Summary

As shown in Table 5, in Example Samples 42 to 44, 46 to 48 and 49, the light emission efficiency is sufficiently high and the lifetime is also improved, as compared to the hole blocking layer composed of a known metal oxide. In addition, it can be seen that a specific phosphorescent light emitting compound is contained in the second light emitting layer, whereby not only these characteristics can be further improved, but also the color rendering properties and the color temperature are enhanced.

INDUSTRIAL APPLICABILITY

The present invention is utilized to provide an electroluminescence element having a high light emission efficiency and long lifetime, and further can be suitably utilized to provide an electroluminescence element having excellent productivity (calcination temperature, calcination time, and the like) on a plastic film.

EXPLANATION OF REFERENCE NUMERALS

2 First electrode
8 Second electrode
9 Sealing adhesive
10 Flexible sealing member
20 Organic function layer
21 Hole blocking layer (Intermediate layer)
22 Light emitting layer
23 Hole transport layer
24 Hole injection layer
30 Quantum dot
100 EL element

The invention claimed is:
1. An electroluminescence element, comprising at least a first electrode, a light emitting layer, and a second electrode which are laminated on a substrate,
wherein the light emitting layer contains quantum dots and is disposed between the first electrode and the second electrode, and an intermediate layer including a nitrogen atom-containing polymer is disposed between the first electrode and the light emitting layer or between the light emitting layer and the second electrode, wherein the intermediate layer is a hole blocking layer and the nitrogen atom-containing polymer is a hole-blocking material, wherein the nitrogen atom-containing polymer has a structural unit represented by a general formula (A) (including a salt form) as a main chain,

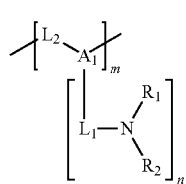

general formula(A)

wherein, n represents 1 or 2, m represents 2 to 1000,

A1 represents a nitrogen atom, a carbon atom or a silicon atom,

L1 and L2 represent a bivalent linking group selected from an alkylene group having 1 to 20 carbon atoms, a cycloalkylene group having 3 to 20 carbon atoms, an arylene group having 6 to 30 carbon atoms, a heteroarylene group having 1 to 30 carbon atoms, a alkyleneoxy group having 1 to 20 carbon atoms, or a combination thereof, and R1 and R2 each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

2. The electroluminescence element according to claim 1, wherein the compound having a structural unit represented by the general formula (A) as a main chain is a neutral compound.

3. The electroluminescence element according to claim 1, wherein the structural unit represented by the general formula (A) is represented by a general formula (B),

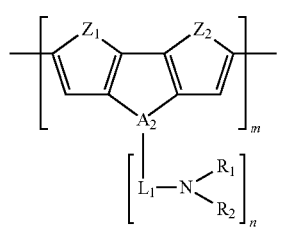

general formula(B)

wherein n represents 1 or 2, m represents 2 to 1000,

A2 represents a nitrogen atom, a carbon atom or a silicon atom,

Z1 and Z2 each independently represent —C(R3)=C(R4)-, —C(R5)=N—, —O—, or —S—,

L1 represents a bivalent linking group selected from an alkylene group having 1 to 20 carbon atoms, a cycloalkylene group having 3 to 20 carbon atoms, an arylene group having 6 to 30 carbon atoms, a heteroarylene group having 1 to 30 carbon atoms, an alkyleneoxy group having 1 to 20 carbon atoms, or a combination thereof, and R1 to R5 each independently represent a hydrogen atom, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 1 to 30 carbon atoms.

4. The electroluminescence element according to claim 3, wherein, in the general formula (B), Z1 and Z2 each represent —CH=CH—.

5. The electroluminescence element according to claim 3, wherein, in the general formula (B), A2 represents a carbon atom.

6. The electroluminescence element according to claim 3, wherein, in the general formula (B), R1 and R2 both represent an alkyl group.

7. The electroluminescence element according to claim 1, wherein the intermediate layer has a layer thickness in a range of 2 to 10 nm.

8. The electroluminescence element according to claim 1, wherein the intermediate layer is formed between the first electrode and the light emitting layer.

9. The electroluminescence element according to claim 1, wherein the light emitting layer contains at least one type of host compound and at least one type of quantum dot, and a light emitting maximum wavelength assigned to 0-0 transition band in a phosphorescence spectrum of the host material is in a wavelength region of 414 to 459 nm.

10. The electroluminescence element according to claim 9, wherein the quantum dot has an average particle size in a range of 1 to 20 nm.

11. The electroluminescence element according to claim 9, wherein the quantum dot includes Si, Ge, GaN, GaP, CdS, CdSe, CdTe, InP, InN, ZnS, $In_2S_3$, ZnO, CdO, CuInS, CuInSe, CuInGaSe or mixtures thereof.

12. The electroluminescence element according to claim 9, wherein the host compound has a molecular weight of 500 to 1000.

13. The electroluminescence element according to claim 9, wherein the host compound is represented by a general formula (1),

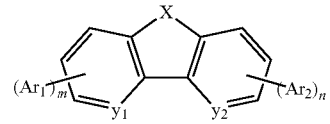

general formula(1)

wherein X represents NR', O, S, CR'R", or SiR'R", y1 and y2 represent CR' or N,

R' and R" each independently represent a hydrogen atom, a methyl group, an ethyl group, a propyl group, an isopropyl group, a t-butyl group, a pentyl group, a hexyl group, an octyl group, a dodecyl group, a tridecyl group, a tetradecyl group, a pentadecyl group, a cyclopentyl group, a cyclohexyl group, a vinyl group, an allyl group, ethynyl group, a propargyl group, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, a pyridyl group, a pyrimidyl group, a furyl group, a pyrrolyl group, an imidazolyl group, a benzimidazolyl group, a pyrazolyl group, a pyrazinyl group, a 1,2,4-triazol-1-yl group, a 1,2,3-triazol-1-yl group, an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group, a quinoxalinyl group, a pyridazinyl group, a triazynyl group, a quinazolinyl group, a phthalazinyl group, a heterocyclic group, an alkoxy group having 1-12 carbon atoms, a cyclopentyloxy group, a cyclohexyloxy group, a phenoxy group, a naphthyloxy group, a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, a methyloxycarbonyl group, an ethyloxycarbonyl group, a butyloxycarbonyl group, an octyloxycarbonyl group, a dodecyloxycarbonyl group, a phenyloxycarbonyl group, a naphthyloxycarbonyl group, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, an acetyloxy group, an ethylcarbonyloxy group, a butylcarbonyloxy group, an octylcarbonyloxy group, a dodecylcarbonyloxy group, a phenylcarbonyloxy group, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, a methylureido group, an ethylureido group, a pentylureido group, a cyclohexylureido group, an octylureido group, a dodecylureido group, a phenylureido group, a naphthylureido group, a 2-pyridylaminoureido group, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, a methylsulfonyl group, an ethylsulfonyl group, a butylsulfonyl group, a cyclohexylsulfonyl group, a 2-ethylhexylsulfonyl group, a dodecylsulfonyl group, a phenylsulfonyl group, a naphthylsulfonyl group, a 2-pyridylsulfonyl group, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, a halogen atom, a fluoromethyl group, a trifluoromethyl group, a pentafluoroethyl group, a pentafluorophenyl group, a cyano group, a nitro group, a hydroxy group, a mercapto group, a trimethylsilyl group, a triisopropylsilyl group, a triphenylsilyl group, or a phenyldiethylsilyl group, Ar1 and Ar2 represent an aromatic ring, and may be same or different from each other, and m and n represent an integer of 0 to 4.

14. The electroluminescence element according to claim 13, wherein, in the general formula (1), X is O or NR'.

15. The electroluminescence element according to claim 14, wherein in the general formula (1), at least one of Ar1 and Ar2 is represented by a general formula (2),

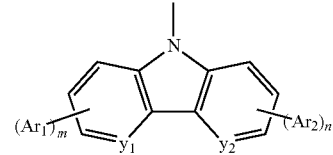

general formula(2)

wherein $y_1$ and $y_2$ each represent CR' or a nitrogen atom,

R' is the same as defined for general formula (1), $Ar_1$ and $Ar_2$ each represent an aromatic ring, and may be same or different from each other, and m and n represent an integer of 0 to 4.

16. The electroluminescence element according to claim 1, wherein the light emitting layer contains a phosphorescent light emitting dopant compound in which a light emitting maximum wavelength assigned to 0-0 transition band in a phosphorescence spectrum is in a wavelength region of 460 to 827 nm.

17. The electroluminescence element according to claim 1, wherein the light emitting layer contains a phosphorescent light emitting dopant represented by a general formula (3),

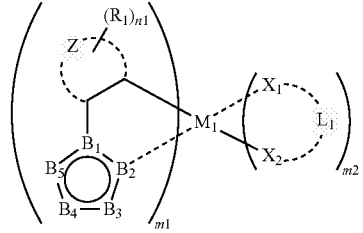

general formula(3)

wherein R1 represents a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group, a cyclohexyl group, a vinyl group, an allyl group, an ethynyl group, a propargyl group, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, a pyridyl group, a pyrimidyl group, a furyl group, a pyrrolyl group, an imidazolyl group, a benzimidazolyl group, a pyrazolyl group, a pyrazinyl group, a 1,2,4-triazol-1-yl group, a 1,2,3-triazol-1-yl group, an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group, a quinoxalinyl group, a pyridazinyl group, a triazynyl group, a quinazolinyl group, a phthalazinyl group, a pyrrolidyl group, an imidazolidyl group, a morpholyl group, an oxazolidyl group, a methoxy group, an ethoxy group, a propyloxy group, a pentyloxy group, a hexyloxy group, an octyloxy group, a dodecyloxy group, a cyclopentyloxy group, a cyclohexyloxy group, a phenoxy group, a naphthyloxy group, a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, a methyloxycarbonyl group, an ethyloxycarbonyl group, a butyloxycarbonyl group, an octyloxycarbonyl group, a dodecyloxycarbonyl group, a phenyloxycarbonyl group, a naphthyloxycarbonyl group, an amino sulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, an acetyloxy group, an ethylcarbonyloxy group, a butylcarbonyloxy group, an octylcarbonyloxy group, a dodecylcarbonyloxy group, a phenylcarbonyloxy group, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, a methylureido group, an ethylureido group, a pentylureido group, a cyclohexylureido group, an octylureido group, a dodecylureido group, a phenylureido group, a naphthylureido group, a 2-pyridylaminoureido group, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, a methylsulfonyl group, an ethylsulfonyl group, a butylsulfonyl group, a cyclohexylsulfonyl group, a 2-ethylhexylsulfonyl group, a dodecylsulfonyl group, a phenylsulfonyl group, a naphthylsulfonyl group, a 2-pyridylsulfonyl group, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, a cyano group, a nitro group, a hydroxy group, a mercapto group, a trimethylsilyl group, a triisopropylsilyl group, a triphenylsilyl group, or a phenyldiethylsilyl group, Z represents a non-metal atomic group necessary to form a 5 to 7-membered ring, n1 represents an integer of 0 to 5, B1 to B5 represent a carbon atom, a nitrogen atom, an oxygen atom or a sulfur atom, and at least one represents a nitrogen atom, M1 represents a group 8 to 10 metal in the element periodic table, X1 and X2 represent a carbon atom, a nitrogen atom or an oxygen atom, L1 represents an atomic group forming a bidentate ligand together with X1 and X2, and m1 represents an integer of 1, 2 or 3, m2 represents an integer of 0, 1 or 2, and m1+m2 represents 2 or 3.

* * * * *